United States Patent

Noda

[11] Patent Number: 5,870,042
[45] Date of Patent: Feb. 9, 1999

[54] METHOD OF AND APPARATUS FOR TESTING A-D CONVERTER WITH A SOURCE CURRENT MEASUREMENT AND REDUCED EXTERNAL TEST TERMINALS

[75] Inventor: Hiroshi Noda, Tokyo, Japan

[73] Assignee: Mitsubishi Denki Kabushiki Kaisha, Tokyo, Japan

[21] Appl. No.: 734,386

[22] Filed: Oct. 17, 1996

[30] Foreign Application Priority Data

Apr. 23, 1996  [JP]  Japan ................................ 8-101461

[51] Int. Cl.⁶ .................................................. H03M 1/10
[52] U.S. Cl. ......................... 341/120; 341/118; 341/161; 341/156; 341/158
[58] Field of Search .................................. 341/118, 120, 341/156, 158, 161

[56] References Cited

U.S. PATENT DOCUMENTS

| | | | |
|---|---|---|---|
| 4,894,656 | 1/1990 | Hwang | 341/120 |
| 5,070,332 | 12/1991 | Kaller et al. | 341/156 |
| 5,223,836 | 6/1993 | Komatsu | 341/156 |
| 5,581,255 | 12/1996 | Hsu | 341/156 |

*Primary Examiner*—Howard L. Williams
*Assistant Examiner*—Jason L. W. Kost
*Attorney, Agent, or Firm*—Oblon, Spivak, McClelland, Maier & Neustadt, P.C.

[57] ABSTRACT

When an upper reference voltage is erroneously reduced below a normal value in a subranging A-D converter, a resistance block of a ladder resistance having a voltage lower than a proper one is selected and a lower reference voltage is necessarily reduced below an analog input voltage, so that all outputs of lower bits go high. Namely, a region (B1) where a current flowing to a comparator becomes constant without depending on the value of an analog input voltage (Vin) appears. Presence of abnormality can be determined by detecting this. Thus, a functional test or a static linearity test of an A-D converter cell is made while remarkably reducing the number of external test terminals.

20 Claims, 43 Drawing Sheets

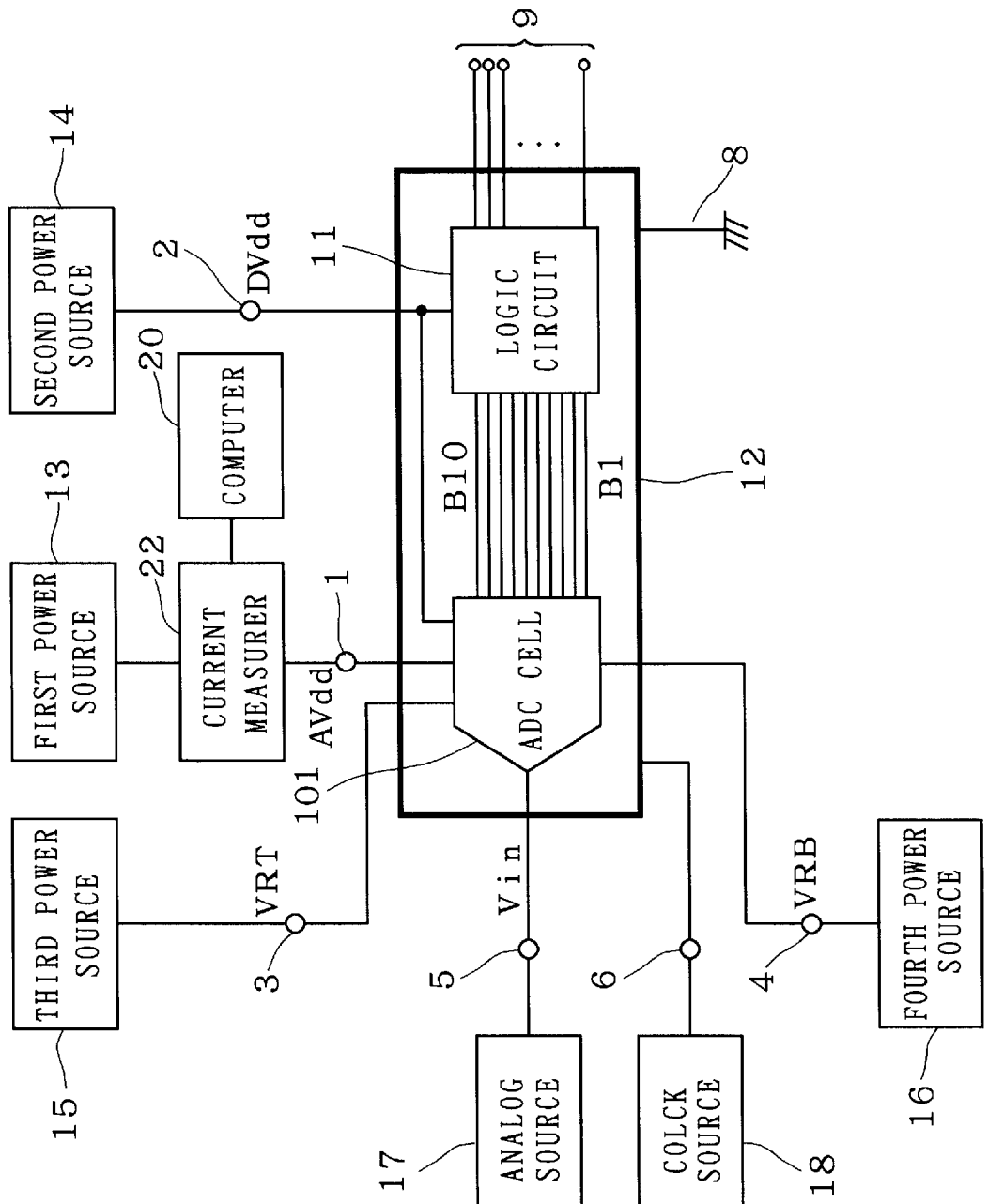
F I G. 1

F I G. 5
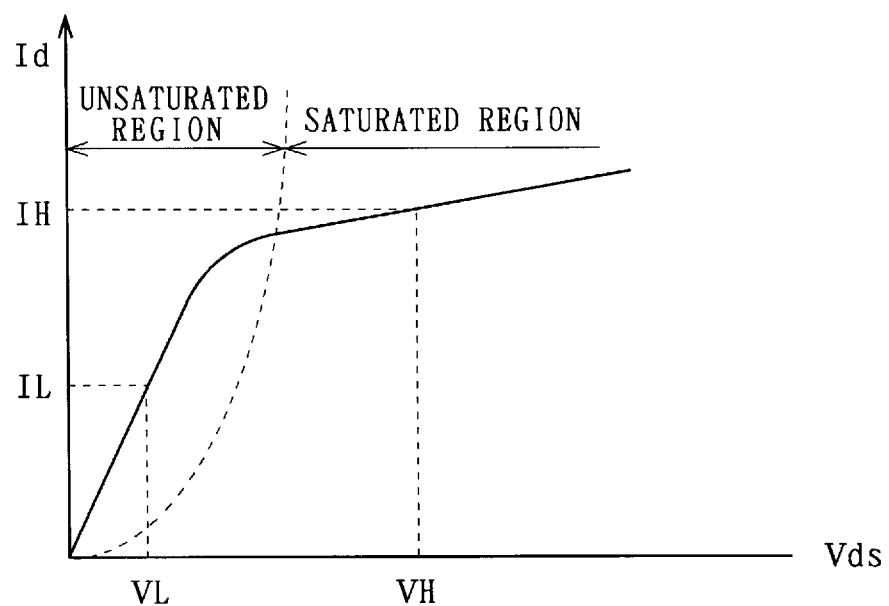

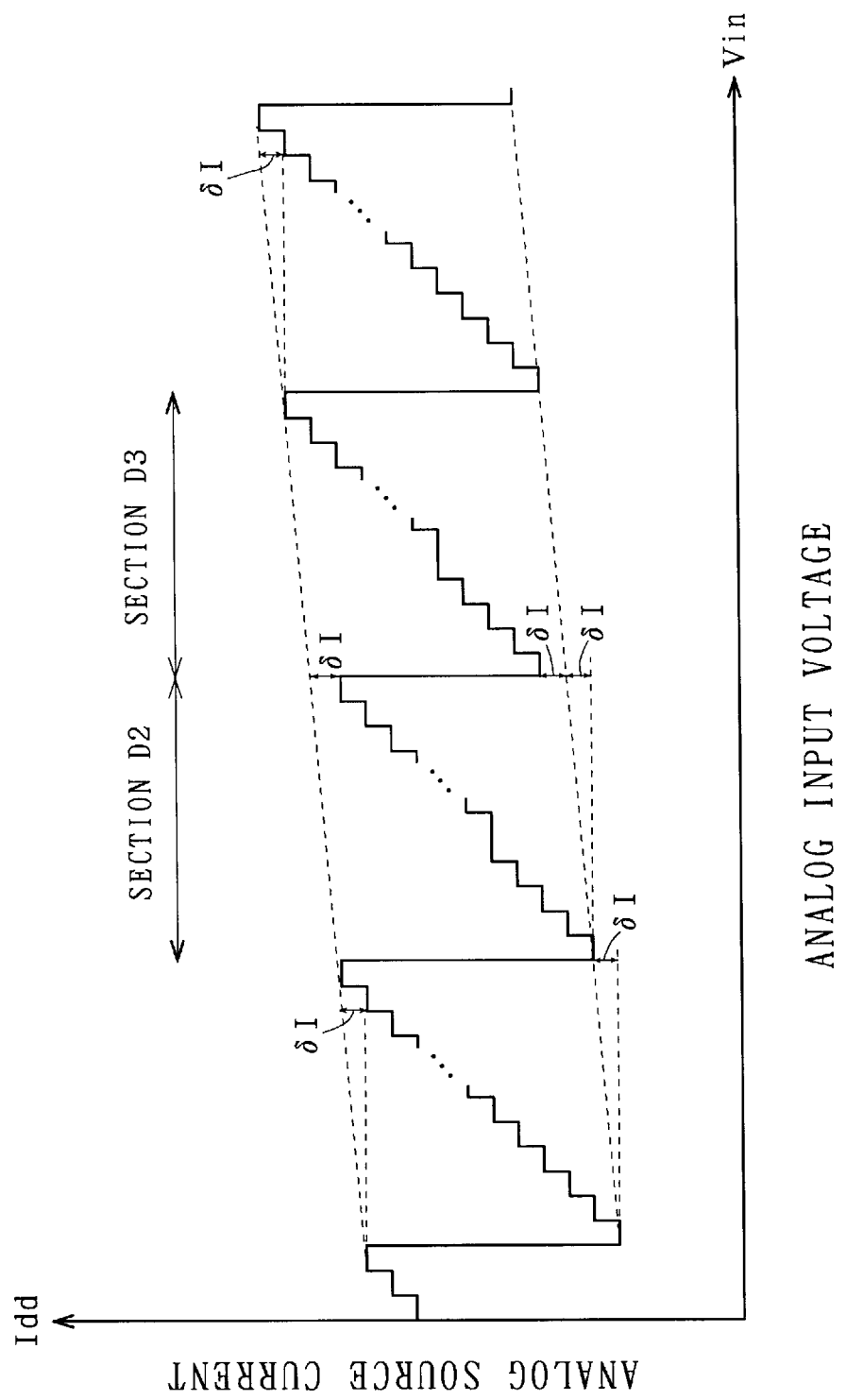
F I G. 1 3

FIG. 27

| No. | coarse bit code | fine bit code | code | analog input voltage Vin | analog source current Idd |
|---|---|---|---|---|---|
| 1 | 0 | 0 | 0×m+0=0 | Vsi+0V$_{LSB}$ | Id1 = Isi |
| 2 | 1 | 1 | 1×m+1=33 | Vsi+330V$_{LSB}$ | Id2 |
| 3 | 2 | 2 | 2×m+2=66 | Vsi+660V$_{LSB}$ | Id3 |
| 4 | 3 | 3 | 3×m+3=99 | Vsi+990V$_{LSB}$ | Id4 |
| i−1 | i | j | i×m+j | Vsi+(i×m+j)V$_{LSB}$ | Id(i−1) |
| 32(=m) | 31(=m−1) | 31(=k) | 31×m+31=1023 | Vsi+1023V$_{LSB}$ | Id32 = Iei | i = 0, 1, 2, 3, ⋯(m−1)
j = 0, 1, 2, 3, ⋯k

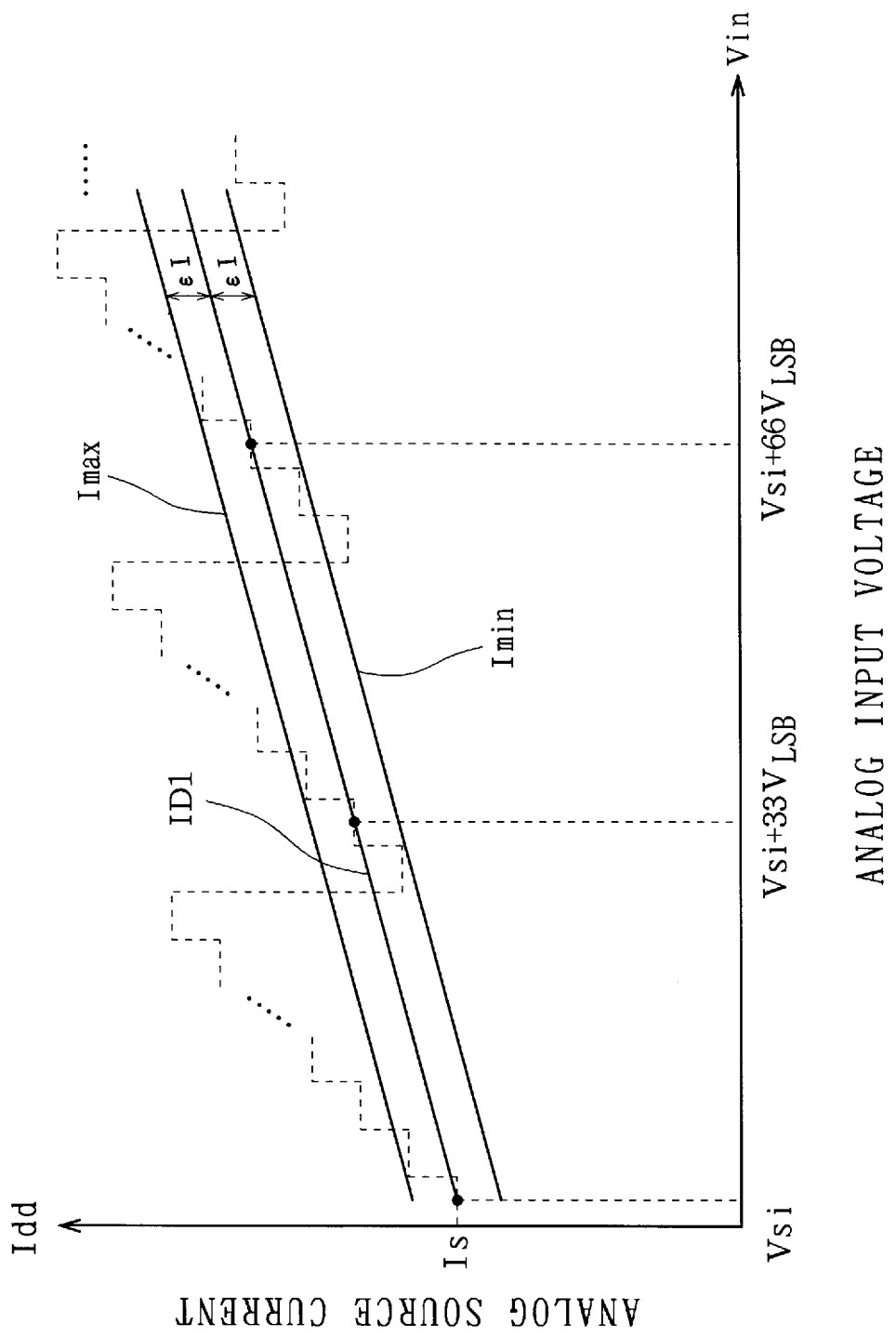
F I G. 3 1

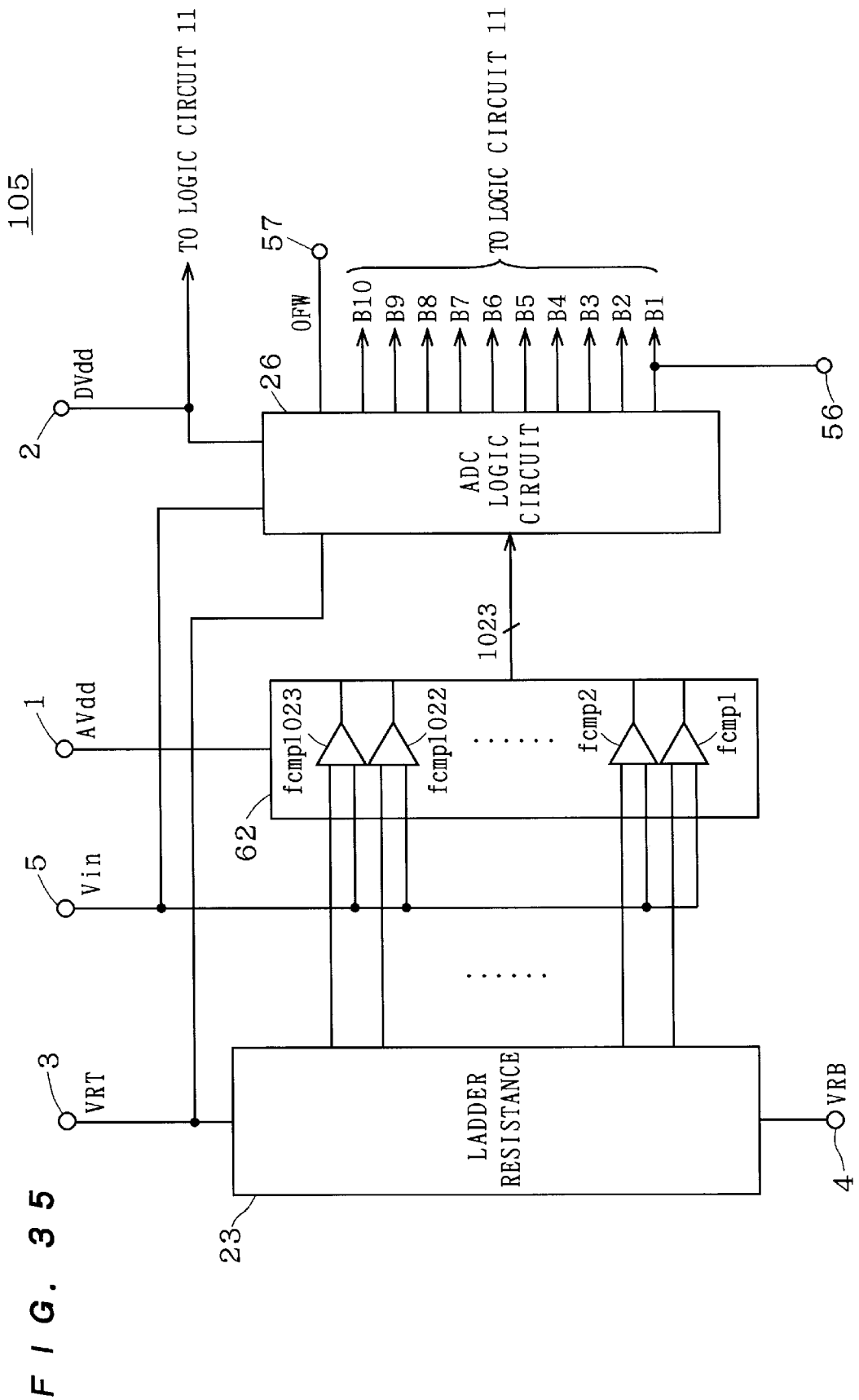
F I G. 35

FIG. 39

| BINARY CODE | | | | | | | | | | DECIMALIZED CODE (DECIMAL CODE) |
|---|---|---|---|---|---|---|---|---|---|---|
| MSB 7j | 7i | 7h | 7g | 7f | 7e | 7d | 7c | 7b | LSB 7a | |
| 0 | 0 | 0 | 0 | 0 | 0 | 0 | 0 | 0 | 0 | 0 |
| 0 | 0 | 0 | 0 | 0 | 0 | 0 | 0 | 0 | 1 | 1 |
| 0 | 0 | 0 | 0 | 0 | 0 | 0 | 0 | 1 | 0 | 2 |
| 0 | 0 | 0 | 0 | 0 | 0 | 0 | 0 | 1 | 1 | 3 |
| 0 | 0 | 0 | 0 | 0 | 0 | 0 | 1 | 0 | 0 | 4 |
| 0 | 0 | 0 | 0 | 0 | 0 | 0 | 1 | 0 | 1 | 5 |
| 0 | 0 | 0 | 0 | 0 | 0 | 0 | 1 | 1 | 0 | 6 |
| ... | ... | ... | ... | ... | ... | ... | ... | ... | ... | ... |
| 1 | 1 | 1 | 1 | 1 | 1 | 1 | 1 | 1 | 0 | 1022 |
| 1 | 1 | 1 | 1 | 1 | 1 | 1 | 1 | 1 | 1 | 1023 |

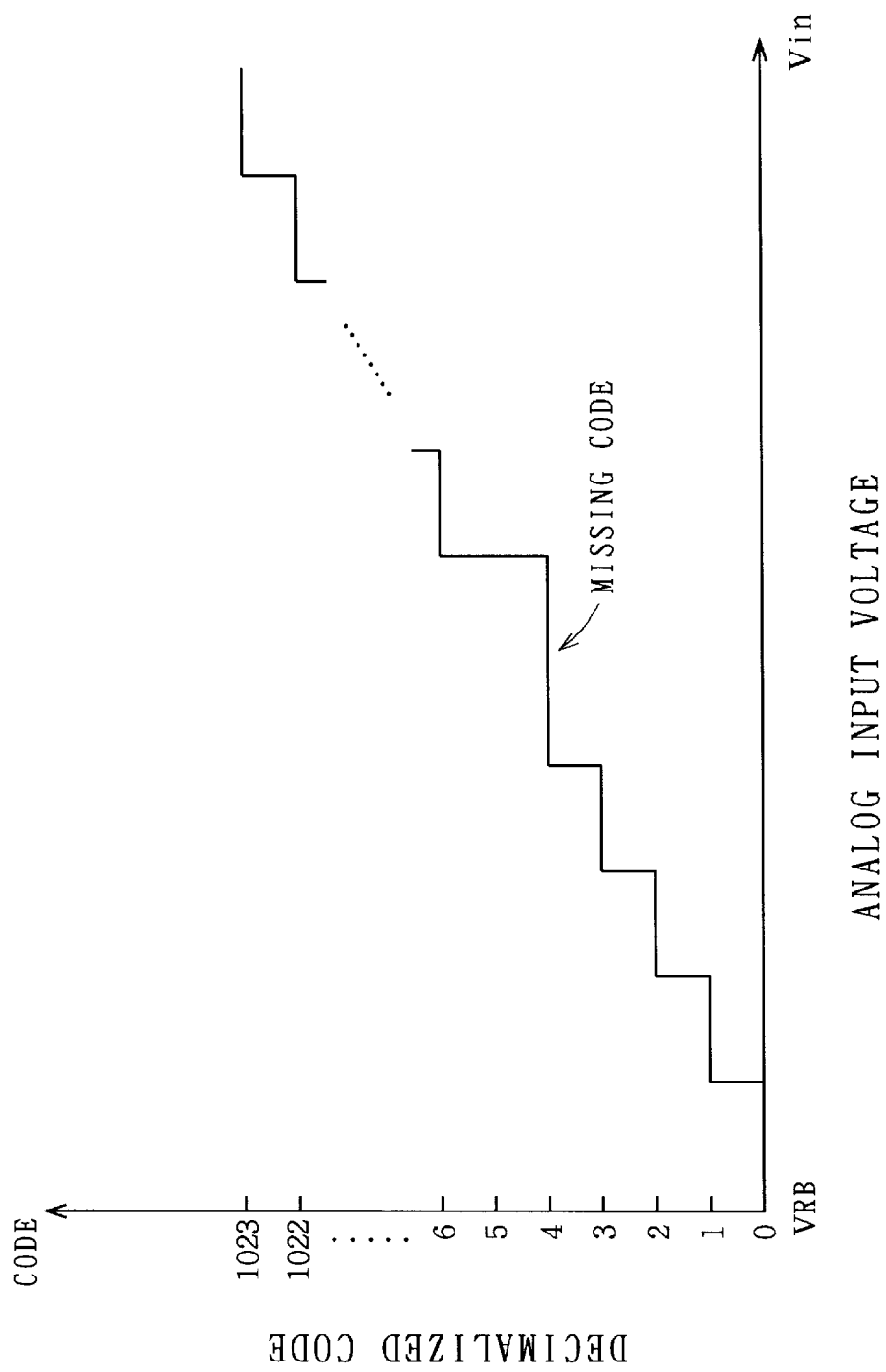
F I G. 41

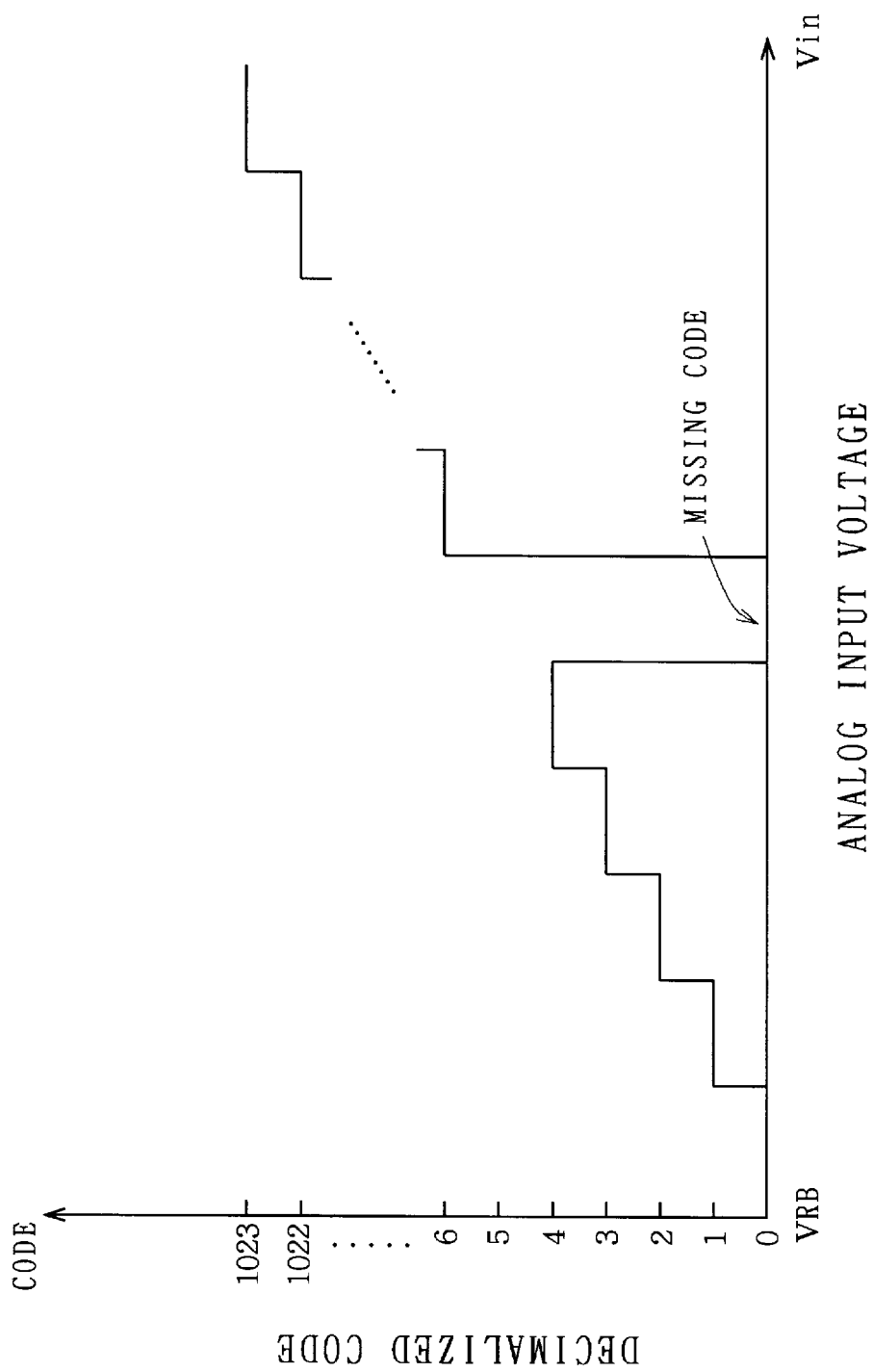
F I G. 4 3

METHOD OF AND APPARATUS FOR TESTING A-D CONVERTER WITH A SOURCE CURRENT MEASUREMENT AND REDUCED EXTERNAL TEST TERMINALS

BACKGROUND OF THE INVENTION

1. Field of the Invention

The present invention relates to a method of testing an A-D converter having a comparator.

2. Description of the Background Art

FIG. 37 is a block diagram for illustrating a conventional technique of making a functional test of an A-D converter cell which is stored in an analog-digital combinational LSI, and FIG. 38 is a flow chart showing the method of the functional test.

Referring to FIG. 37, the analog-digital combinational LSI 12 stores an A-D converter cell 10 and a logic circuit 11. An analog circuit of the A-D converter cell 10 is supplied with a potential AVdd from a first power source 13 through an analog source terminal 1. On the other hand, a digital circuit of the A-D converter cell 10 and the logic circuit 11 are supplied with a potential DVdd from a second power source 14 through a digital source terminal 2.

In a ladder resistance in the A-D converter cell 10, points to be supplied with the highest and lowest potentials are supplied with potentials VRT and VRB from third and fourth power sources 15 and 16 through upper and lower reference source terminals 3 and 4 respectively.

The A-D converter cell 10 is supplied with an analog input voltage Vin from an analog source 17 through an analog voltage input terminal 5. Digital outputs obtained from the A-D converter cell 10 are supplied to the logic circuit 11, as well as to a data analyzer 19 through external test terminals 7 for executing a functional test. A computer 20 reads the digital output signals which are incorporated in a memory of the data analyzer 19, and performs arithmetic processing through an N-bit binary code signal line 21. For convenience of illustration, it is assumed here that the A-D converter cell 10 outputs 10-bit signals, and hence N=10. Therefore, the external test terminals 7 includes 10 terminals $7a$, $7b$, $7c$, $7d$, $7e$, $7f$, $7g$, $7h$, $7i$ and $7j$.

The logic circuit 11 performs prescribed processing on the digital outputs obtained from the A-D converter cell 10 and supplies the same to a digital input/output terminal 9.

Further, the A-D converter cell 10 is connected to the ground 8, and supplied with a sampling clock for the A-D converter cell 10 and a clock to be supplied to the logic circuit 11 from a clock source 18 through a clock terminal 6.

As shown in FIG. 38, the first to fourth power sources 13 to 16 are turned on so that the potentials AVdd, DVdd, VRT and VRB are applied to the analog source terminal 1, the digital source terminal 2, the upper reference source terminal 3 and the lower reference source terminal 4 respectively at a step SP1.

At a step SP2, the sampling clock etc. from the clock source 18 are applied to the clock input terminal 6. On the other hand, the resolution of the analog input voltage Vin outputted from the analog source 17 is set at another step SP3.

At a step SP4, the analog input voltage Vin is stepwise supplied to the analog input voltage terminal 5 while being gradually increased by the resolution set at the step SP3.

At a step SP5, the digital outputs (binary data) of the A-D converter cell 10 obtained from the external test terminals 7 are stored in the memory of the data analyzer 19.

At a step SP6, the binary data are converted to decimal numbers from the memory of the data analyzer 19 by the computer 20. Nondefectiveness/defectiveness is determined at a step SP7 from the converted results.

FIG. 39 illustrates correspondence between binary codes and decimalized codes converted therefrom. It is assumed here that bits supplied to the external test terminals $7a$ and $7j$ are the least and most significant bits LSB and MSB respectively. The values of the decimalized codes are obtained by $7a \times 2^0 + 7b \times 2^1 + 7c \times 2^2 + 7d \times 2^3 + 7e \times 2^4 + 7f \times 2^5 + 7g \times 2^6 + 7h \times 2^7 + 7i \times 2^8 + 7j \times 2^9$.

FIG. 40 is a graph showing the relation between the analog input voltage Vin and the decimalized codes in case of a correct A-D converter cell 10. The width of the analog input voltage Vin corresponding to the decimalized codes is constant regardless of the values of the decimalized codes (excluding the decimalized codes of "0" and "1023"), and the decimalized codes are stepwise increased as the analog input voltage Vin is increased. In this case, a determination on nondefectiveness is made at the step SP7.

FIGS. 41 to 43 are graphs showing the relations between analog input voltages Vin and decimalized codes in a case illustrating missing codes. In each of these figures, a decimalized code "5" is missing and not all codes of "0" to "1023" are present. In such case, a determination on defectiveness is made at the step SP7.

As described above, the prior art is adapted to determine whether or not all prescribed values of decimalized codes are present, and hence it is necessary to obtain binary codes from the external test terminal 7. Due to the necessity of providing the external test terminal 7, the chip area of the semiconductor device is increased to increase the package size. Thus, the cost for the semiconductor device is disadvantageously increased.

SUMMARY OF THE INVENTION

According to a first aspect of the present invention, a method of testing an A-D converter, which is a subranging A-D converter setting a plurality of upper reference voltages and a plurality of lower reference voltage groups each consisting of a plurality of lower reference voltages, having a first comparator array including a plurality of comparators, deciding an upper bit of a digital output on the basis of comparison between the plurality of upper reference voltages and an analog input in the plurality of comparators, selecting one of the plurality of lower reference voltage groups on the basis of the upper bit while deciding a lower bit by comparing the plurality of lower reference voltages belonging to one of the plurality of lower reference voltage groups with the analog input, and conducting an A-D conversion of the analog input to a digital output consisting of the upper and lower bits with certain resolution comprises steps of (a) supplying an analog signal changed at an amount of change which is smaller than the resolution, (b) a step of measuring the relation between the analog signal and a current flowing at least to the first comparator array at the time of comparing the analog input with the plurality of lower reference voltages for obtaining a current waveform, (c) obtaining the number of points taking extreme values in the current waveform, and (d) determining nondefectiveness/defectiveness of the A-D converter on the basis of whether or not the number is a prescribed number.

According to a second aspect of the present invention, the method of testing an A-D converter further comprises steps of (e) obtaining maximal values excluding that corresponding to the minimum analog signal among the extreme values and minimal values which are adjacently paired with the maximal values, (f) obtaining a first current difference which is a difference between the maximal and minimal values every pair and obtaining the maximum first current difference by comparing the first current differences with each other between the pairs, (g) dividing the maximum first current difference by a value which is smaller than the lower bit-power of 2 by 1 for obtaining a second current difference, and (h) determining nondefectiveness/defectiveness of the A-D converter on a basis of whether or not the absolute values of the differences between all maximal values and all minimal values are within a range of the second current difference.

According to a third aspect of the present invention, the subranging A-D converter further has a second comparator array including a plurality of comparators, and a relation between the analog signal and the sum of currents flowing to the first and second comparator arrays at a time of comparing the analog input with the plurality of lower reference voltages is measured in the step (b) for obtaining the current waveform.

According to a fourth aspect of the present invention, the method of testing an A-D converter further comprises steps of (e) obtaining maximal values excluding that corresponding to the minimum analog signal among the extreme values and minimal values which are adjacently paired with the maximal values, (f) obtaining a first current difference which is a difference between the maximal and minimal values every pair and obtaining the maximum first current difference by comparing the first current differences with each other between the pairs, (g) dividing the maximum first current difference by a value which is smaller than the lower bit-power of 2 by 1 for obtaining a second current difference, and (h) determining nondefectiveness/defectiveness of the A-D converter on basis of whether or not first and second conditions are satisfied, wherein the first condition is that an absolute value of a value obtained by adding the second current difference to a value obtained by subtracting a value of the first maximal value corresponding to first value of the analog signal from a value of the second maximal value which is adjacent to the first maximal value corresponding to second value of the analog signal is within a range of the second current difference, wherein the second value is larger than the first value, and the second condition is that an absolute value of a value obtained by adding the second current difference to a value obtained by subtracting a value of the first minimal value corresponding to third value of the analog signal from a value of the second minimal value which is adjacent to the first minimal value corresponding to fourth value of the analog signal is within the range of the second current difference, wherein the fourth value is larger than the third value.

According to a fifth aspect of the present invention, method of testing an A-D converter, which is a subranging A-D converter setting a plurality of upper reference voltages and a plurality of reference voltage groups each consisting of a plurality of lower reference voltages, having a first comparator array including a plurality of comparators, deciding an upper bit consisting of W bits (W: natural number) on a basis of comparison between the plurality of upper reference voltages and an analog input in the plurality of comparators, selecting one of the plurality of lower reference voltage groups on a basis of the upper bit while deciding a lower bit consisting of W bits by comparing the plurality of lower reference voltages belonging to one of the plurality of lower reference voltage groups with the analog input, and A-D converting the analog input to a 2W-bit digital output consisting of the upper and lower bits, comprises steps of (a) obtaining linear ideal A-D conversion characteristics obtained in case of assuming that the A-D converter includes no quantization error and first resolution which is a voltage of the analog input corresponding to the minimum unit of change of the digital output, (b) separating a first initial value corresponding to the minimum value of the voltage of the analog input defining the ideal A-D conversion characteristics and a first final voltage corresponding to the maximum value thereof every second resolution which is $(2^W+1)$ times the first resolution for supplying $2^W$ analog signals including the first initial voltage and the final voltage as the analog input, (c) measuring the analog input and $2^W$ source currents flowing at least to the first comparator array at a time of comparing the analog input with the plurality of lower reference voltages, and (d) obtaining a current waveform corresponding to the ideal A-D conversion characteristics from the first initial value and the source current corresponding thereto and the first final voltage and the source current corresponding thereto for determining nondefectiveness/defectiveness of the A-D converter on a basis of whether or not all source currents are within a prescribed range with respect to the current waveform.

According to a sixth aspect of the present invention, the step (a) includes steps of (a-1) obtaining a second initial voltage which is a value of the analog input corresponding to a boundary as to whether a value of the digital output is minimum value or a value larger than the same by one unit, (a-2) obtaining a second final voltage which is the value of the analog input corresponding to a boundary as to whether the digital output is in a full scale or results in an overflow, (a-3) dividing a value obtained by subtracting the second initial voltage from the second final voltage by $(2^{2W}-1)$ for obtaining the first resolution, and (a-4) obtaining the first initial voltage by subtracting the first resolution from the second initial voltage and obtaining the first final voltage by subtracting the first resolution from the second final voltage.

According to a seventh aspect of the present invention, the subranging A-D converter further includes a second comparator array including a plurality of comparators, and the step (c) is adapted to measure a relation between the analog output and sum of currents flowing to the first and second comparator arrays at a time of comparing the analog input with the plurality of lower reference voltages thereby obtaining the source current.

According to an eighth aspect of the present invention, a method of testing an A-D converter comprising a comparator array including a plurality of comparators for comparing a plurality of reference voltages with an analog input and outputting a digital output consisting of 2W bits (W: natural number) on a basis of the comparison in the plurality of comparators thereby conducting A-D conversion of the analog input to the digital output, comprises steps of (a) measuring a relation between the analog input and a source current actually flowing to the comparator array at a time of comparing the analog input with the reference voltages, for obtaining an actual current waveform, (b) obtaining an initial voltage which is a value of the analog input corresponding to a boundary as to whether a value of the digital output is the minimum value or a value larger than the same by 1, (c) obtaining a final voltage which is the value of the analog input corresponding to a boundary as to whether the digital output is in a full scale or results in an overflow, (d) dividing a value obtained by subtracting the initial voltage from the final voltage by $(2^{2w}-1)$ for obtaining resolution, (e) obtaining first value as a current increment by dividing a changeable value of the source current by a changeable value of the analog input in a basic region and multiplying the first value by the resolution when the A-D converter ideally performs the A-D conversion, wherein the basic region is in a range of the initial voltage to the final voltage, and the source current is monotonously increased following increase of the value of the analog input in the basic region, (f) obtaining an ideal current waveform indicating the source current which is increased by the increment every time the value of the analog input is increased by the resolution when the A-D converter ideally performs the A-D conversion in the basic region, and (g) comparing the actual current waveform with the ideal current waveform for determining nondefectiveness/defectiveness of the A-D converter on the basis of whether or not the difference therebetween is within a prescribed range.

According to a ninth aspect of the present invention, the plurality of reference voltages have a plurality of upper reference voltages and a plurality of lower reference voltage groups each consisting of a plurality of lower reference voltages, an upper bit consisting of W bits is decided on a basis of comparison between the plurality of upper reference voltages and the analog input in the plurality of comparators, one of the plurality of lower reference voltage groups is selected on a basis of the upper bit, and the plurality of lower reference voltages belonging to one of the plurality of lower reference voltage groups are compared with the analog input for deciding a lower bit consisting of W bits, the A-D converter is a subranging A-D converter for A-D converting the analog input to a 2W-bit digital output consisting of the upper and lower bits, and the source current is a current flowing to the comparator array at a time of comparing the analog input with the plurality of lower reference voltages.

According to a tenth aspect of the present invention, the subranging A-D converter further includes a second comparator array including a plurality of comparators, and the source current is a sum of currents flowing to the comparator array and the second comparator array at a time of comparing the analog input with the plurality of lower reference voltages.

According to an eleventh aspect of the present invention, an apparatus for testing an A-D converter comprises (a) a subranging A-D converter having a comparator array consisting of a plurality of comparators for comparing an analog input with a plurality of upper reference voltages and further with a plurality of lower reference voltages for A-D converting the analog input to a digital output with certain resolution, (b) an analog signal source for supplying an analog signal stepwise changed by an amount of change which is smaller than the resolution, (c) a power source for supplying the comparator array with a voltage, (d) a current measurer for measuring a current flowing from the power source at the time of comparing the analog input with the plurality of lower reference voltages, and (e) analyzing means for analyzing a relation between the analog signal and the current.

According to a twelfth aspect of the present invention, an apparatus for testing an A-D converter comprises (a) an A-D converter having a comparator array consisting of a plurality of comparators for comparing an analog input with a plurality of reference voltages for A-D converting the analog input to a digital output, (b) a power source for supplying the comparator array with a voltage, (c) a current measurer for measuring a current flowing from the power source at a time of comparing the analog input with the plurality of lower reference voltages, (d) detection means detecting whether or not the A-D converter is in an overflow state and whether or not the digital output is at minimum value, and (e) analyzing means for obtaining an ideal waveform of the source current on a basis of the result in the detection means and analyzing the relation between the same and the source current.

In the method of testing an A-D converter according to the first aspect of the present invention, the value of the current flowing to the comparator at the time of comparing the analog input with the lower reference voltages is increased when the analog signal is increased with correspondence to the same upper bit while the value of the current is reduced or stagnant when the analog signal is increased and the upper bit corresponding to the analog signal is changed, if the A-D converter is normal. Thus, the value of the current is changed in the form of a sawtooth wave with respect to change of the analog signal, and the number of such sawtooth waveform change is decided by the number of the comparators. Therefore, nondefectiveness/defectiveness of the A-D converter can be determined by examining the number of extreme values, and no structure of separately drawing out the digital output is required at this time.

In the method of testing an A-D converter according to the second aspect of the present invention, the first current difference indicates in what range the current flowing to the first comparator array is changed when the analog input compared with the same lower reference voltage group is changed. Thus, it comes to that the maximum value of the first current difference indicates the first current difference in case where normal comparison is made as to a certain upper bit. Further, it comes to that the second current difference indicates the range of fluctuation allowed for a source current when normal comparison is made. When difference which is larger than the second current difference is caused between maximal values, therefore, it indicates that comparison is not normally made. A similar determination is made also as to difference between minimal values.

In the method of testing an A-D converter according to the third aspect of the present invention, an A-D converter operating in an interleaved scheme can be tested.

In the method of testing an A-D converter according to the fourth aspect of the present invention, the second comparator array performs comparison related to the lower bit when the first comparator array performs comparison related to the upper bit in an A-D converter operating in an interleaved scheme. Even if all comparators of the second comparator array output "L" in the comparison related to the lower bit, therefore, the number of comparators outputting "H" in the first comparator array is increased by 1 due to updating of the upper bit. Thus, the current waveform is increased by the second current difference, whereby nondefectiveness/defectiveness of the comparing operations related to the upper and lower bits can be determined by the first and second conditions.

In the method of testing an A-D converter according to the fifth aspect of the present invention, the second resolution is set at $(2^W+1)$ times the minimum unit of the change of the digital output, whereby all of values which can be taken by the upper and lower bits of the A-D converter cell can be efficiently checked. Thus, a functional test can be executed at a high speed.

In the method of testing an A-D converter according to the sixth aspect of the present invention, it is possible to obtain linear ideal A-D conversion characteristics from a point where the value of the digital output is minimized to a point where the digital output enters a full scale state.

In the method of testing an A-D converter according to the seventh aspect of the present invention, an A-D converter operating in an interleaved scheme can be tested.

In the method of testing an A-D converter according to the eighth aspect of the present invention, the ideal current waveform, which is obtained from the initial and final voltages, can be obtained by monitoring only two of the LSB of the digital output and an overflow. Thus, a static linearity test can be made while saving a separately required structure.

In the method of testing an A-D converter according to the ninth aspect of the present invention, static linearity can be tested also as to a subranging A-D converter.

In the method of testing an A-D converter according to the tenth aspect of the present invention, static linearity can be tested also as to an A-D converter operating in an interleaved scheme.

In the apparatus for testing an A-D converter according to the eleventh aspect of the present invention, the value of the current flowing from the power source to the comparator array at the time of comparing the analog input with the lower reference voltages is regularly changed with respect to change of the analog signal if the A-D converter is normal. The analyzing means detects whether or not the regularity is present, thereby determining nondefectiveness/defectiveness of the A-D converter. The digital output may not be analyzed, whereby merely the current measurer may be provided between the power source and the comparators with no requirement for a number of external terminals corresponding to the bit number of the digital output.

In the apparatus for testing an A-D converter according to the twelfth aspect of the present invention, the value of the current flowing from the power source to the comparator array at the time of comparing the analog input with the reference voltage is regularly changed with respect to change of the analog signal if the A-D converter is normal. The analyzing means detects whether or not the regularity is present by comparison with an ideal waveform. Targets required in the detection means for obtaining the ideal waveform are two, and the digital output may not be analyzed. Therefore, it is sufficient to provide the current measurer between the power source and the comparators, with not requirement for a number corresponding to the bit number of the digital output but requirement for two external terminals.

Accordingly, an object of the present invention is to provide a method enabling a functional test or a static linearity test of an A-D converter cell by remarkably reducing the number of external test terminals and measuring a source current of an analog part of the A-D converter cell.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a block diagram for illustrating an embodiment 1;

FIG. 5 is a graph showing the characteristics of an n-channel transistor Q5;

FIG. 13 is a graph showing a state of increase of the analog source current Idd;

FIG. 27 is a correspondence diagram showing the relation between analog input voltages Vin and upper and lower bits;

FIG. 31 is a graph illustrating determination of nondefectiveness/defectiveness of operations;

FIG. 35 is a block diagram showing the structure of an A-D converter cell 105 according to an embodiment 7 of the present invention;

FIG. 39 is a correspondence diagram of binary codes and decimalized codes;

FIGS. 41 to 43 are graphs showing an analog input voltage Vin including a missing code and decimalized codes;

DESCRIPTION OF THE PREFERRED EMBODIMENTS

Embodiment 1

Figure 2:
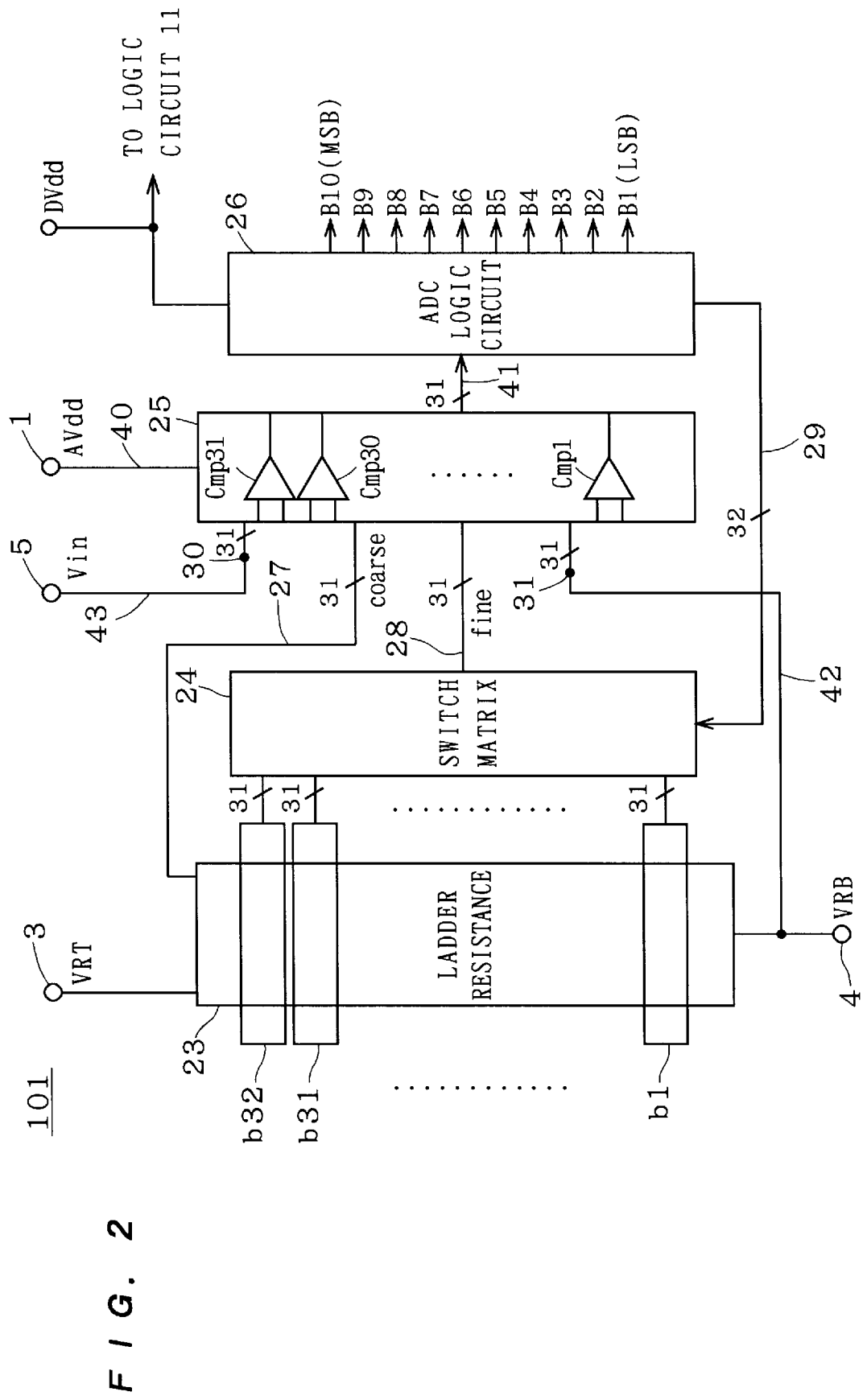
FIG. 2 is a block diagram showing the structure of an A-D converter cell 101 according to the embodiment 1.

FIG. 1 is a block diagram illustrating the technique of an embodiment 1 of the present invention for making a functional test of an A-D converter cell 101 which is stored in an analog-digital combinational LSI 12. While the A-D converter cell 101, which is of a serial-parallel (subranging) type, is a 10-bit converter in this embodiment, the present invention is also applicable to other bit numbers, as a matter of course.

The analog-digital combinational LSI 12 stores the A-D converter cell 101 and a logic circuit 11. An analog circuit of the A-D converter cell 101 is supplied with a potential AVdd from a first power source 13 through an analog source terminal 1. On the other hand, a digital circuit of the A-D converter cell 101 and the logic circuit 11 are supplied with a potential DVdd from a second power source 14 through a digital source terminal 2.

A current measurer 22 is provided between the analog source terminal 1 and the first power source 13, for measuring a current (hereinafter referred to as "analog source current") flowing across the same. Data of the current measurer 22 is supplied to a computer 20, and analyzed as described later.

The A-D converter cell 101 has a ladder resistance as described later, and points supplied with the highest and lowest potentials are supplied with potentials VRT and VRB from third and fourth power sources 15 and 16 through upper and lower reference source terminals 3 and 4 respectively. The potentials VRT and VRB are set at 1 V and 0 V respectively, for example.

The A-D converter cell 101 is supplied with an analog input voltage Vin from an analog source 17 through an analog voltage input terminal 5. The logic circuit 11 performs prescribed processing on digital outputs obtained from the A-D converter cell 101 and supplies the same to a digital output terminal 9.

The A-D converter cell 101 is connected to the ground 8. The term "potential" hereafter employed is based on the ground 8, and hence the same may be also expressed as "voltage".

Further, a clock source 18 supplies a sampling clock for the A-D converter cell 101 and a clock to be supplied to the logic circuit 11.

FIG. 2 is a block diagram showing the structure of the A-D converter cell 101 according to this embodiment. This 10-bit subranging A-D converter cell 101 comprises a ladder resistance 23 consisting of 1024 resistances, a switch matrix 24, a comparator array 25 which is formed by a set of 31 comparators Cmp1 to Cmp31, and an A-D converter logic circuit 26 for operating digital data from the comparator array 25 and controlling the switch matrix 24.

The potential difference across the potentials VRT and VRB is divided by the ladder resistance 23 so that 1024 reference voltages are obtained, while the 1024 reference voltages are divided into 32 blocks since the ladder resistance 23 is formed by 32 resistance blocks b1 to b32.

This A-D converter cell 101 performs A-D conversion on data of upper (coarse) five bits and lower (fine) five bits, separately. Thirty-one upper reference voltage lines 27 corresponding to the upper five bits are connected to boundaries between the adjacent resistance blocks bi and b(i+1) (i=1 to 31). These upper reference voltage lines 27 are supplied with 31 coarse reference voltages Vrc. 31 lower reference voltage lines 28 corresponding to the lower five bits are supplied with 31 fine reference voltages Vrf outputted by one of the ladder resistance blocks b1 to b32 which is selected by the switch matrix 24. The fine reference voltages Vrf are successively supplied to the 31 comparators Cmp1 to Cmp31 of the comparator array 25 in order from the lowest one toward the highest one.

The potential VRB is supplied to a low reference source wire 42 through the lower reference source terminal 4, and supplied to the 31 comparators Cmp1 to Cmp31 of the comparator array 25 through a first distribution terminal 31.

The analog input voltage Vin is transmitted to an analog input voltage line 43, and supplied to the 31 comparators Cmp1 to Cmp31 of the comparator array 25 through an analog distribution terminal 19.

The comparator array 25 is supplied with the potential AVdd through an analog source line 40 for its operation. 31 outputs of the comparator array 25 are transmitted to the logic circuit 26 through comparator array output lines 41.

The logic circuit 26 outputs feedback signals for controlling the switch matrix 24 through 32 feedback lines 29. Further, the logic circuit 26 outputs output codes B1 to B10, which successively indicate LSB to MSB respectively.

Figure 3:
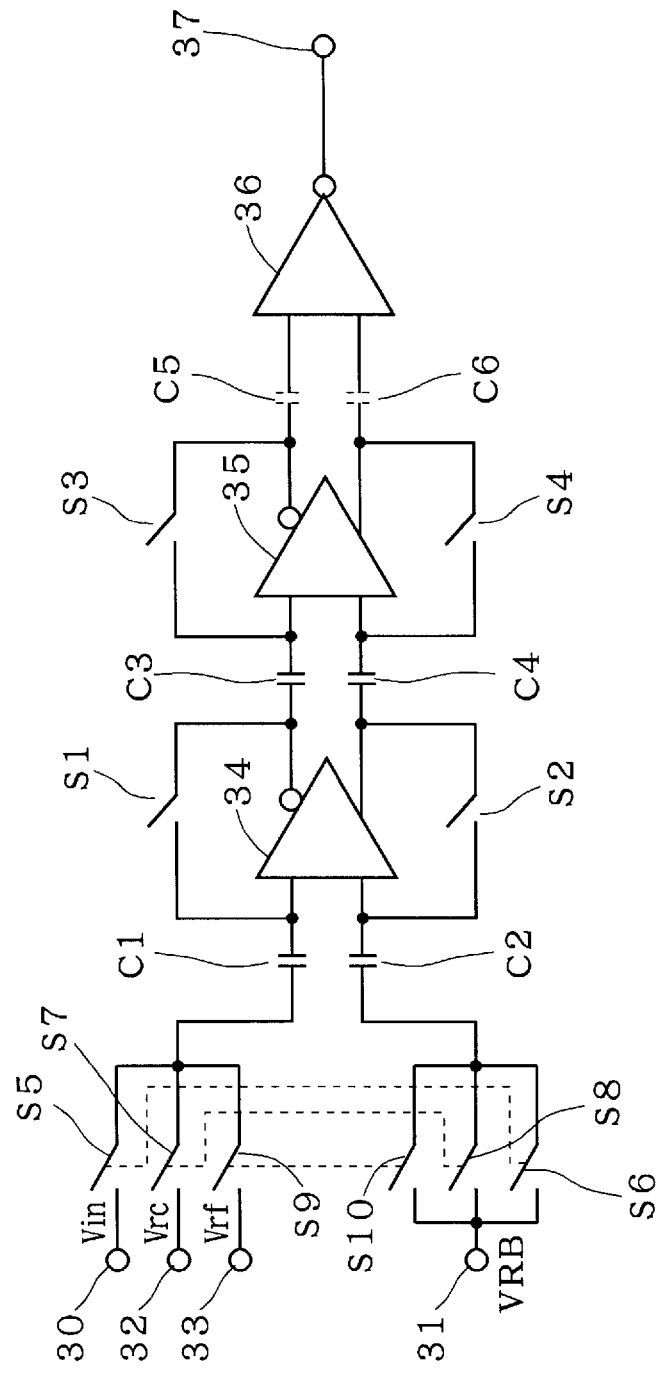
FIG. 3 is a block diagram illustrating the structure of a comparator Cmpi.

FIG. 3 is a block diagram illustrating the structure of one of the comparators Cmpi (i=1 to 31) forming the comparator array 24. This comparator is formed by three differential amplifiers 34 to 36, four capacitors C1 to C4 and ten switches S1 to S10. Two additional capacitors C5 and C6 may be further provided, as shown by dotted lines.

Input terminals 30, 31, 32 and 33 are supplied with the analog input voltage Vin, the potential VRB, the coarse reference voltage Vrc, and the fine reference voltage Vrf respectively. The switches S1 to S4, S5 and S6, S7 and S8, and S9 and S10 perform switching operations in association with each other.

The input terminals 30, 32 and 33 are connected to an end of the capacitor C1 through the switches S5, S7 and S9 respectively. An input end of the differential amplifier 34 is connected to the other end of the capacitor C1. The input terminal 31 is connected to an end of the capacitor C2 through the three switches S6, S8 and S10 which are connected in parallel with each other. The other input end of the differential amplifier 34 is connected to the other end of the capacitor C2.

The pair of input ends of the differential amplifier 34 are connected to a pair of output ends of its own through the switches S1 and S2 respectively. The pair of output ends of the differential amplifiers 34 are connected with a pair of input ends of the differential amplifier 35 through the capacitors C3 and C4 respectively. The pair of input ends of the differential amplifier 35 are connected to a pair of output ends of its own through the switches S3 and S4 respectively. The pair of output ends of the differential amplifier 35 are connected to a pair of input ends of the differential amplifier 36 directly or through the capacitors C5 and C6 respectively. The differential amplifier 36 is in a single-ended style with a single output end, which is connected to a comparator output terminal 37.

Operations of the A-D converter cell 101 are now briefly described. First, the comparator array 25 compares the 31 coarse reference voltages Vrc with the analog input voltage Vin which is the target of A-D conversion. The logic circuit 26 of the A-D converter cell 101 outputs the upper (coarse) 5-bit codes B6 to B10, for selecting one of the ladder resistance blocks to be compared with the fine reference voltages Vrf.

Then, the switch matrix 24 is controlled by the feedback signals, and the fine reference voltages Vrf in the selected ladder resistance block are transmitted to the comparator array 25. The comparator array 25 compares the 31 fine reference voltages Vrf with the sampled analog input voltage Vin. The logic circuit 26 outputs the lower (fine) 5-bit codes B1 to B5 along with the upper (coarse) 5-bit codes B6 to B10 held therein.

Figure 4:
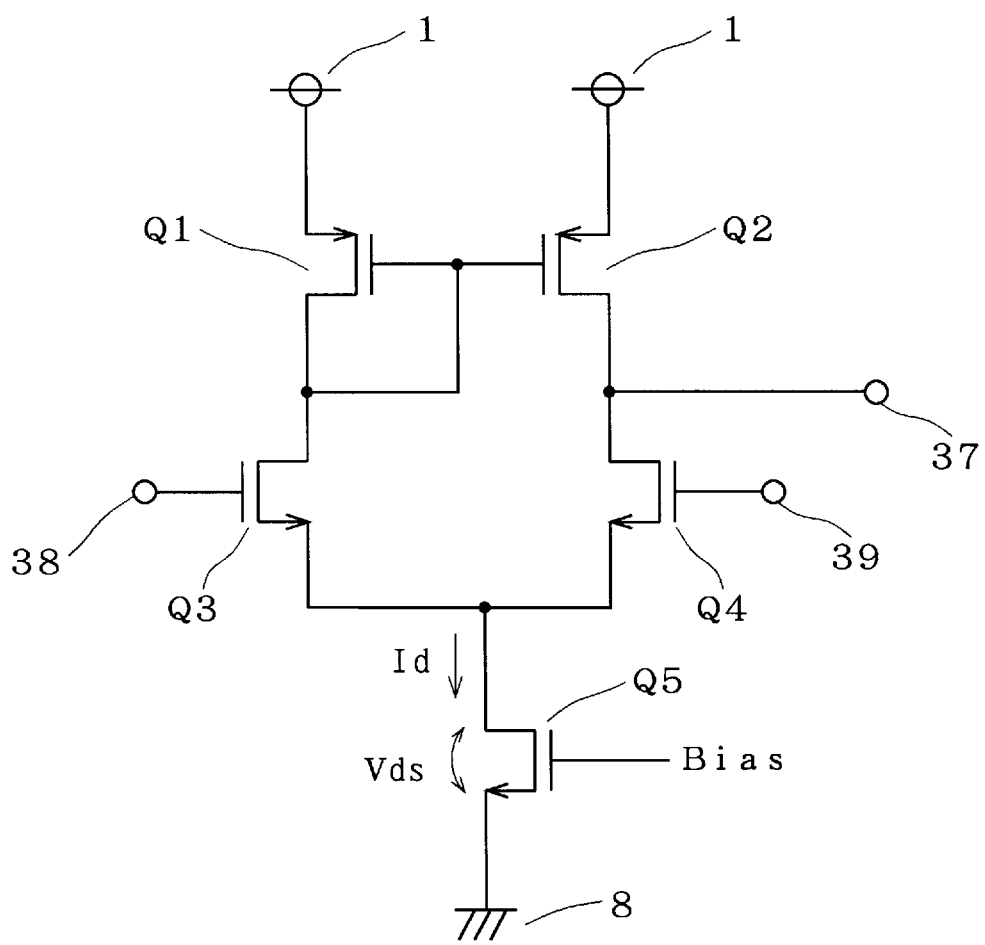
FIG. 4 is a circuit diagram showing the structure of a differential amplifier 36.

FIG. 4 is a circuit diagram showing the structure of the differential amplifier 36. A noninverting input terminal 38 and an inverting input terminal 39 are connected to gates of n-channel transistors Q3 and Q4 respectively. Sources of p-channel transistors Q1 and Q2 are supplied with the potential AVdd through the analog source terminal 1, and the ground 8 is connected to a source of an n-channel transistor Q5. A gate and a drain of the p-channel transistor Q1 and a gate of the p-channel transistor Q2 are connected in common, while a drain of the p-channel transistor Q2 is connected to the comparator output terminal 37. Further, a drain of the n-channel transistor Q5 and sources of the n-channel transistors Q3 and Q4 are connected in common. A gate of the n-channel transistor Q5 is supplied with a bias potential.

FIG. 5 is a graph showing the characteristics of the n-channel transistor Q5. It is assumed here that Vds and Id represent the source-to-drain voltage and the drain current of the n-channel transistor Q5 respectively.

When "H" and "L" are inputted in the noninverting and inverting input terminals 38 and 39 respectively, "H" is outputted at the comparator output terminal 37. The current values of Vds and Id are represented by VH and IH respectively. When "L" and "H" are inputted in the noninverting and inverting input terminals 38 and 39 respectively, on the other hand, "L" is outputted at the comparator output terminal 37. The current values of Vds and Id are represented by VL and IL respectively.

Currents flowing to the differential amplifiers 34, 35 and 36 when the output appearing at the comparator output terminal 37 is "L" differ from those flowing when the output is "H" by current differences $\Delta I1$, $\Delta I2$ and $\Delta I3$ respectively. Thus, the single comparator Cmpj which is formed by the three differential amplifiers 34 to 36 exhibits a current difference $\Delta I = \Delta I1 + \Delta I2 + \Delta I3$.

Due to the single-ended style of the differential amplifier 36, however, the n-channel transistor Q5 operates in an unsaturated region (triode region) when Vds=VL, while operating in a saturated region (pinched region) when Vds=VH. Hence, $\Delta I3 = IH - IL$. On the other hand, both of the first and second stage amplifiers 34 and 35 operate in saturated regions, whereby $\Delta I1$ and $\Delta I2$ have small values as compared with $\Delta I3$. Thus, the current difference $\Delta I$ of the single comparator Cmpj is approximately equal to $\Delta I3 = IH - IL$. When the output level of the comparator is converted from "L" to "H", the source current of the single comparator is changed from 20 $\mu A$ to 200 $\mu A$, for example.

This embodiment is adapted to measure the source current of the comparator array 25 through this difference of the current values, for making a functional test. While an IDDQ (Vdd supply current quiescent) testing method is known as a technique of determining nondefectiveness/defectiveness of a circuit by measuring a source current in relation to a digital circuit, this is applied to an analog circuit in this embodiment (analog IDDQ test).

Figure 6:
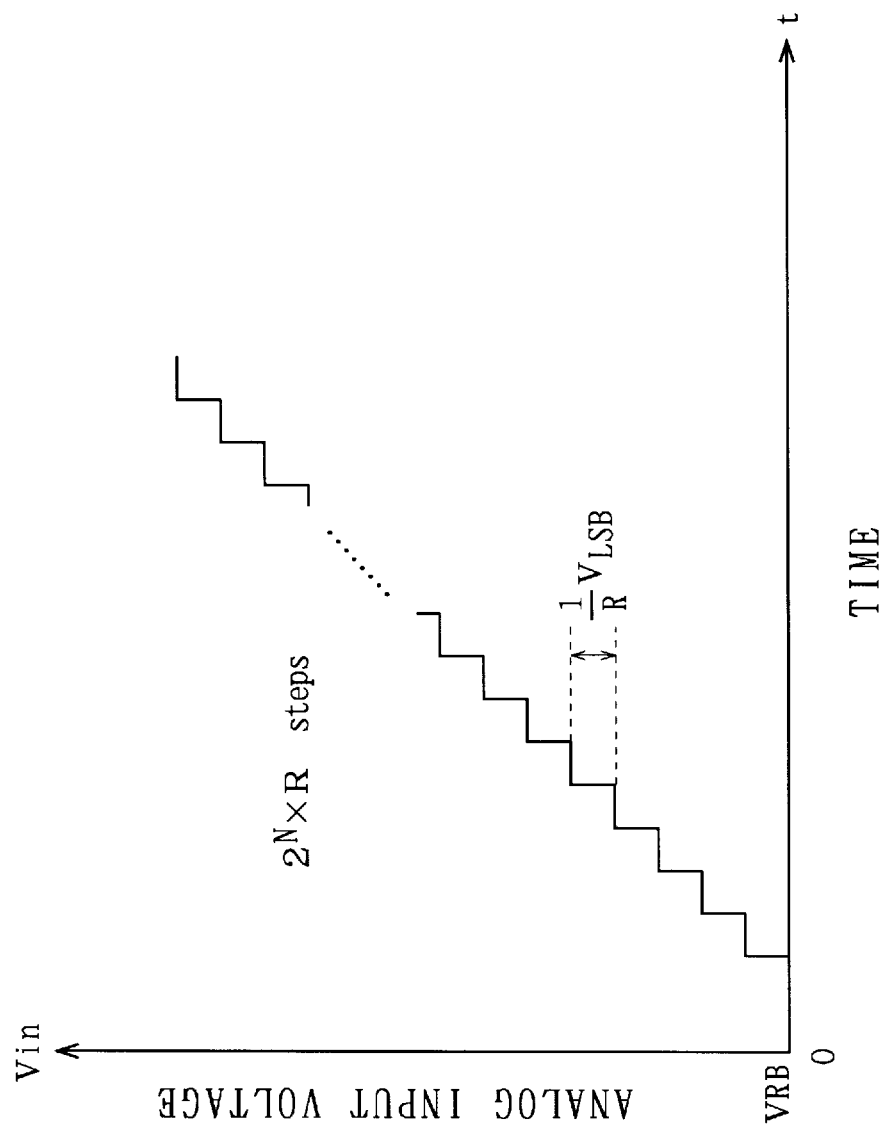
FIG. 6 is a graph showing time change of an analog input voltage Vin.

FIG. 6 is a graph showing time change of the analog input voltage Vin. When such an analog input voltage Vin stepwise changed with time is received, the drain current Id fluctuates due to fluctuation of the output level of the comparator, and this is measured by the current measurer 22 through the analog source terminal 1.

When the resolution of the analog input voltage Vin is set at 1/R of a voltage $V_{LSB}$ corresponding to LSB, the analog input voltage Vin is supplied from the analog source 17 to the analog voltage input terminal 5 to be successively increased with time in $2^{10} = R$ steps. $(1/R)V_{LSB} = (VRT - VRB)/(2^{10} 1)/R$ holds. When R=5 is set, for example, the analog input voltage Vin is applied to the analog voltage input terminal 5 as a fine input step voltage of 5×1024 steps.

The analog IDDQ test is a method of measuring a current appearing at an analog power source AVdd in a jagged waveform as described later with increase of the analog input voltage Vin shown in FIG. 6 by the current measurer 22. The measured source current waveform is compared with a theoretically calculated ideal (normal) source current.

Figure 7:
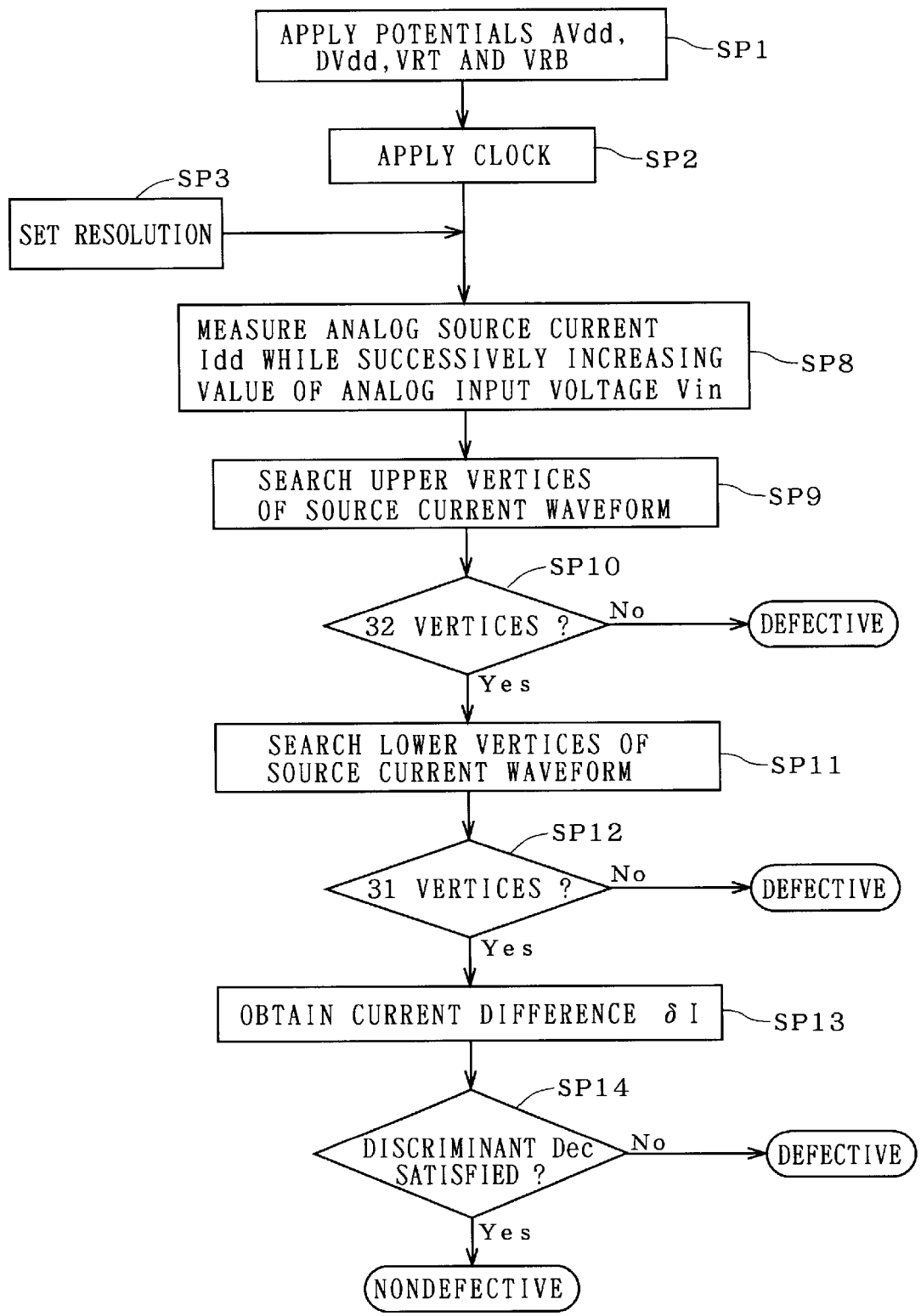
FIG. 7 is a flow chart illustrating a method of a functional test according to the embodiment 1.

FIG. 7 is a flow chart illustrating the inventive functional test method. First, the first to fourth power sources are turned on at a step SP1, so that the potentials AVdd, DVdd, VRT and VRB are applied to the analog source terminal 1, the digital source terminal 2, the upper reference source terminal 3 and the lower reference source terminal 4 respectively. At a step SP2, the sampling clock from the clock source 18 and the like are applied to the clock input terminal 6. At a step SP3, on the other hand, the resolution (i.e., $(I/R)V_{LSB}$) of the analog input voltage Vin outputted from the analog source 17 is set. At a step SP8, the analog input voltage Vin is increased by the resolution set at the step SP3 and supplied to the analog input voltage terminal 5 stepwise (in a lamp waveform) as shown in FIG. 6, for measuring an analog source current Idd flowing at the analog source terminal 1 for each step of the analog input voltage Vin by the current measurer 22 such as a multimeter. The analog source current Idd is a current flowing to the comparator array 25.

Figure 8:
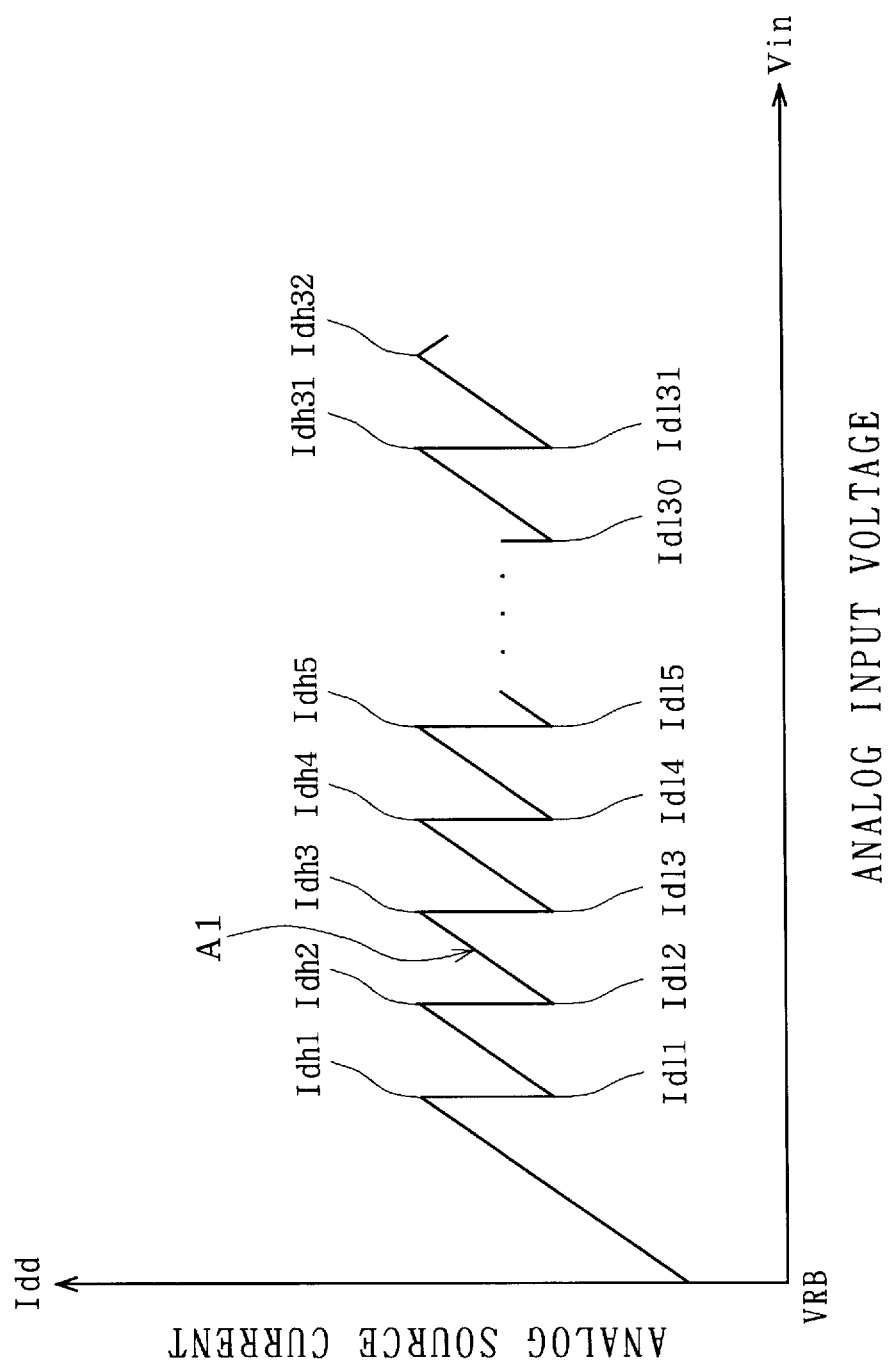
FIG. 8 is a graph showing a correct analog source current Idd.

FIG. 8 is a graph showing the current waveform of the analog source current Idd for the analog input voltage Vin in case of a normal A-D converter cell 101. In the subranging A-D converter, the upper (coarse) five bits are first obtained and the 31 fine reference voltages Vrf obtained from the resistance block bj (j=1 to 32) corresponding thereto are compared with the analog input voltage Vin for obtaining the lower (fine) five bits. The analog source current Idd is measured at the time of obtaining not the upper (coarse) five bits but the lower (fine) bits.

When Vin<Vref (Vrc or Vrf), the comparator output goes low. When Vin>Vref, on the other hand, the comparator output goes high.

When the analog input voltage Vin is smaller than all fine reference voltages Vrf in a certain ladder resistance block bj, all outputs of the 31 comparators Cmp1 to Cmp31 go low. The outputs of the 31 comparators Cmp1 to Cmp31 are successively changed to "H" due to increase of the analog input voltage Vin. Consequently, the analog source current Idd is increased. This state is shown in a positive slope A1 in FIG. 8 when j=3, for example. The analog source current Idd is measured when the lower (fine) bits are obtained as described above, whereby no current flowing at the time of obtaining the upper (coarse) bits upon increase of the analog input voltage Vin appears in the graph.

When the analog source current Idd is successively increased from the potential VRB (e.g., 0 V), a range up to a certain offset voltage is present as a dead zone for the comparator, and the analog source Vin is monotonously increased. The comparator Cmp1 which is connected to the ladder resistance block b1 first outputs "H" when the analog input voltage Vin exceeds the offset voltage.

After all outputs of the comparators Cmp1 to Cmp31 connected to the ladder resistance block b1 by the switch matrix 24 go high, the logic circuit 26 controls the switch matrix 24 by the feedback signals. Namely, the comparators Cmp1 to Cmp31 are connected to the ladder resistance block b2 due to increase of Vin. At this time, the outputs of the 31 comparators Cmp1 to Cmp31 go low. Thus, it comes to that the analog source current Idd having theretofore been increased is abruptly reduced.

Further, the outputs of the comparators Cmp1 to Cmp31 are successively changed to "H" due to increase of the analog input voltage Vin. Thus, the comparators Cmp1 to Cmp31 are successively connected to updated ladder resistance blocks to operate. Due to the operations of the comparators Cmp1 to Cmp31, the source current waveform is brought into the jagged waveform shown in FIG. 8.

Due to this analog IDDQ test, a switch connection fault of the switch matrix 24 and functional faults of the comparators Cmp1 to Cmp31 can be detected. Steps SP9 to SP14 are adapted to perform concrete processing of determining nondefectiveness/defectiveness by analyzing the obtained source current waveform.

First, current values Idhm (m=1 to 32) at the upper vertices of the source current waveform shown in FIG. 8 are searched at the step SP9. The search is started from the lower side (potential VRB) of the analog input voltage Vin, to obtain the current values at points where increase of the analog source current Idd is stopped or started for reduction. The increase of the analog source current Idd is turned to abrupt reduction due to change of the ladder resistance block which is connected to the comparator array 25 from bi to b(i+1) (i=1 to 31). Such a search is performed until the analog input voltage Vin reaches the potential VRT, thereby obtaining the current values Idhm. However, the analog source current Idd is reduced or inhibited from being increased until the analog voltage Vin reaches the VRT when the analog input voltage Vin exceeds the full scale of the A-D converter cell 101, and hence this is also recognized as an upper vertex (current Idh32).

At the step SP10, the number of the upper vertices is determined. If the A-D converter cell 101 is normal, this number must coincide with the number 32 (corresponding to the upper five bits) of the ladder resistance blocks. Therefore, the A-D converter cell 101 is determined as defective if the number is not 32, while the process advances to the step SP11 for performing another test if the number is 32, since there is a possibility for nondefectiveness.

Current values Idlk (k=1 to 31) of lower vertices of the source current waveform shown in FIG. 8 are searched at the step SP11. Namely, this search is started from the higher side (potential VRT) of the analog input voltage Vin, for obtaining current values of change points where monotonous reduction of the analog source current Idd is turned to abrupt increase along the search direction. This search is performed until the analog input voltage Vin reaches the potential VRB, thereby obtaining the current values Idlk.

The number of the lower vertices is determined at the step SP12. Since there is a dead zone for the comparators as described above, this number must be 31 which is smaller than the number 32 of the ladder resistance blocks by 1 if the A-D converter cell 101 is normal. Therefore, the A-D converter cell 101 is determined as defective if the number is not 31, while the process advances to the step SP13 for performing still another test if the number is 31, since there is a possibility for nondefectiveness.

Figure 9:
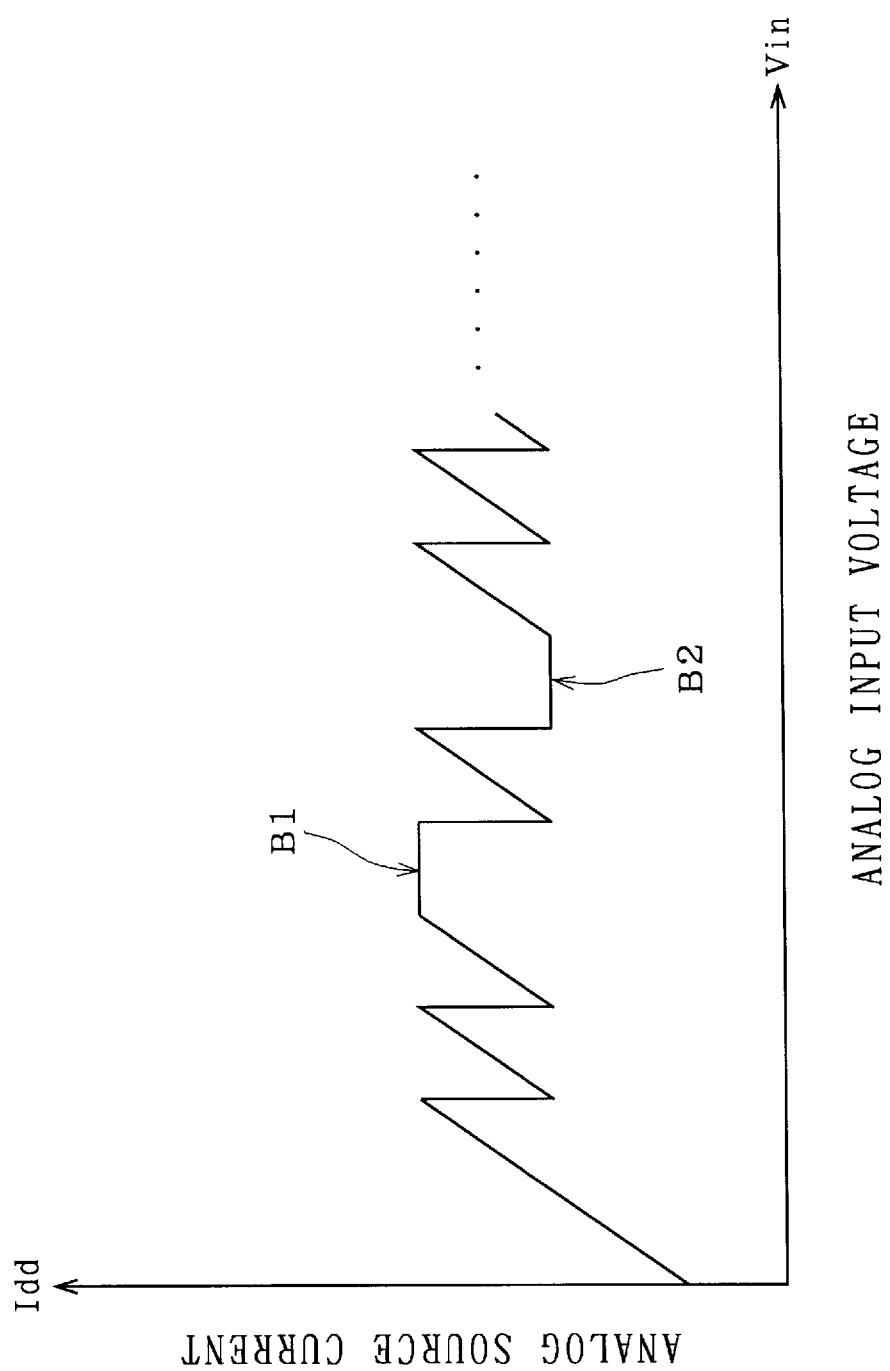
FIGS. 9 and 10 are graphs showing a source current waveform including two types of defective patterns.

Thus, the steps SP10 and SP12 are adapted to detect operational faults as to the upper (coarse) bits. FIG. 9 is a graph showing a source current waveform having two defective patterns. If one of the upper reference voltage lines 27 to which the coarse reference voltages Vrc are transmitted is disconnected, the comparator corresponding to the disconnected upper reference voltage line 27 regularly outputs a constant voltage "L". Consequently, a resistance block which is adjacent to a proper one on the lower voltage side is selected and all outputs of the comparators go high at the time of obtaining the lower (fine) bits. Namely, all of the 31 comparators remain in "H" states with no dependency on the value of the analog input voltage Vin to result in a large flat part of the analog source current Idd such as a region B1, whereby the number of the lower vertices is reduced by 1.

If the capacitor C1 of any comparator is shorted, on the other hand, this defective comparator regularly outputs a constant voltage "H". Consequently, a resistance block which is adjacent to a proper one on the higher voltage side is selected and all outputs of the comparators go low at the time of obtaining the lower (fine) bits. Namely, all of the 31 comparators remain in "L" states with no dependency on the value of the analog input voltage Vin to result in a small flat part of the analog source current Idd such as a region B2, whereby the number of the upper vertices is reduced by 1.

At the step SP13, further, a current difference δI is obtained for detecting operational faults related to the lower (fine) bits. First, differences Ixi (i=1, 2, . . . , 31) between the current values of adjacent upper and lower vertices are obtained. Namely, Ixi=Idh(i+1)−Idli, and this corresponds to the amount of increase of the analog source current Idd in case of being connected to the same ladder resistance block b(i+1).

While each of FIGS. 8 and 9 illustrates the increase of the analog source current Idd in a straight line as the positive slope A1, the current is stepwise increased in more detail. In other words, the increase of the analog source current Idd exhibits a stepwise lamp waveform of 31 stages in correspondence to $(2^5-1)$ fine reference voltages Vrf in relation to one ladder resistance block.

Assuming that Ixmax represents the maximum value of the differences Ixi, therefore, this is a current difference caused when the operation related to the lower (fine) bits is normal. And it comes to that the current difference δI obtained by $Ixmax/(2^5-1)$ indicates the range of errors allowed when the operation related to the lower (fine) bits is normal. In other words, the current difference δI is set at a current quantity for a single code which is the minimum unit of the amount of change of the digital output.

At the step SP14, an operational fault related to the lower (fine) bits is determined with a discriminant Dec. The current difference δI indicates the range of errors allowed for a normal converter, and hence a determination is made that a normal operation is performed only when the absolute values of differences between all Idhm and all Idlk (m=1 to 32, k=1 to 31) are within the range of δI. Namely, employed as the discriminant Dec is:

Dec1:−δI<(Idhp−Idhm)<δI, and
−δI<(Idlq−Idlk)<δI where p represents one of 1, 2, . . . , 32, m represents all of 1, 2, . . . , 32 other than p, q represents one of 1, 2, . . . , 31, and k represents all of 1, 2, . . . , 31 other than q, so that the A-D converter 101 is determined as nondefective at the step SP14 only when the discriminant Dec1 is satisfied, and determined as defective in other case.

Figure 10:
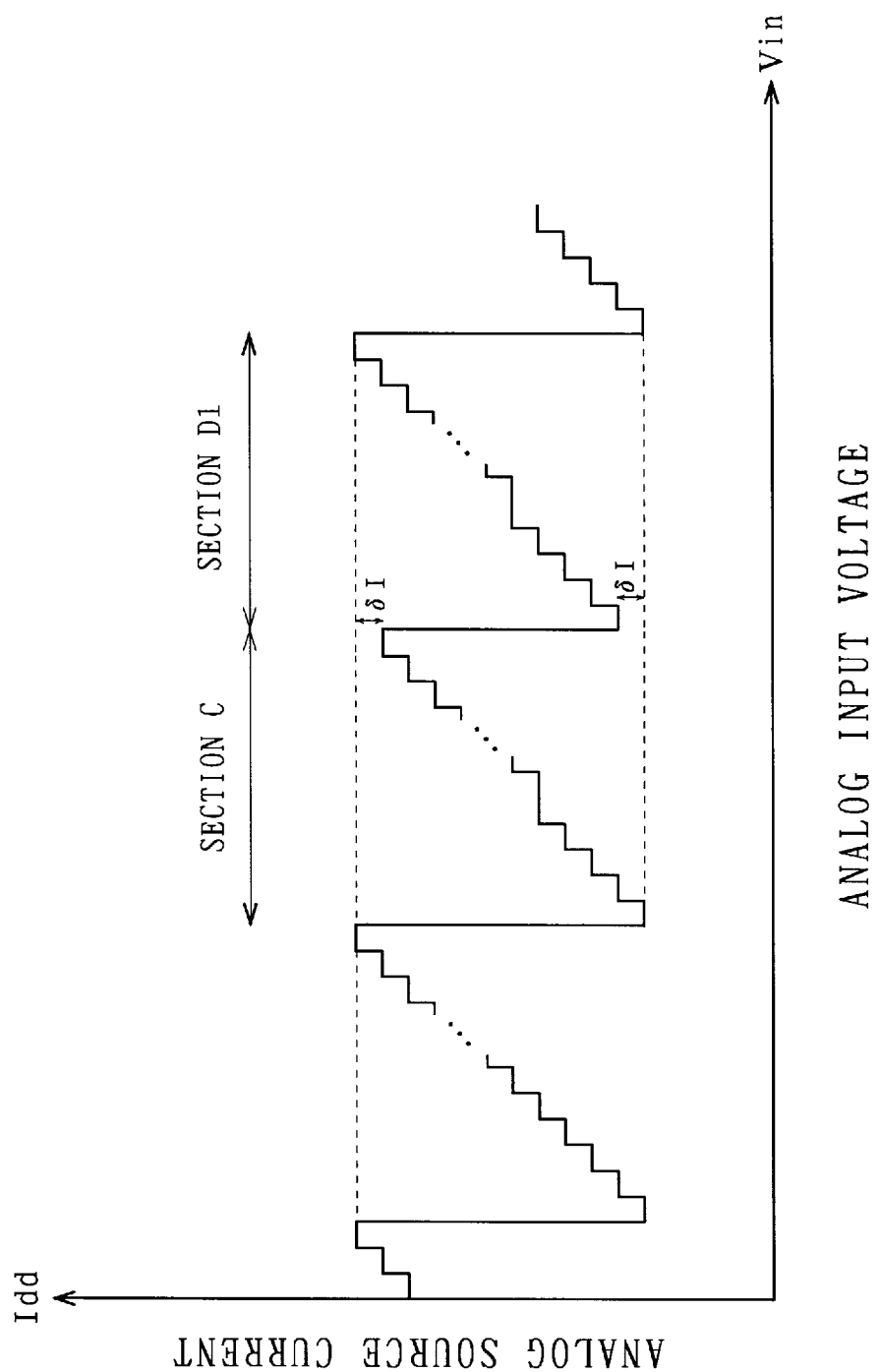

FIG. 10 is a graph showing a source current waveform having two defective patterns. In a section C, the output of the comparator Cmp5 is regularly "L", and hence the analog input voltage Vin reaching the fifth step from the lowest current value is larger than that in a normal case. Consequently, it reaches only a value which is lower than that in the normal case by δI even if the source current is increased. In a section D1, on the other hand, the output of the comparator Cmp5 is regularly "H", and hence the analog source current Idd up to the fifth step from the lowest current value is smaller than that in the normal case. Consequently, the minimum value of the analog source current Idd in the section D1 is higher than that in the normal case by δI.

According to this embodiment, the functional test of the A-D converter cell is performed in the aforementioned manner, whereby an operational fault related to the upper (coarse) bits can be detected. Further, an operational fault related to the lower (fine) bits can also be detected. Such detection is performed by measuring the current flowing to the analog source terminal 1 by the current measurer 22 and analyzing the same by the computer 20.

Thus, it is not particularly necessary to provide external test terminals for detecting the operational faults, whereby the chip and package sizes of the semiconductor device are reduced and the fabrication cost can be reduced.

Embodiment 2

Figure 11:
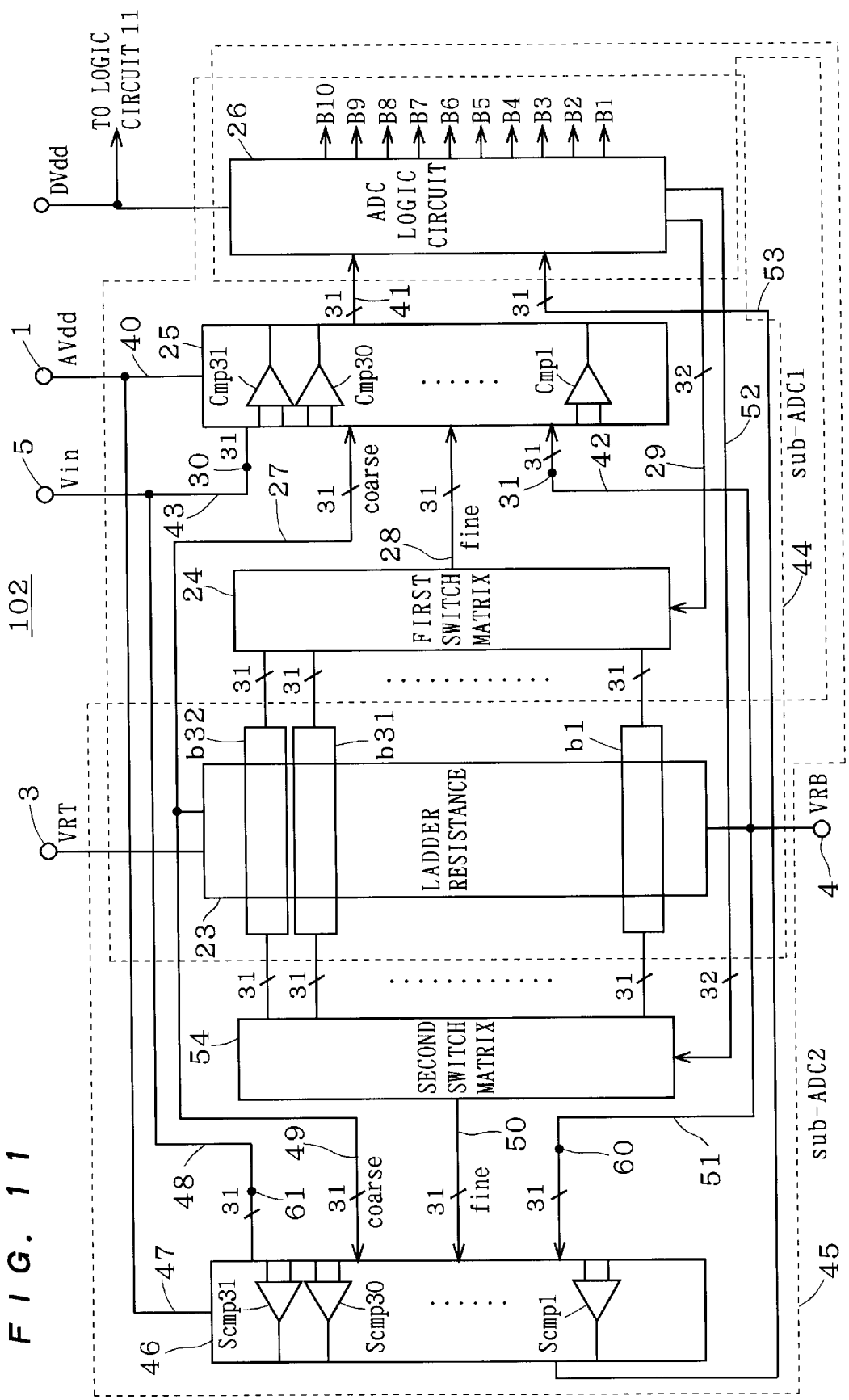
FIG. 11 is a block diagram showing the structure of an A-D converter cell 102 according to an embodiment 2 of the present invention.

FIG. 11 is a block diagram showing the structure of an A-D converter cell 102 according to an embodiment 2 of the present invention. The A-D converter cell 102 is substituted for the A-D converter cell 101 shown in FIG. 1. This 10-bit subranging A-D converter cell 102 comprises two 10-bit A-D converter subcells 44 and 45 operating in interleaved schemes.

The A-D converter subcell 44 has the same structure as the A-D converter cell 101 shown in the embodiment 1, and that shown as the switch matrix 24 in the embodiment 1 is shown as a first switch matrix 24 in the embodiment 2, for convenience.

The A-D converter subcell 45 is formed by elements corresponding to those of the A-D converter cell 101 according to the embodiment 1. Namely, it comprises a second switch matrix 54, and a comparator array 46 which is formed by a set of 31 comparators Scmp1 to Scmp31. An A-D converter logic circuit 26 for operating digital data from the comparator array 46 and controlling the second switch matrix 24 is shared with the A-D converter cell 101. The logic circuit 26 outputs feedback signals for controlling the second switch matrix 54 through 32 feedback lines 52. A ladder resistance 23 is also shared by the A-D converter subcells 44 and 45.

This A-D converter subcell 45 also performs A-D conversion on upper (coarse) five bits and lower (fine) five bits, similarly to the A-D converter subcell 44. 31 upper reference voltage lines 49 corresponding to the upper five bits are connected to boundaries between adjacent resistance blocks bi and b(i+1) (i=1 to 31). The upper reference voltage lines 49 are supplied with 31 coarse reference voltage Vrc. 31 lower reference voltage lines 50 corresponding to the lower five bits are supplied with 31 fine reference voltages Vrf outputted from one of ladder resistance blocks b1 to b32, which is selected by the switch matrix 24. The fine reference voltages Vrf are successively supplied to the 31 comparators Scmp1 to Scmp31 of the comparator array 46 from the lower side toward the higher side. The comparators Scmp1 to Scmp31 are identical in structure to the comparators Cmp1 to Cmp31.

A lower reference source wire 51 is supplied with the potential VRB through a lower reference source terminal 4, so that this potential is supplied to the 31 comparators Scmp1 to Scmp31 of the comparator array 46 through a second distribution terminal 60.

An analog input voltage Vin is transmitted to an analog input voltage line 48, to be supplied to the 31 comparators Scmp1 to Scmp31 of the comparator array 46 through an analog distribution terminal 61.

A potential AVdd is supplied to the comparator array 46 from an analog source terminal 1 through an analog source line 47, for its operation. 31 outputs of the comparator array 46 are transmitted to the logic circuit 26 through comparator array output lines 53.

The A-D converter subcells 44 and 45 operate in interleave structures. In the concrete, the A-D converter subcell 45 performs an operation for obtaining the lower (fine) bits when the A-D converter subcell 44 performs an operation for obtaining the upper (coarse) bits. When the A-D converter subcell 45 performs an operation for obtaining the upper (coarse) bits, on the other hand, the A-D converter subcell 44 performs an operation for obtaining the lower (fine) bits. Thus, one of the A-D converter subcells 44 and 45 regularly performs an operation for obtaining the upper (coarse) bits while the other one performs an operation for obtaining the lower (fine) bits.

Both of the A-D converter subcells 44 and 45 are connected to a first power source 13 through the analog source terminal 1, whereby an analog source current Idd of an analog part is at a value obtained by adding up currents supplied to the comparator arrays 25 and 46 of the A-D comparator subcells 44 and 45.

Also as to the A-D converter cell 102 of such an interleave structure, nondefectiveness/defectiveness of operations can be determined along the processing shown in FIG. 7, similarly to the embodiment 1.

Figure 12:
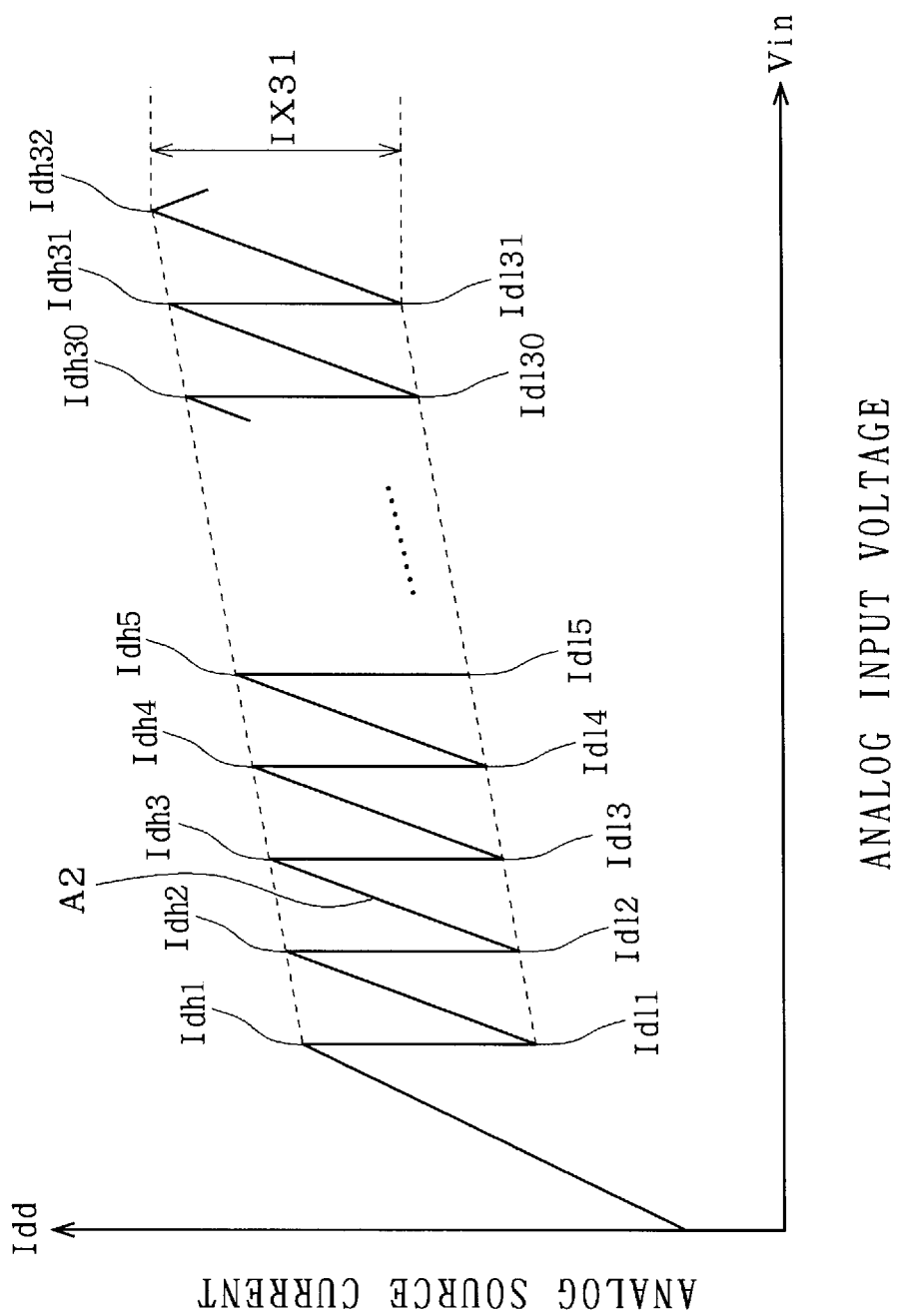
FIG. 12 is a graph showing a correct analog source current Idd.

FIG. 12 is a graph showing the analog source current Idd for the analog input voltage Vin in case where both of the A-D converter subcells 44 and 45 perform normal operations. The source current shown in FIG. 8 described with reference to the embodiment 1 has a jagged waveform in accordance with the operation of the comparator array 25 of the A-D converter subcell 44. In the source current waveform shown in FIG. 12, however, the source current waveform shown in FIG. 8 is upper-rightwardly distorted since the A-D converter subcells 44 and 45 regularly perform the operations for obtaining the upper (coarse) and lower (fine) bits respectively. For example, inclination of a positive slope A2 is twice that of the positive slope A1.

This distortion results from an operation newly performed by one more comparator for outputting "H" in the comparator array of the A-D converter subcell performing the operation for obtaining the upper (coarse) bits when the resistance blocks b1 to b32 must be switched to upper ones due to increase of the analog input voltage Vin. Values of Idh(s+1)–Idhs and Idl(t+1)–Idlt (where s=1 to 31, t=1 to 30) are equal to current quantities increased when the output of one of the comparators (Scmp1 to Scmp31 and Cmp1 to Cmp31) is changed from "L" to "H" so far as both A-D converter subcells 44 and 45 normally operate. The current quantities are added to the current waveform shown in FIG. 8, to obtain the current waveform shown in FIG. 12.

Also as to the interleave-structured A-D converter subcells 44 and 45, therefore, positions of upper and lower vertices of the analog source current Idd can be detected similarly to the steps SP9 and SP11 in the embodiment 1 and the numbers thereof can be investigated similarly to the steps SP10 and SP12, whereby nondefectiveness/defectiveness of the operation related to the upper (coarse) bits can be determined.

Also when the numbers of the upper and lower vertices are identical to those in case of performing normal operations, operational faults in relation to the lower (fine) bits can be detected by obtaining a current difference δI similarly to the step SP13 in the embodiment 1 and making a determination with a discriminant which is different from the discriminant Dec in the embodiment 1.

FIG. 13 is a graph showing the analog source current Idd which is increased following increase of the analog input voltage Vin. The operation related to the upper (coarse) bits is also performed dissimilarly to FIG. 10, whereby the upper and lower vertices are increased by δI following increase of the analog input voltage Vin even if normal operations are performed. For example, all of the 31 comparators remain in "H" states regardless of the value of the analog input voltage Vin in a section D2 corresponding to the region B1 in FIG. 9, while all of the 31 comparators remain in "L" states regardless of the value of the analog input voltage Vin in a section D3 corresponding to the region B2 in FIG. 9.

Therefore, employed as a discriminant Dec is:
Dec2:−δI<Idh(s+1)−Idhs−δI<δI, and
−δ<Idl(t+1)−Idlt−δI<δI
where s=1 to 31, and t=1 to 30.

Dissimilarly to the embodiment 1, abnormality of the operation related to the upper (coarse) bits is not necessarily detectable by the steps SP9 to SP12, but may be detected through the steps SP13 and SP14.

Figure 14:
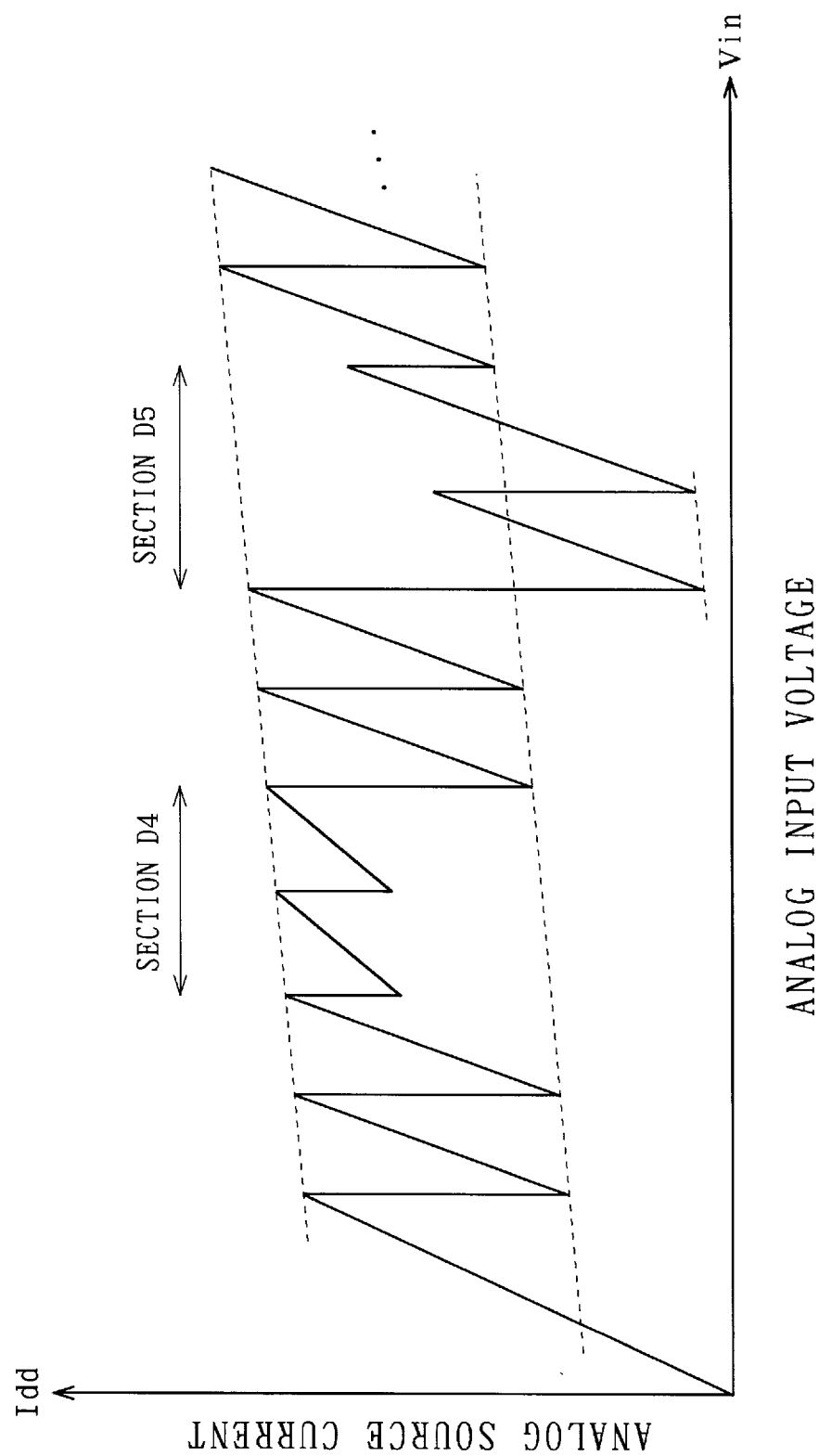
FIG. 14 is a graph showing a source current waveform with presence of an abnormal operation.

FIG. 14 is a graph showing a source current waveform having such an abnormal operation. In case of a normal operation, the number of the comparators outputting "H" for the same fine reference voltage Vrf are successively increased due to increase of the analog input voltage Vin, and the upper bits must be increased by one bit to be updated and all of the 31 comparators must output "L" if the analog input voltage Vin is further increased after all of the 31 comparators performing the comparative operations related to the lower (fine) bits output "H". A section D4 shows such case that the upper bits are erroneously updated to values smaller than correct values for increase of the analog input voltage Vin and all of the 31 comparators performing the comparative operations related to the lower (fine) bits maintain "H" states. On the other hand, a section D5 shows such case that the upper bits are erroneously updated to values larger than correct values for increase of the analog input voltage Vin and all of the 31 comparators maintain "L" states.

Thus, even if an abnormal operation related to the upper (coarse) bits is caused in one of the A-D converter subcells, the analog source current Idd is successively increased due to the comparative operations when the operations related to the lower (fine) bits of the (precedent) analog input voltage Vin simultaneously performed in the other A-D converter cell are normal. Thus, due to the interleave structure, a jagged waveform may appear also in the section D4 or D5.

Upper and lower vertices are present in such case, and hence the numbers thereof are not different from those in the normal case. However, the differences between adjacent pairs of upper and lower vertices are different from those in the normal operations, and hence the abnormality can be detected through the discriminant Dec2.

Figure 15:
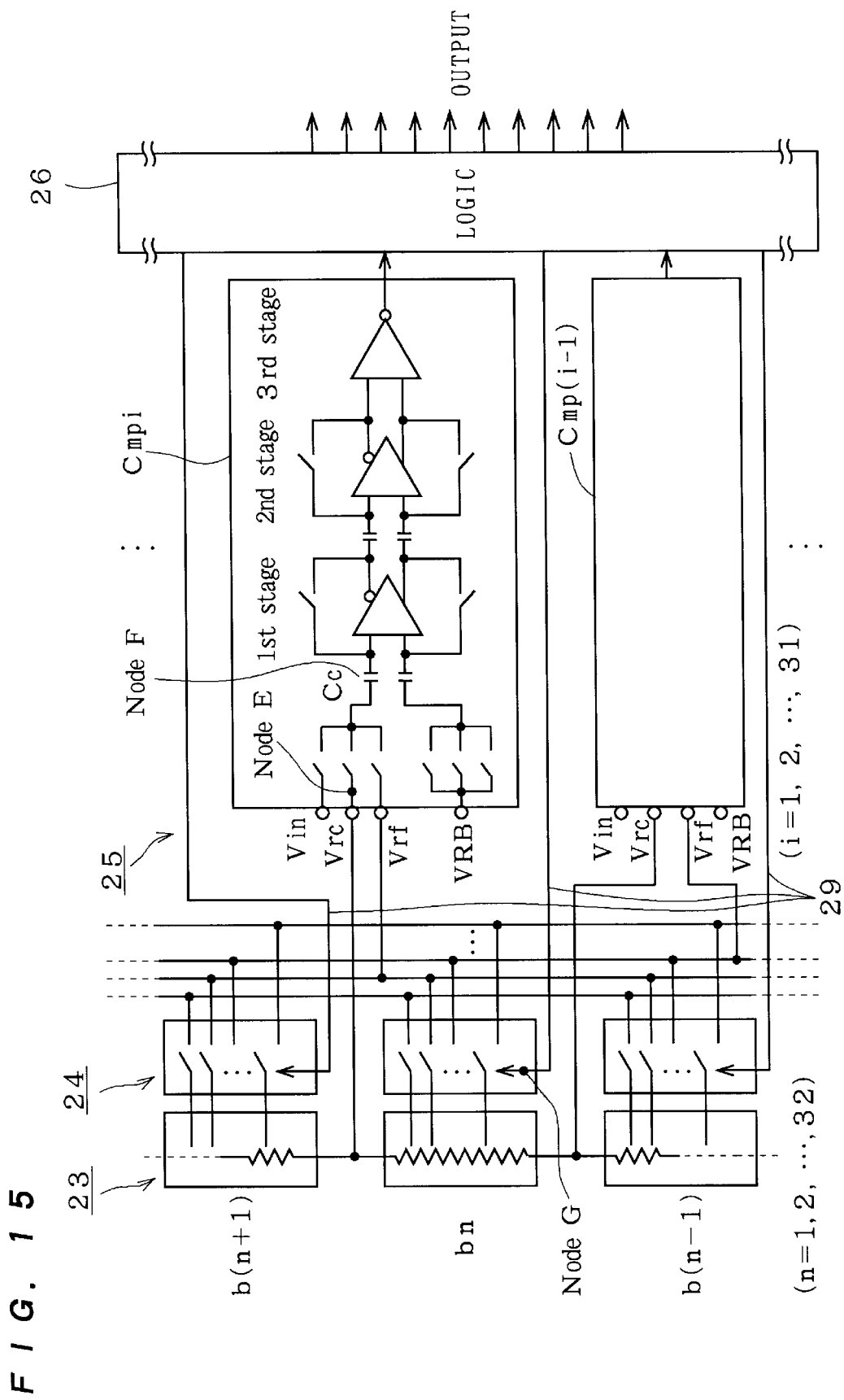
FIG. 15 is a block diagram showing a concrete faulty part.

FIG. 15 is a block diagram showing concrete faulty portions in a part of the A-D converter subcell 44, i.e., the structure around the ladder resistance 23, the first switch matrix 24, the comparator array 25 and the feedback lines 29. The feedback lines 29 are divided every bit, in correspondence to resistance blocks b(n−1), bn and b(n+1) respectively. A capacitor Cc shown in the comparator Cmpi corresponds to the capacitor C1 shown in FIG. 3.

Figure 16:
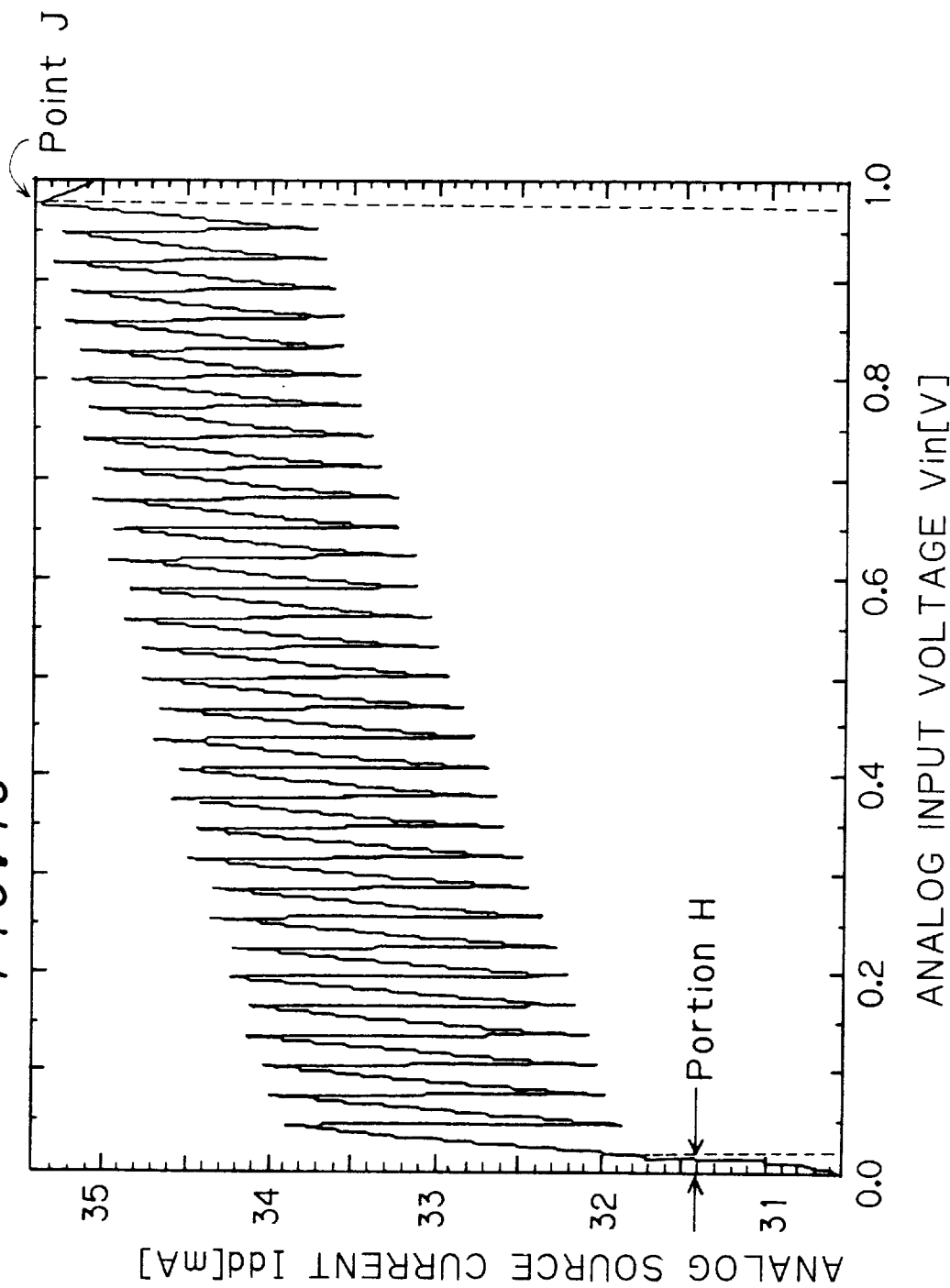
FIG. 16 is a graph showing a correct analog source current Idd.

An analog source current waveform shown in FIG. 16 corresponds to a normal operation, with 32 jagged waves. A portion H shows the offset voltage of this A-D converter subcell, and a point J shows an analog source current in a full scale.

Figure 17:
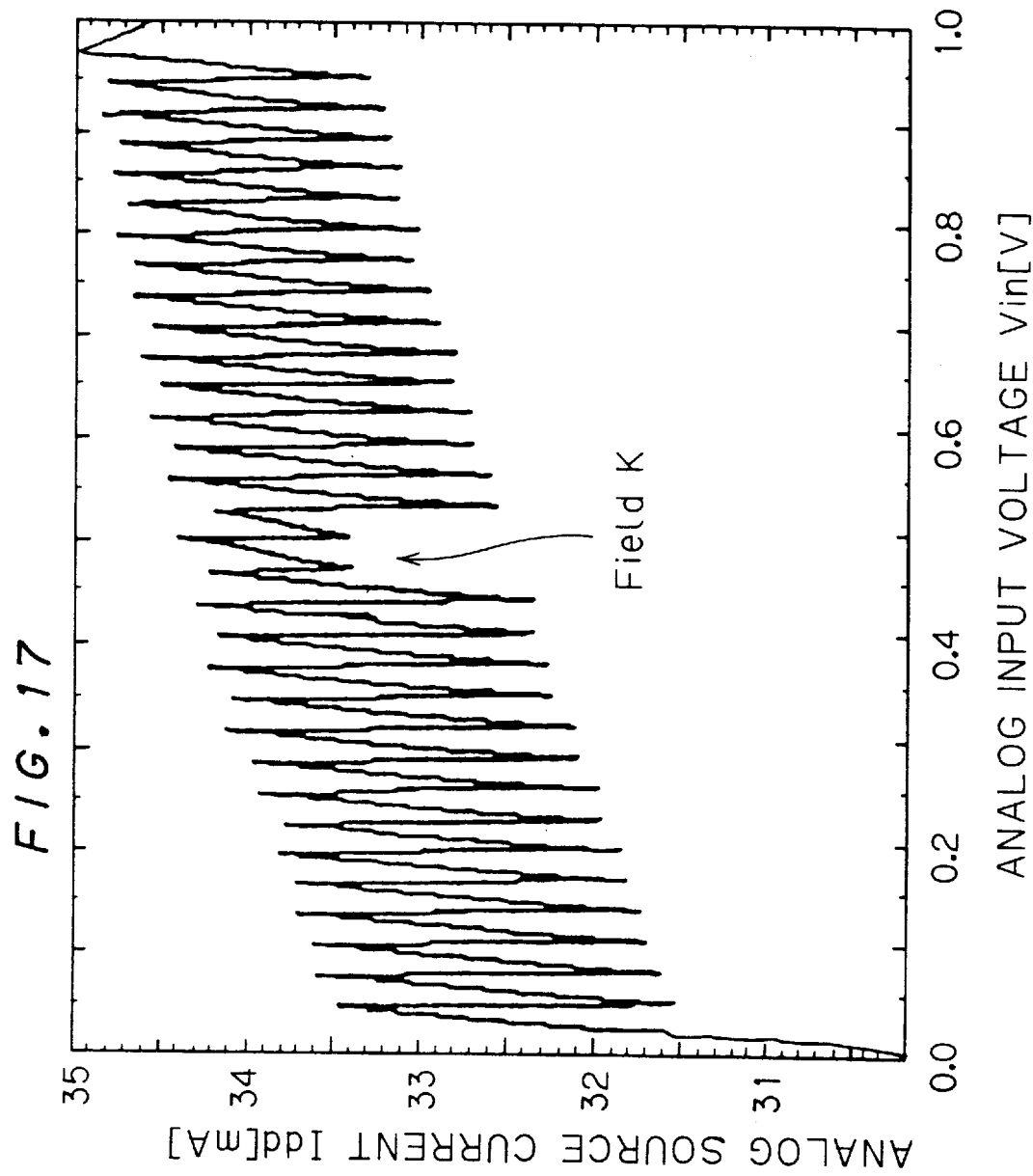
FIG. 17 is a graph showing an analog source current causing disconnection in a faulty part Node E.

FIG. 17 shows result evaluation in case of a comparator's functional fault, particularly when disconnection is caused in the faulty portion Node E shown in FIG. 15, i.e., when the coarse reference voltage Vrc of the A-D converter subcell 44 is not transmitted. This defective comparator regularly outputs a constant voltage "L". Consequently, a resistance block which is adjacent to a proper one on the lower voltage side is selected. Therefore, all of the comparator outputs go high, and the analog source current Idd of the A-D converter subcell 44 takes a high current value. On the other hand, the A-D converter subcell 45 normally operates, whereby the analog source current Idd presents a jagged waveform also in this case.

Figure 18:
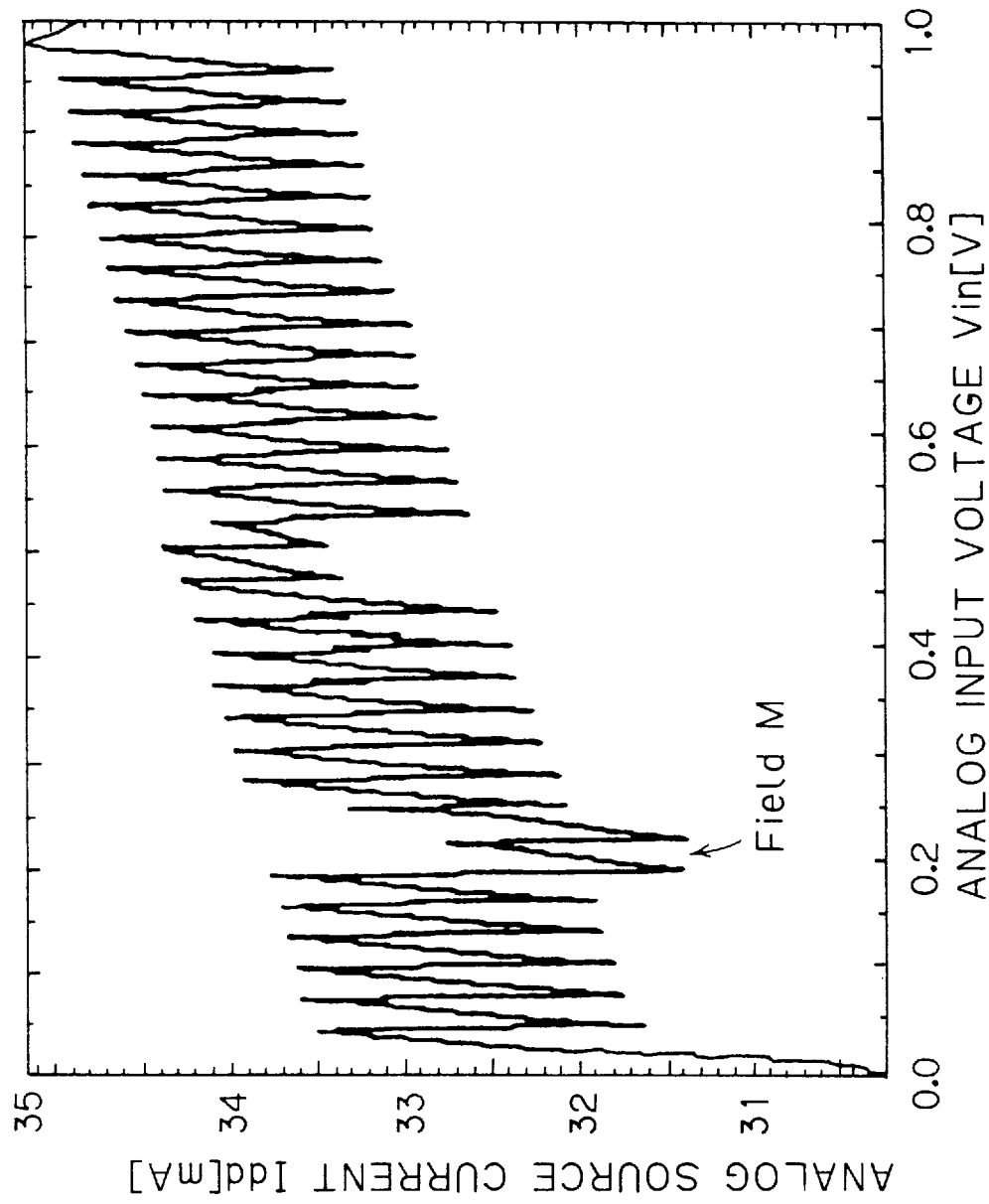
FIG. 18 is a graph showing an analog source current causing a short in a faulty part Node F.

FIG. 18 shows result evaluation in case of a comparator's functional fault, particularly when connection is caused in the faulty portion Node F shown in FIG. 15, i.e., when a capacitor C of the A-D converter subcell 44 is short-circuited. This defective comparator regularly outputs a constant voltage "H". The logic circuit 26 of the A-D converter cell feeds back an abnormal signal to the first switch matrix 24 in a portion of field M. Consequently, a resistance block which is adjacent to a proper one on the higher voltage side is selected. Therefore, all of the comparator outputs go low, and the analog source current of the A-D converter subcell 44 takes a small current value. On the other hand, the A-D converter subcell 45 normally operates, whereby the analog source current Idd presents a jagged waveform also in this case.

Figure 19:
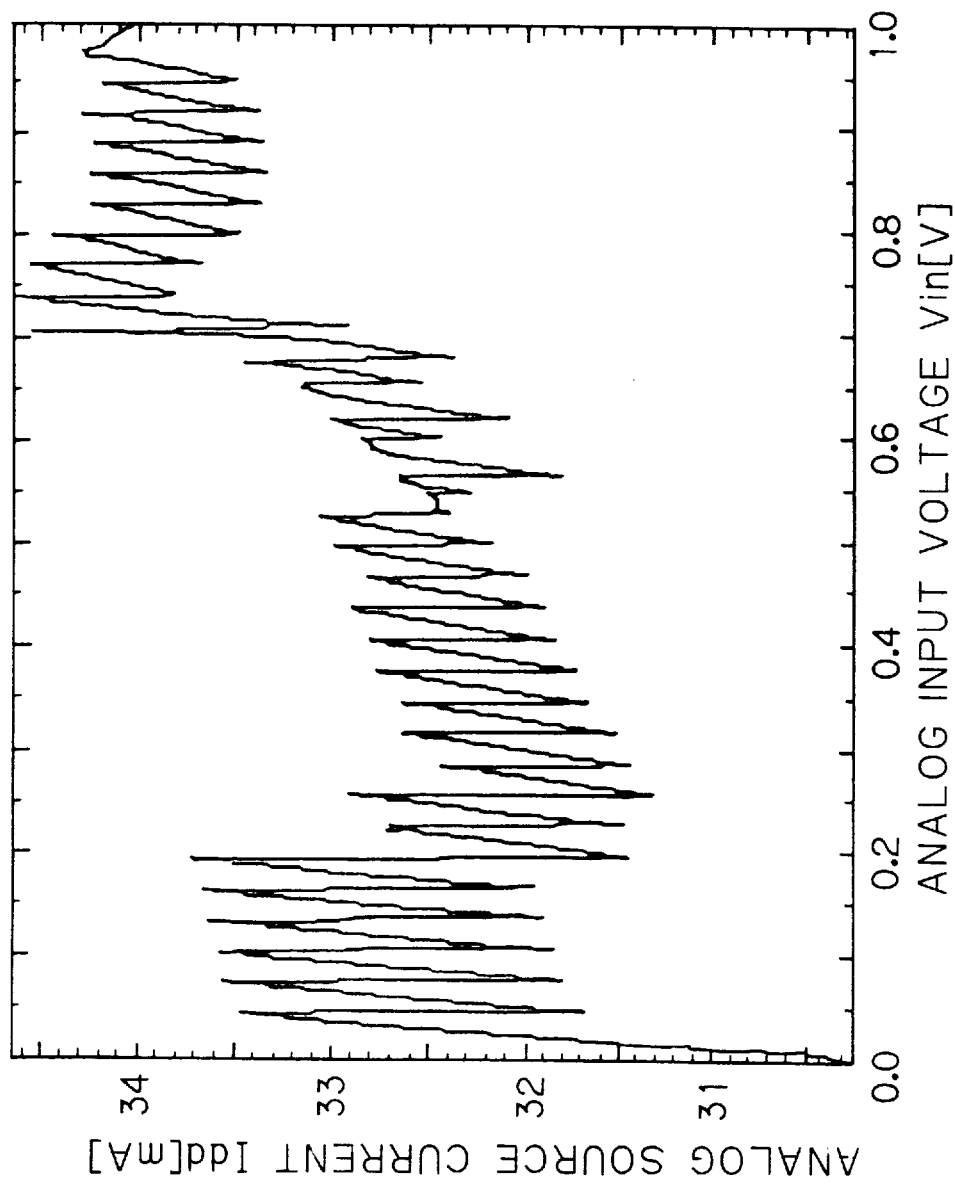
FIG. 19 is a graph showing an analog source current causing disconnection in a faulty part Node G.

FIG. 19 shows result evaluation in such case that disconnection is caused in a faulty portion Node G shown in FIG. 15, i.e., when a feedback line 29 of the A-D converter subcell 44 is open. This is imperfect switch connection of the switch matrix 24. The voltage of the node G goes low by a feedback signal, and the resistance block corresponding to the node G is regularly selected. On the other hand, a resistance block corresponding to correct upper (coarse) bits is also selected, and the two resistance blocks are short-circuited when the 31 comparators compare the fine reference voltages Vrf with the analog input voltage Vin. Consequently, both of the fine and coarse reference voltages Vrf and Vrc are distorted and the A-D converter subcells 44 and 45 cannot normally operate. Such a fault can also be determined due to no regularity of the analog source current Idd.

As hereinabove described, one of the interleave-structured A-D converter subcells 44 and 45 regularly performs the comparative operation related to the lower (fine) bits, whereby the analog source current Idd may not be measured in synchronization with the operation of obtaining the lower (fine) bits dissimilarly to the embodiment 1.

Embodiment 3

Figure 20:
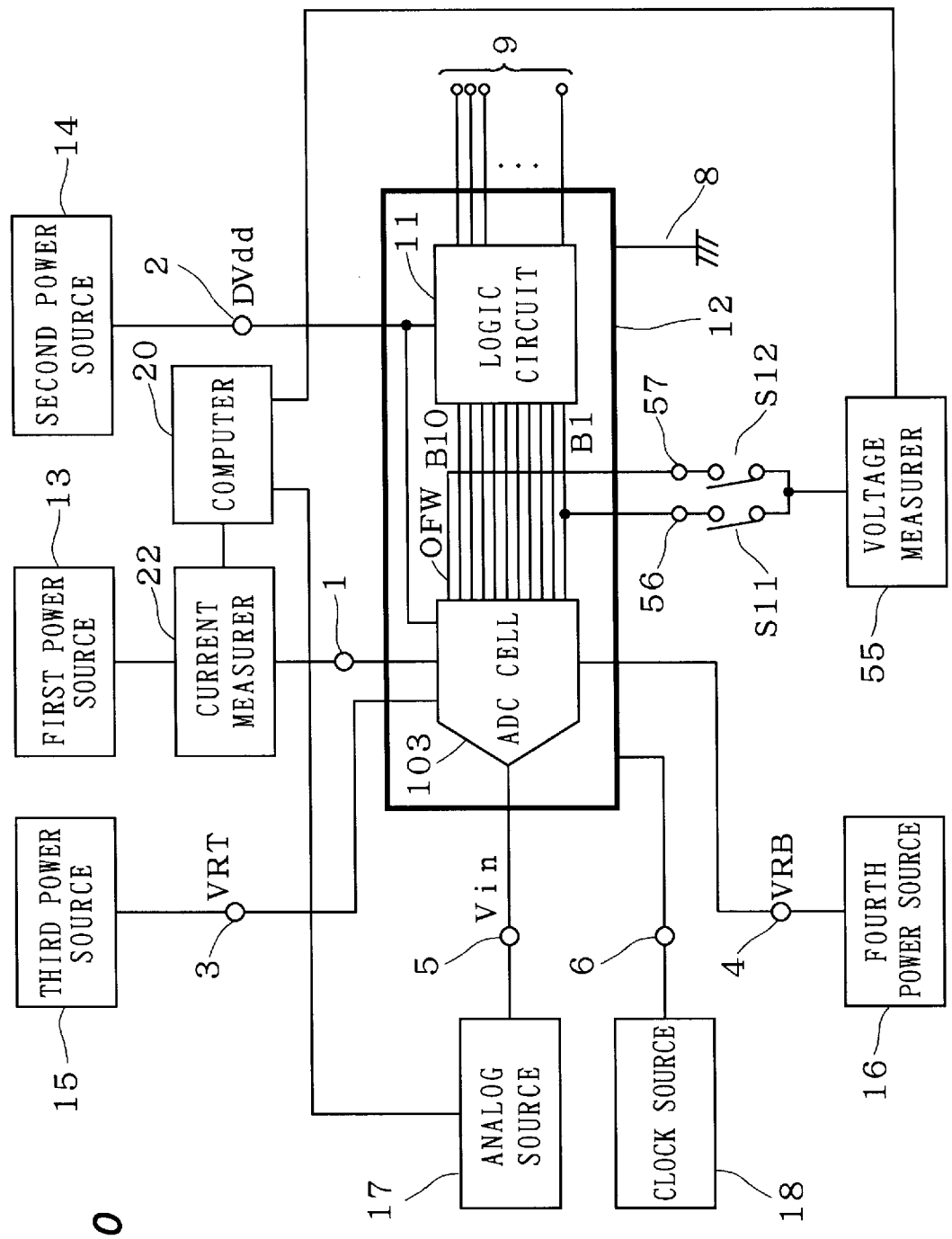
FIG. 20 is a block diagram illustrating an embodiment 3 of the present invention.

FIG. 20 is a block diagram illustrating the technique of an embodiment 3 of the present invention, for making a functional test of an A-D converter cell 103 which is stored in an analog-digital combinational LSI 12. The A-D converter cell 103 which is of a serial-parallel (subranging) type can be substituted for the A-D converter cell 101 stored in the LSI 12 shown in FIG. 1. The embodiment 3 is also applied to a 10-bit converter, while the present invention is applicable to another bit number, as a matter of course.

The A-D converter cell 103 is different from the A-D converter cell 101 in a point that an overflow OFW is outputted when an analog input voltage Vin exceeds a full scale of A-D conversion. A measuring system shown in FIG. 20 is additionally provided with switches S11 and S12, a voltage measurer 55, a least significant bit output terminal 56, and an overflow terminal 57, as compared with that shown in FIG. 1.

The overflow OFW is supplied to the overflow terminal 57, while the least significant bit B1 of the A-D converter cell 103 is supplied to the least significant bit output terminal 56. The switches S11 and S12 are interposed between the least significant bit output terminal 56 and the overflow terminal 57 and the voltage measurer 55 respectively.

Figure 21:
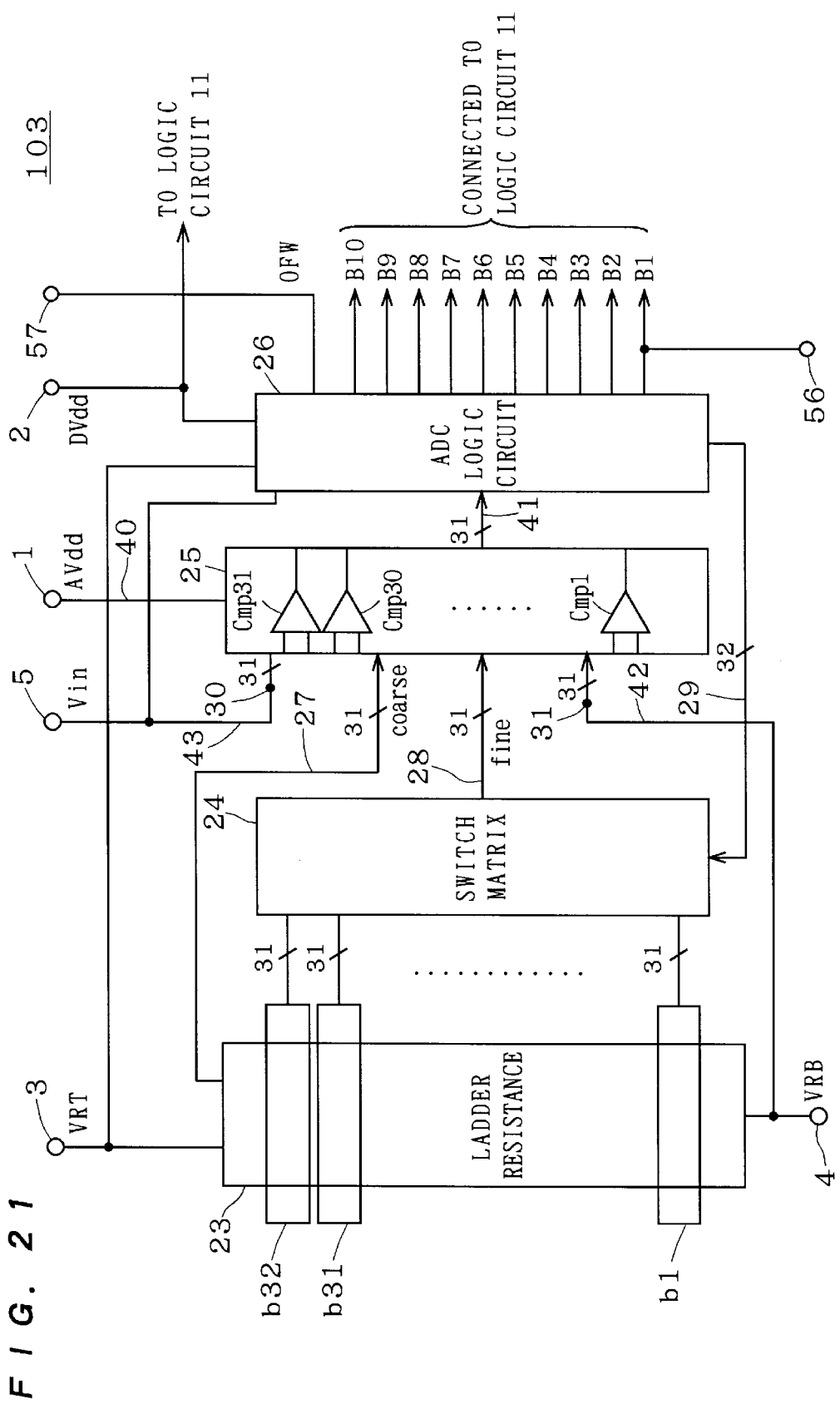
FIG. 21 is a block diagram showing the structure of an A-D converter cell 103.

FIG. 21 is a block diagram showing the structure of the A-D converter cell 103. The difference between this A-D converter cell 103 and the A-D converter cell 101 shown in FIG. 2 resides in that a potential VRT and the analog input voltage Vin are further supplied to a logic circuit 26, that the logic circuit 26 also outputs the overflow OFW and supplies the same to the overflow terminal 57, and that the same supplies the output code B1 which is the LSB to the least significant bit output terminal 56.

A ladder resistance 23 outputs 1023 reference voltages (32×31=992 fine reference voltages Vrf and 31 coarse reference voltages Vrc in the range of the fine reference voltages Vrf) which are in excess of or equal to the potential VRB and less than the potential VRT, while the same outputs no potential VRT. Therefore, the potential VRT and the analog input voltage Vin are preferably supplied to the logic circuit 26, in order to determine whether or not an overflow is caused.

Figure 22:
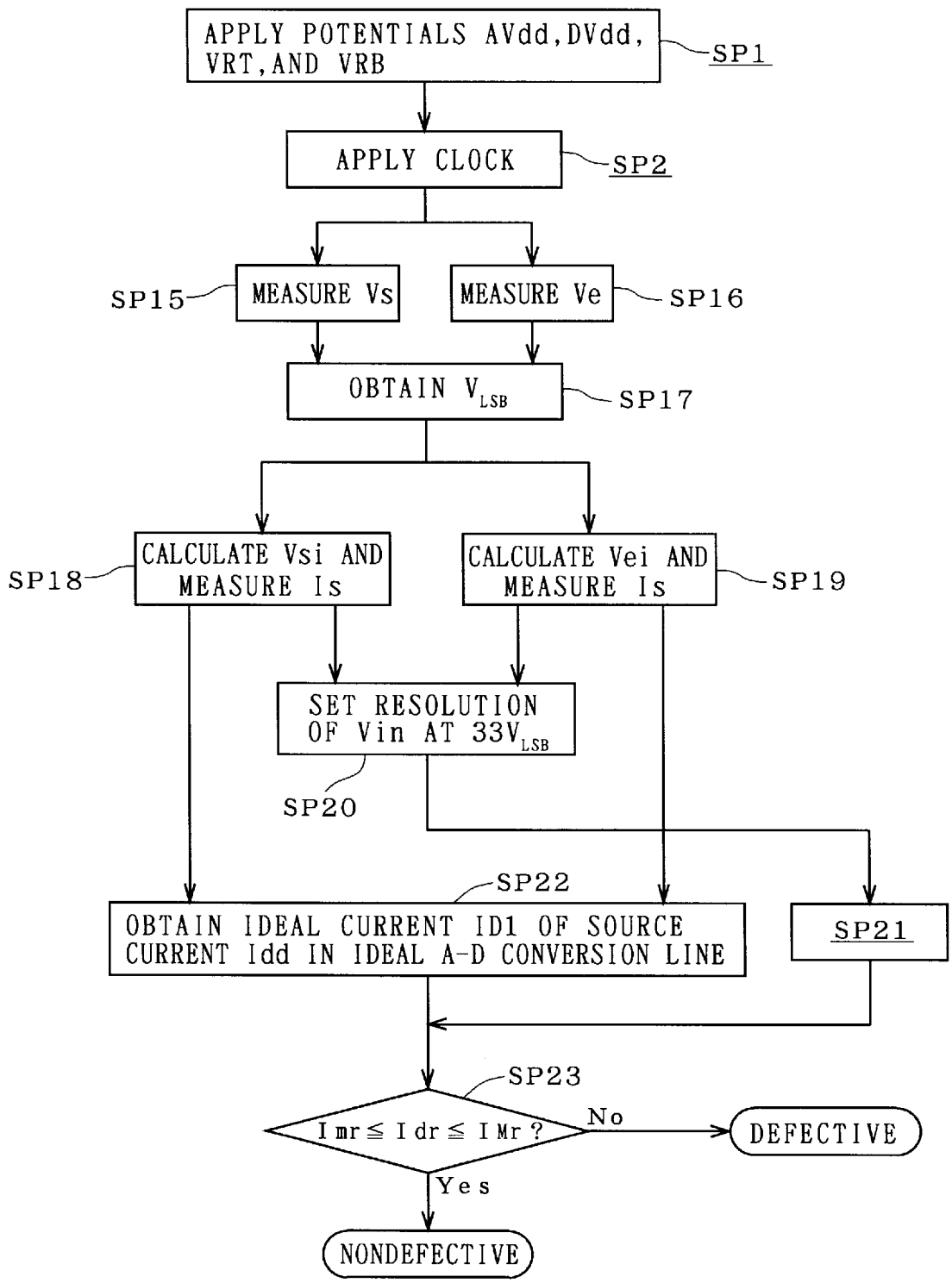
FIG. 22 is a flow chart illustrating a method of a functional test according to the embodiment 3.

FIG. 22 is a flow chart illustrating a method of a functional test according to this embodiment. At a step SP1, first to fourth power sources are turned on, and potentials AVdd, DVdd, VRT and VRB are applied to an analog source terminal 1, a digital source terminal 2, an upper reference source terminal 3, and a lower reference source terminal 4 respectively, as described with reference to the embodiment 1. At a step SP2, a sampling clock from a clock source 18 and the like are applied to a clock input terminal 6, also as described with reference to the embodiment 1. After execution of the step SP2, the process advances to steps SP15 and SP16.

At the step SP15, the analog input voltage Vin is increased for measuring a voltage Vs at a time when the output code of the A-D converter cell 103 is increased from "0" to "1".

Figure 23:
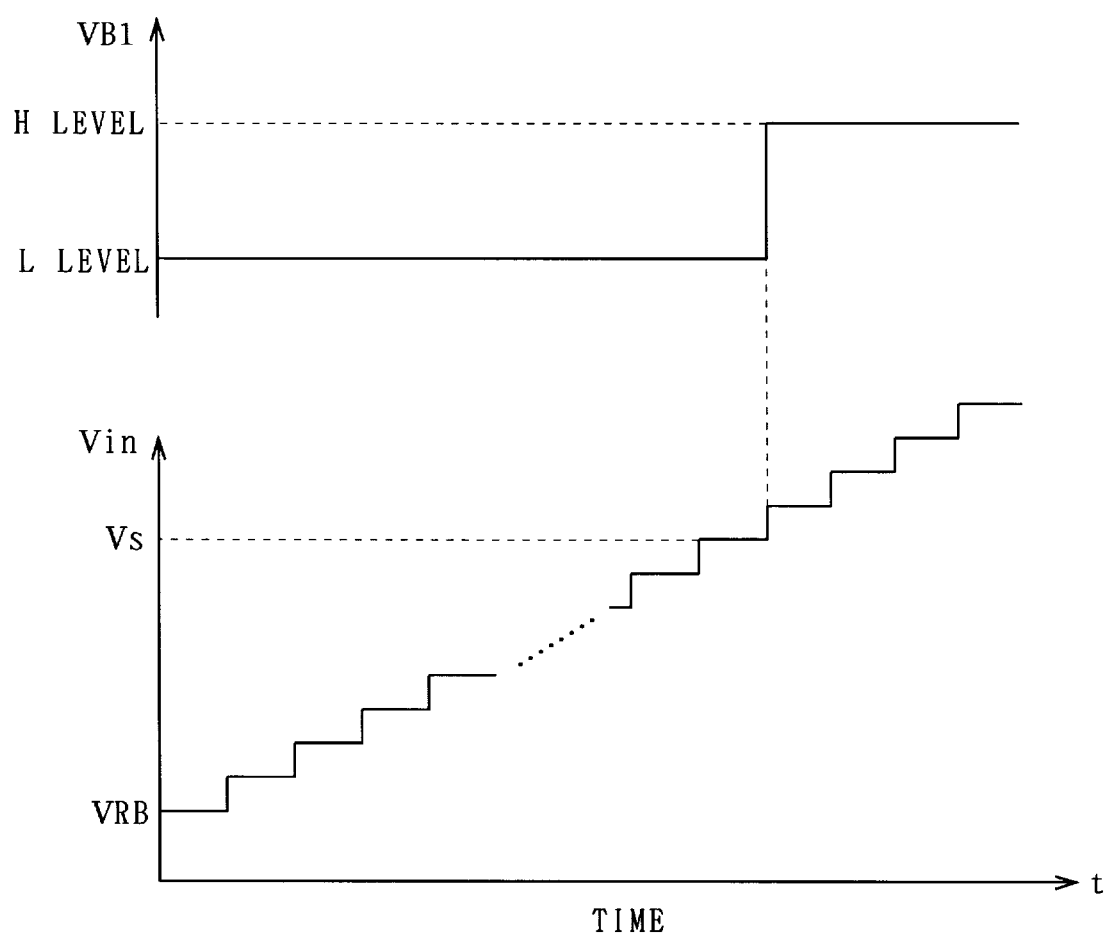
FIG. 23 is a graph illustrating measurement of a voltage Vs.

FIG. 23 is a graph illustrating the measurement of the voltage Vs. First, the switch S11 is closed and the switch S12 is open, while the voltage measurer 55 is connected to the least significant bit output terminal 56. A staircase waveform increased from the potential VRB in fine steps sufficiently smaller than a voltage corresponding to the LSB is set as the analog input voltage Vin, and the least significant bit output terminal 56 is monitored by the voltage measurer 55. An analog input voltage Vin at a time when a voltage VB1 at the least significant bit output terminal 56 shifts from "L" to "H" is measured as the voltage Vs.

At the step SP16, an analog input voltage Vin corresponding to a boundary between states where the A-D converter cell is overflown and the output code reaches the full scale ($2^{10}-1=1023$ in this case) is measured as a voltage Ve. Namely, the logic circuit 26 measures a voltage which the analog input voltage Vin exceeds for the overflow OFW to be activated (transition from "L" to "H").

Figure 24:
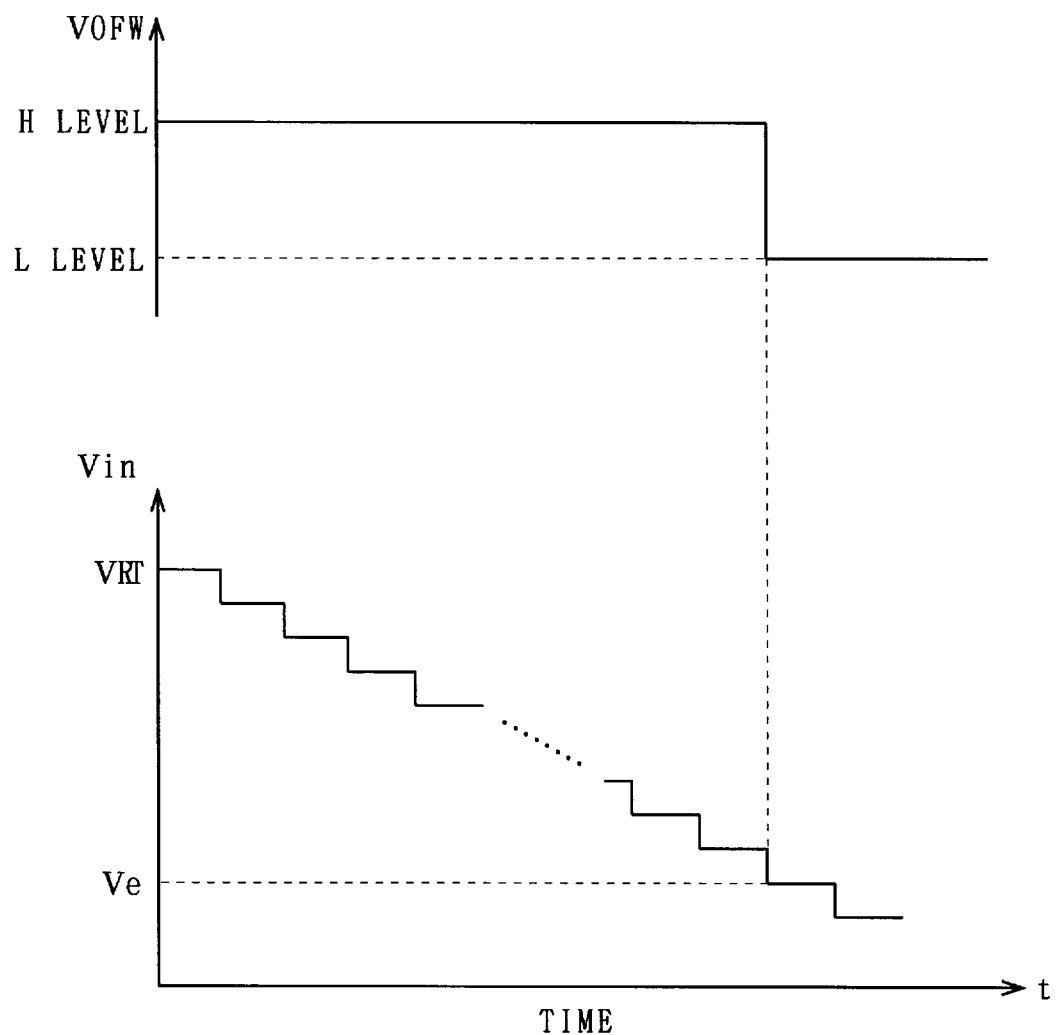
FIG. 24 is a graph illustrating measurement of a voltage Ve.

FIG. 24 is a graph showing the measurement of the voltage Ve. First, the switch S11 is open and the switch S12 is closed, while the voltage measurer 55 is connected to the overflow terminal 57. A staircase waveform reduced from the potential VRT in fine steps sufficiently smaller than the voltage corresponding to the LSB is set as the analog input voltage Vin, and the overflow terminal 57 is monitored by the voltage measurer 55. An analog input voltage Ve at a time when a voltage VOFW of the overflow terminal 57 is changed from "H" to "L" is measured. The measurement of the voltages Vs and Ve can be implemented by monitoring the analog input voltage Vin outputted by an analog source 17 and the measurement result of the voltage measurer 55 by a computer 20 (FIG. 20).

After the steps SP15 and SP16 are executed, ideal minimum resolution 1 $V_{LSB}$ of the A-D converter cell 103 is correctly operated at a step SP17. Namely, the minimum resolution 1 $V_{LSB}$ is obtained through the voltages Vs and Ve obtained at the steps SP15 and SP16 as follows:

$$1V_{LSB}=(Ve-Vs)/(2^{10}-1) \tag{1}$$

Such calculation can be executed in the computer 20.

Figure 25:
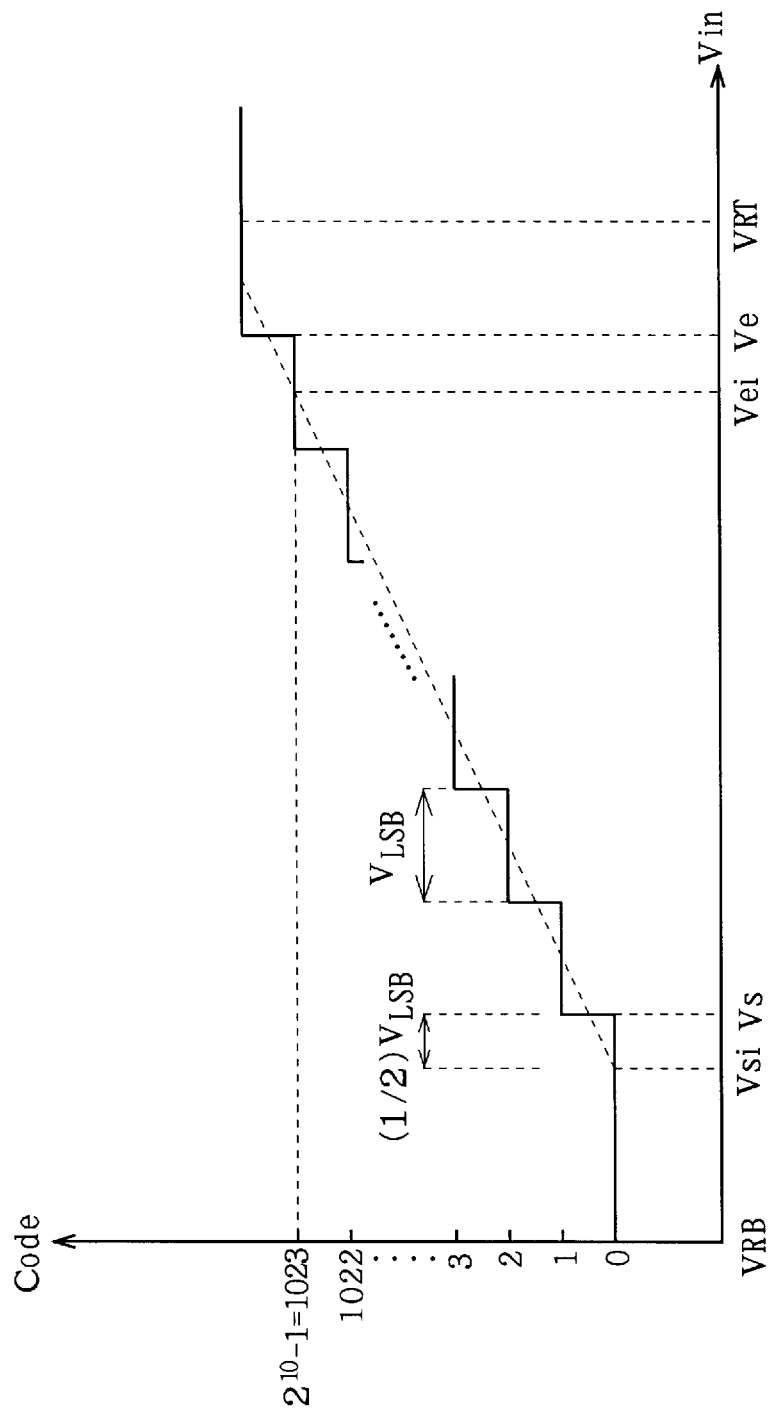
FIG. 25 is a graph illustrating calculation of voltages Vsi and Vei.

Voltages Vsi and Vei are calculated at steps SP18 and SP19 respectively. FIG. 25 is a graph illustrating the calculation of the voltages Vsi and Vei. The voltage Vsi is a value of the analog input voltage Vin forming a starting point of an ideal straight line (hereinafter referred to as "ideal A/D conversion line") indicating A-D conversion characteristics obtained on the assumption that the A-D converter 103 includes absolutely no quantization error. The voltage Vei is a value of the analog input voltage Vin forming an end point of the ideal A-D conversion line.

The voltages Vsi and Vei are obtained as follows:

$$Vsi=Vs-\tfrac{1}{2}V_{LSB}, \quad Vei=Ve-\tfrac{1}{2}V_{LSB} \tag{2}$$

Currents Is and Ie are also measured at the steps SP18 and SP19 respectively. The currents Is and Ie are values of the analog source current Idd measured by the current measurer 22 by inputting the voltages Vsi and Vei in the analog voltage input terminal 5 as the analog input voltage Vin respectively.

Figure 26:
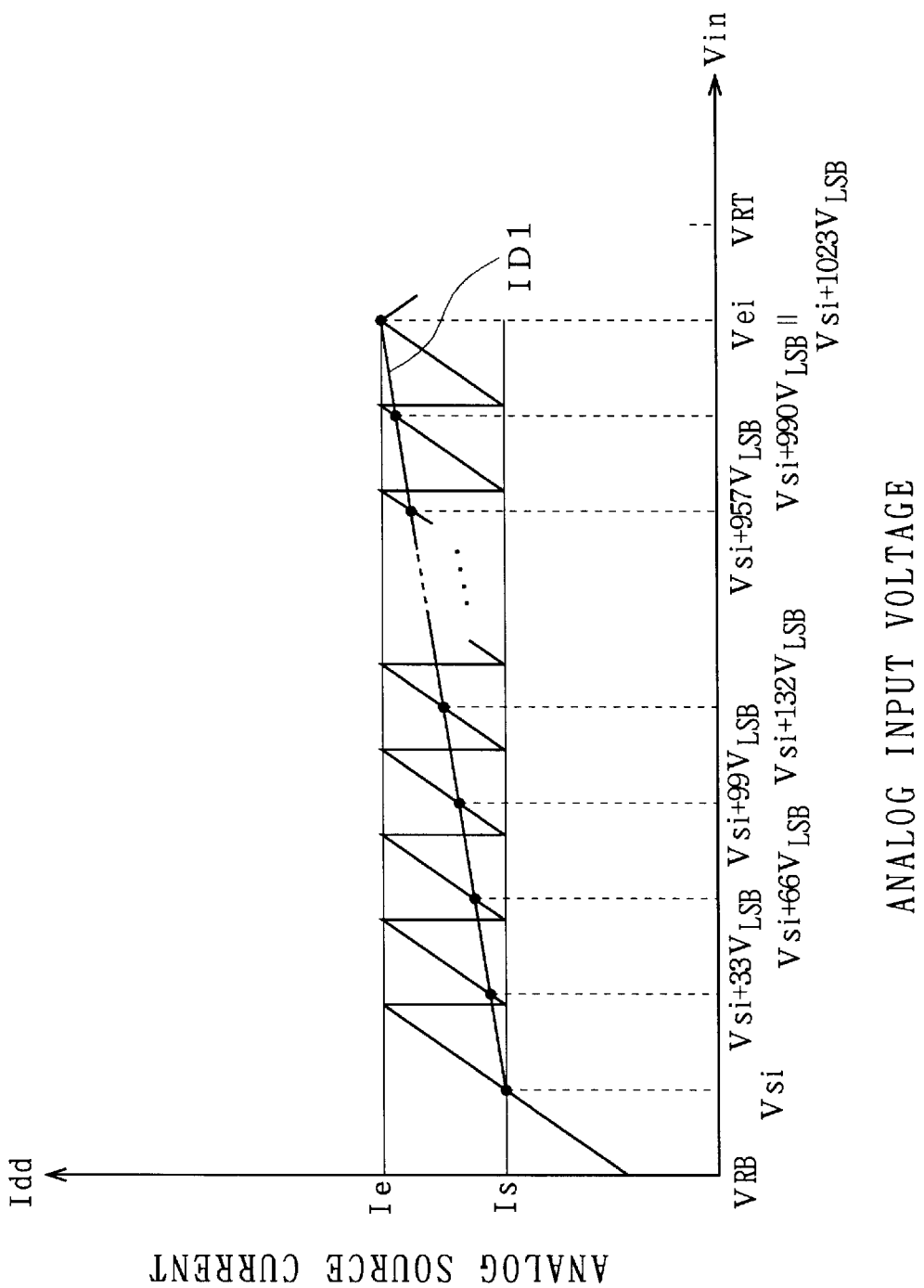
FIG. 26 is a graph showing an ideal current line.

FIG. 26 is a graph illustrating an ideal current line corresponding to the ideal A-D conversion line superposed on a source current waveform corresponding to the normal operation shown in FIG. 8. Values of the analog voltage Vin and the analog source current Idd deciding the intersection of the source current waveform corresponding to the normal operation and the ideal current line are previously calculated, so that nondefectiveness/defectiveness can be determined depending on whether or not the source current waveform to be determined passes through a portion close to the intersection.

According to this embodiment, a single intersection is selected in response to each upper bit. As shown by each black point in FIG. 26, this intersection is selected in an equal voltage with resolution of a certain value in relation to the analog input voltage Vin. Namely, an increment at the time of stepwise increasing the analog input voltage Vin generated by the analog source 17 is set at this resolution.

After the steps SP18 and SP19 are executed, the resolution of the analog input voltage Vin is set at a step SP20. The following relation is obtained from the expressions (1) and (2):

$$Vei = Vsi + 1023 V_{LSB} \qquad (3)$$

Vsi is employed as the value of the analog input voltage Vin when the value of the upper (coarse) bit is "0", while Vei is employed in case of "31". Therefore, a voltage obtained by dividing the voltage of 1023 $V_{LSB}$ by a value "31" smaller than the number which can be taken by the upper (coarse) bit by 1, i.e., $(2^{10}-1)/(2^5-1)V_{LSB}=(2^5+1)V_{LSB}=33\ V_{LSB}$ is employed as the resolution of the analog input voltage Vin.

FIG. 27 is a correspondence diagram showing the relation between the values of the analog input voltage Vin stepwise increased in the aforementioned resolution and the values of the upper (coarse) and lower (fine) bits. An (i−1)-th value of the analog input value Vin from the minimum value (this is equal to the voltage Vsi) corresponds to a value i taken by each upper (coarse) bit, and Vin=Vsi+(i×m+j)$V_{LSB}$. Symbol m represents the number of divisional blocks of the ladder resistance, i.e., the number of values which can be taken by the upper (coarse) bits. The number m is set at 32 in this case. The aforementioned resolution can be implemented by taking the value j of each lower (fine) bit equally to the value i. In other words, it comes to that measurement of the analog source current Idd is performed for all of the values which can be taken by the upper (coarse) and lower (fine) bits by employing 33 $V_{LSB}$ as the aforementioned resolution.

At a step SP21, the analog source current Idd is measured while successively increasing the value of the analog input voltage Vin, similarly to the step SP8 of the embodiment 1. However, the value of the analog input voltage Vin is increased with the resolution set at the step SP20. Namely, voltages V 2 to V 31 are applied in 33 $V_{LSB}$ steps from Vsi+33 $V_{LSB}$ to Vsi+990 $V_{LSB}$ as shown in FIG. 27, and current values Id2 to Id31 are measured as the analog source currents Idd corresponding to the respective ones. However, it is not necessary to apply the analog input voltage Vin at values of V1=Vsi+0 $V_{LSB}$ and V32=Vsi+1023 $V_{LSB}$. This is because measurement of the analog source currents Idl=Is and Id32=Ie corresponding to the analog input voltage Vin is completed at the steps SP18 and SP19.

At a step SP22, an ideal current ID1 which is a value of the analog source current Idd in the ideal current line is obtained with Vei, Vsi, Ie and Is obtained at the steps SP18 and SP19 as follows:

$$ID1=(Ie-Is)/(Vei-Vsi)\times(Vin-Vsi)+Is$$

Such an ideal current ID1 is obtained in the computer 20 by calculation.

When the steps SP21 and SP22 are completed, the process advances to a step SP23, for determining nondefectiveness/defectiveness of the operation depending on whether or not an error of the analog source current Idr (r=2 to 31) measured at the step SP21 and the ideal current ID1 are within a prescribed range. Such determination can also be implemented in the computer 20.

Figure 28:
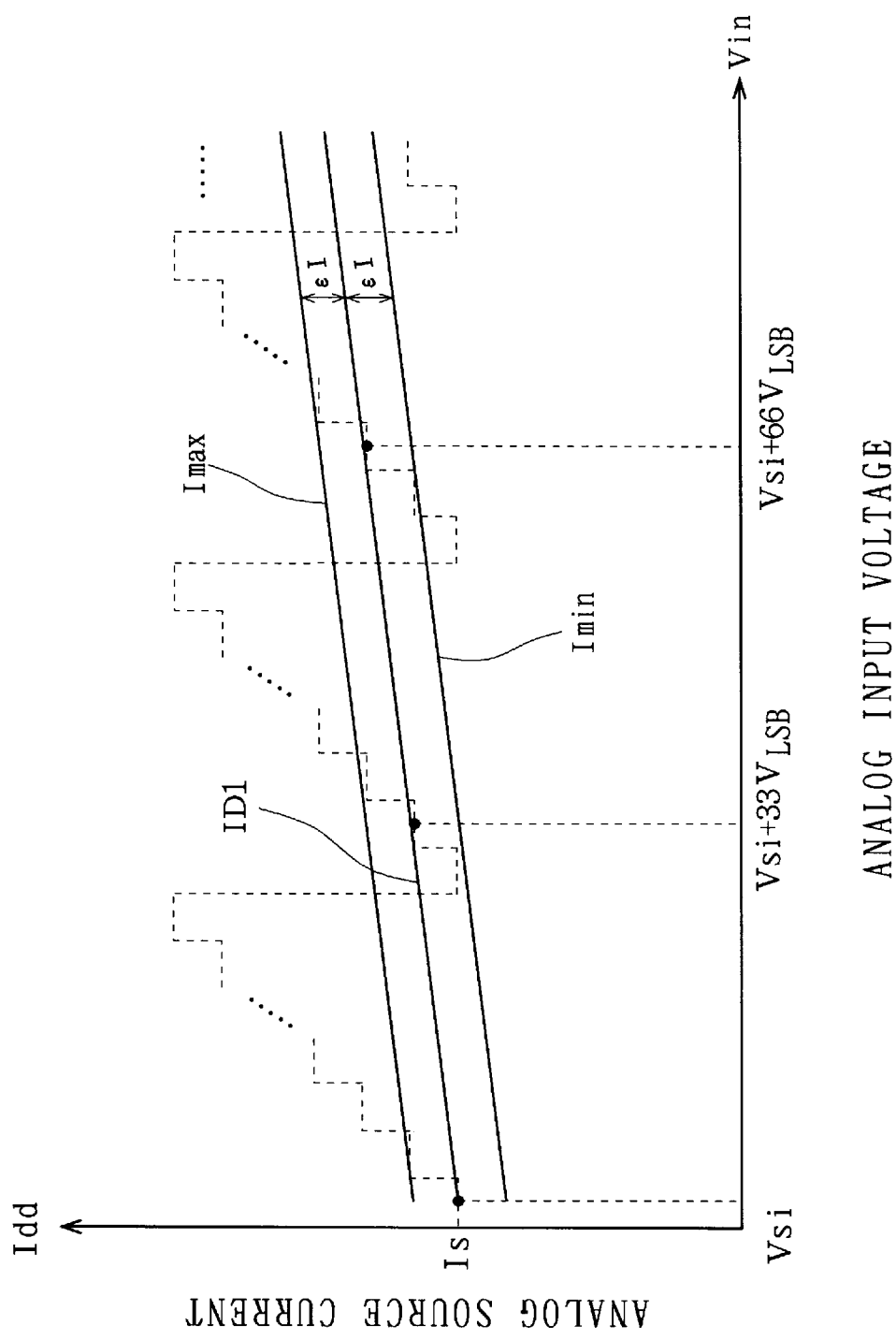
FIG. 28 is a graph illustrating determination of nondefectiveness/defectiveness of operations.

FIG. 28 is a graph illustrating the operation at the step SP23. Similarly to the embodiment 1, the magnitude of the error is preferably set at the current quantity for one code (LSB) which is the unit of change of the digital output. Namely, the error is set at ∈I=(Vei−Vsi)/31. Alternatively, the same can be set at a smaller value ∈I=(Vei−Vsi)/31/2, for example.

Standard values Imax and Imin are introduced as follows:

$$Imax=(Ie-Is)/(Vei-Vsi)\times(Vin-Vsi)+Is+\epsilon I$$

$$Imin=(Ie-Is)/(Vei-Vsi)\times(Vin-Vsi)+Is-\epsilon I$$

The operation is determined as normal if the analog source current Idr satisfies Imr≦Idr≦IMr as to all r with respect to values IMr and Imr taken by the standard values Imax and Imin when a voltage Vr (r=2, 3, . . . , 31) is employed as the analog voltage Vin, while the operation is determined as abnormal in other case.

The current measurement at the steps SP18, SP19 and SP21 must be performed in synchronization with lower (fine) bit comparison, similarly to the embodiment 1.

According to the aforementioned method, the functional test of the A-D converter cell is enabled only by providing a small number of external test terminals including the least significant bit output terminal 56 and the overflow terminal 57, and chip and package sizes are reduced due to reduction of the external test terminals for a semiconductor device, whereby the fabrication cost is reduced.

Further, the resolution of the analog input voltage Vin is set at 33 $V_{LSB}$, whereby all of values which can be taken by the upper and lower bits of the A-D converter cell can be efficiently checked. In case of a 10-bit A-D converter cell consisting of upper (coarse) five bits and lower (fine) five bits, therefore, the functional test can be effectively executed at a higher speed (in a shorter time) by about (1024×R)/32 times as compared with the embodiment 1.

Embodiment 4

Figure 29:
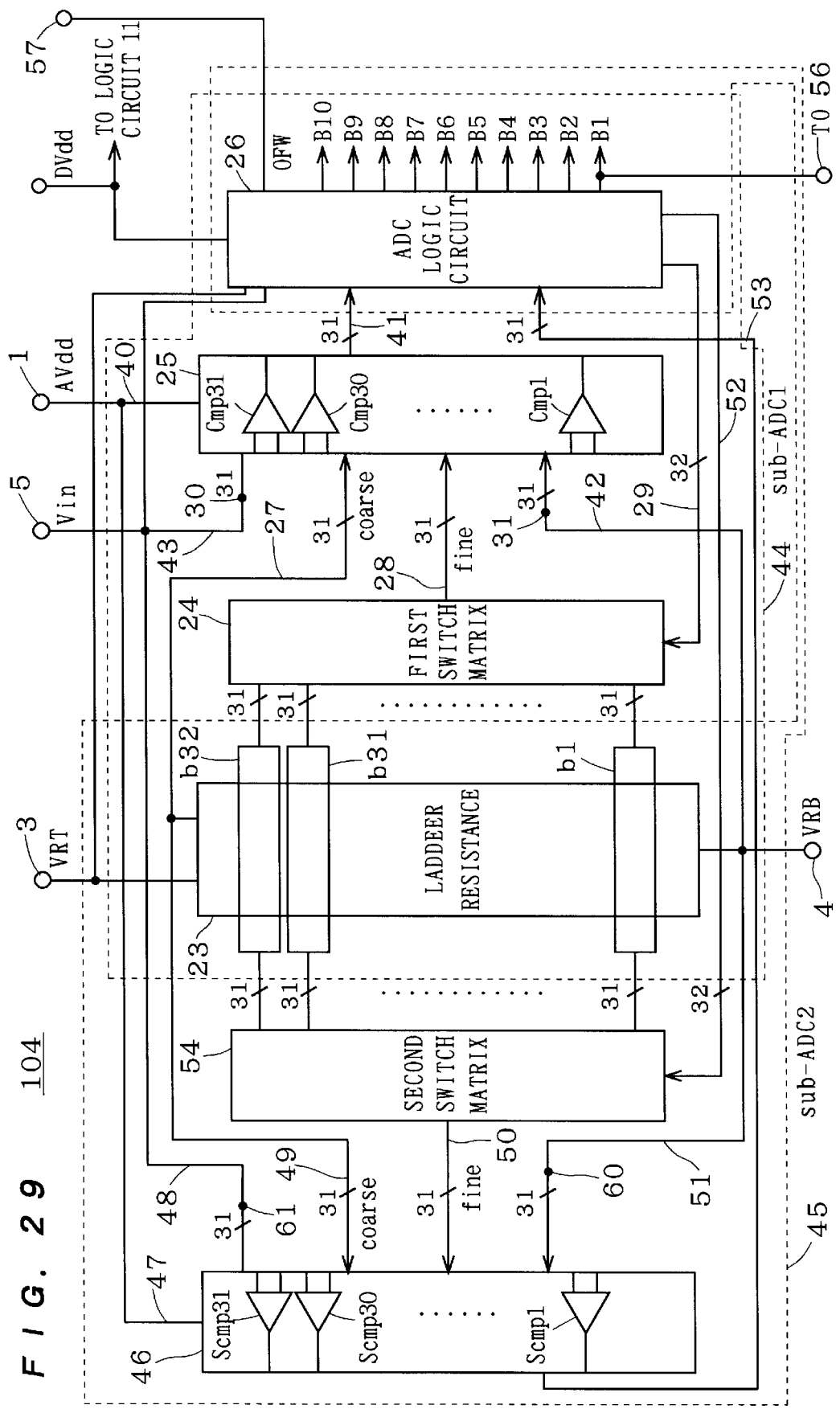
FIG. 29 is a block diagram showing the structure of an A-D converter cell 104 according to an embodiment 4 of the present invention.

FIG. 29 is a block diagram showing the structure of an A-D converter cell 104 according to an embodiment 4 of the present invention. The A-D converter cell 104 is substituted for the A-D converter cell 103 shown in FIG. 20. The A-D converter cell 104 is different from the A-D converter cell 102 in a point that an overflow OFW is outputted when an analog input voltage Vin exceeds the full scale of A-D conversion. Namely, the difference resides in that a potential VRT and the analog input voltage Vin are further supplied to a logic circuit 26, that the logic circuit 26 also outputs the overflow OFW and supplies the same to an overflow terminal 57, and that the same supplies an output code B1 which is the LSB to a least significant output terminal 56.

Thus, the A-D converter cell 104 having 10-bit A-D converter subcells 44 and 45 operating in interleaved schemes can also determine nondefectiveness/defectiveness of operations along the processing shown in FIG. 22, similarly to the embodiment 3.

Figure 30:
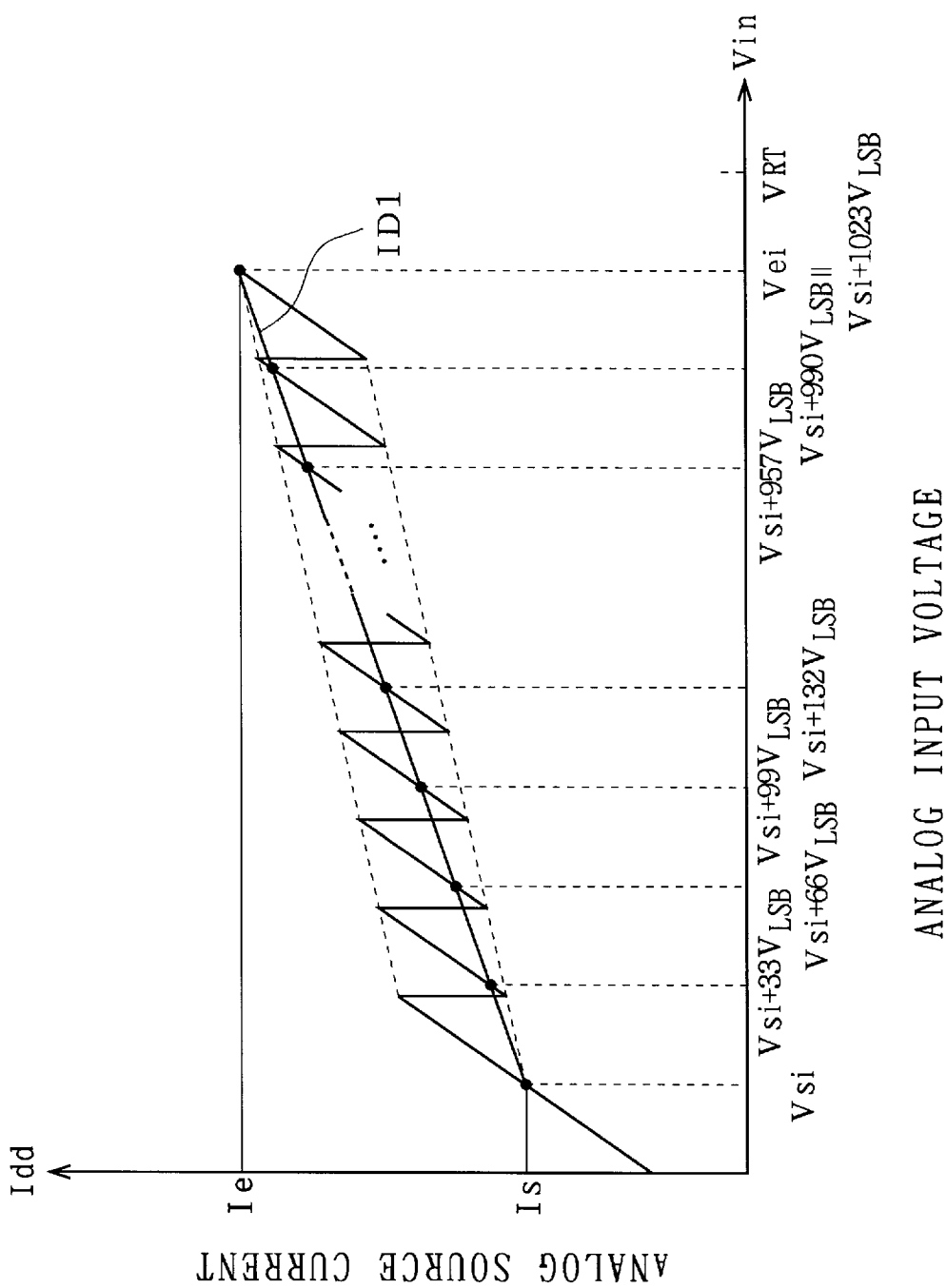
FIG. 30 is a graph showing an ideal current line.

FIG. 30, corresponding to FIG. 26, is a graph illustrating an ideal current line corresponding to an ideal A-D conversion line superposed on the source current waveform, shown in FIG. 12, corresponding to a normal operation. Due to the interleave structures of the A-D converter subcells 44 and 45, an analog source current Idd is a value obtained by adding up currents supplied to comparator arrays 25 and 46, similarly to the embodiment 2. This current may not be measured in synchronization with the lower (fine) bit comparison.

While inclination of the ideal current line corresponding to the ideal A-D conversion line shown in FIG. 30 is doubled as compared with the ideal current line corresponding to the ideal A-D conversion line shown in FIG. 26, values of the analog voltage Vin and the analog source current Idd deciding the intersection of the source current waveform corresponding to the normal operation and the ideal current line are previously calculated, so that nondefectiveness/defectiveness can be determined depending on whether or not the source current waveform to be determined passes through a portion close to the intersection, similarly to the processing shown in the embodiment 3.

FIG. 31, corresponding to FIG. 28, is a graph illustrating an operation at a step SP23. The operation is determined as normal if the analog source current Idr satisfies Imr≦Idr≦IMr as to all r with respect to values IMr and Imr taken by standard values Imax and Imin when a voltage Vr (r=2, 3, . . . , 31) is employed as the analog voltage Vin, while the operation is determined as abnormal in other case.

In case of a 10-bit A-D converter cell consisting of upper (coarse) five bits and lower (fine) five bits, the functional test can be effectively executed at a higher speed (in a shorter time) by about (1024×R)/32 times as compared with the embodiment 2, similarly to the embodiment 3.

Embodiment 5

In relation to an embodiment 5 of the present invention, a method of executing a static linearity test of an A-D converter cell of an analog-digital combinational LSI storing the A-D converter cell is described. This method is executed in the structure employed in the embodiment 3. Namely, the test is made on the A-D converter cell 103.

Figure 32:
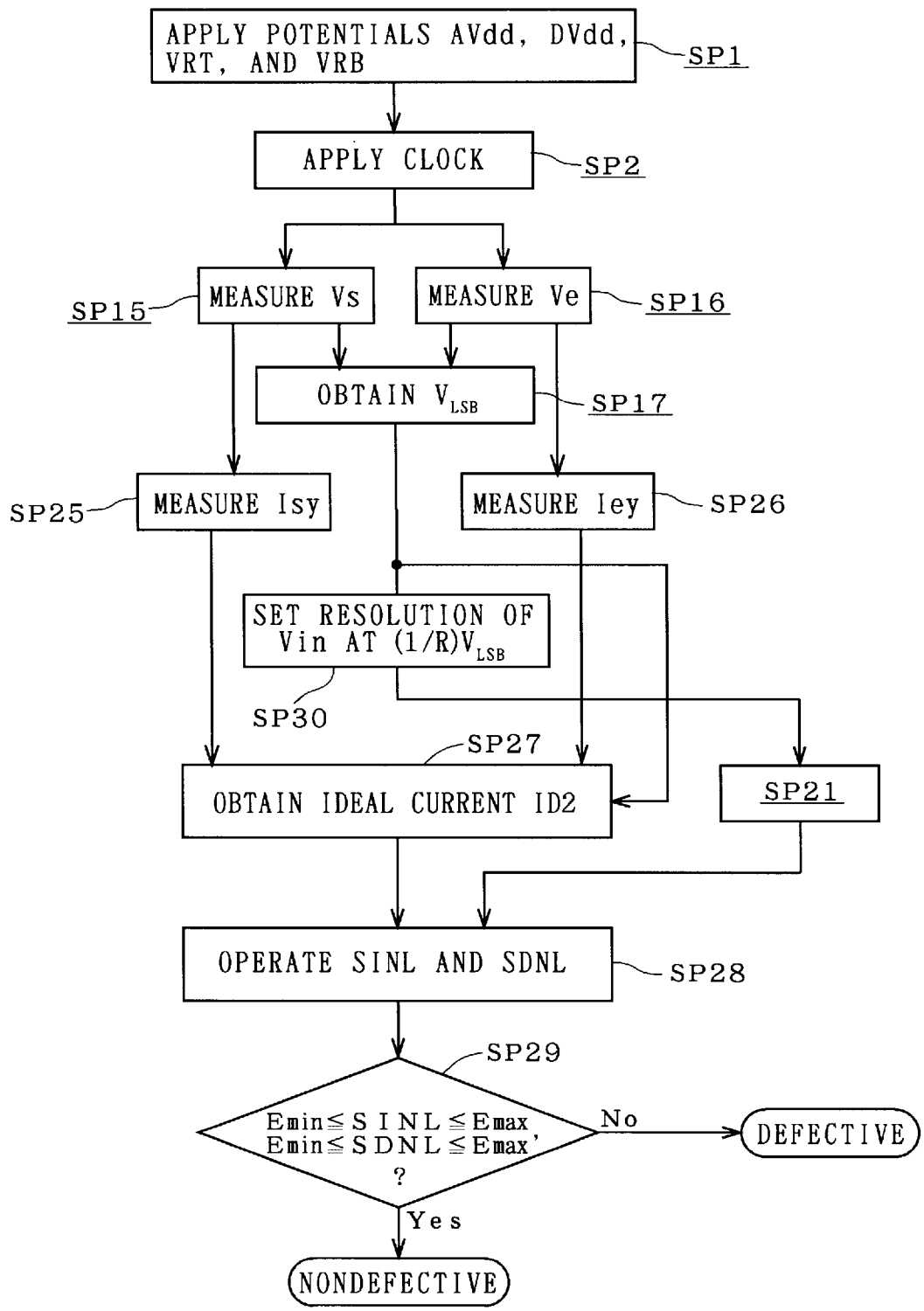
FIG. 32 is a flow chart illustrating a method of a functional test according to an embodiment 5 of the present invention.

FIG. 32 is a flow chart illustrating the method of the functional test according to the embodiment 5. The steps SP18, SP19, SP20 and SP22 in FIG. 22 are replaced with steps SP25, SP26, SP30 and SP27 respectively, while the step SP23 is replaced with steps SP28 and SP29.

Voltages Vs and Ve are obtained at steps SP15 and SP16 in similar manners to FIGS. 23 and 24 respectively, and thereafter a voltage $V_{LSB}$ is obtained at a step SP17 in a similar manner to FIG. 25.

A value Isy of an analog source current Idd in case of applying the voltage Vs as the analog input voltage Vin is measured at the step SP25 after completion of the step SP15 while a value Iey of the analog source current Idd in case of applying the voltage Ve as the analog input voltage Vin is measured at the step SP26 after completion of the step SP16 by the current measurer 22 such as a multimeter respectively.

After completion of the step SP17, the resolution of the analog input voltage Vin is set at the step SP30, similarly to the step SP20. However, the resolution is set at $(1/R)V_{LSB}$, dissimilarly to the step SP20. The value R is dependent on the specification similarly to the embodiment 1, and set at 5, for example.

At the step SP21, $2^{10} \times R$ stepwise analog input voltages Vin having the resolution of $(1/R)V_{LSB}$ are supplied from the analog source 17 to the analog input voltage terminal 5. The analog source current Idd flowing in correspondence thereto is measured. However, this measurement must be performed in synchronization with lower (fine) bit comparison, similarly to the embodiments 1 and 3.

At a step SP27, a source current in ideal A-D conversion characteristics is obtained similarly to the step SP22. However, it is not assumed that there is no quantization error dissimilarly to the step SP22, but a stepwise ideal current ID2 with presence of a quantization error is obtained at the step SP27. In the concrete, currents Iey and Isy are uniformly divided into 31 (this is smaller than the value $2^5$ which can be taken by the lower bits by 1) for obtaining an increment Ib.

It comes to that this value "31" corresponds to that obtained by dividing a changeable value of the analog input voltage Vin in each of a plurality of regions (hereinafter referred to as basic regions) where the analog source current Idd is monotonously increased in the range of the voltages Vs to Ve by the voltage $V_{LSB}$. Namely, the increment Ib is obtained by dividing the changeable value (Iey–Isy) of the analog source current Idd in the basic regions by the changeable value of the analog input voltage Vin and multiplying the result by the voltage $V_{LSB}$.

The voltages Ve and Vs are uniformly divided into 1023 (this is smaller than the value $2^{10}$ which can be taken by the digital output by 1) (i.e., divided every voltage $V_{LSB}$), for obtaining a waveform (hereinafter referred to as "ideal line") of an ideal current ID2 which is increased by the increment Ib every voltage $V_{LSB}$ to be stepwise changed as the analog input voltage Vin is increased and abruptly reduced every voltage 33 $V_{LSB}$ to take the current Isy. Calculation of the ideal current ID2 can be implemented in the computer 20.

Figure 33:
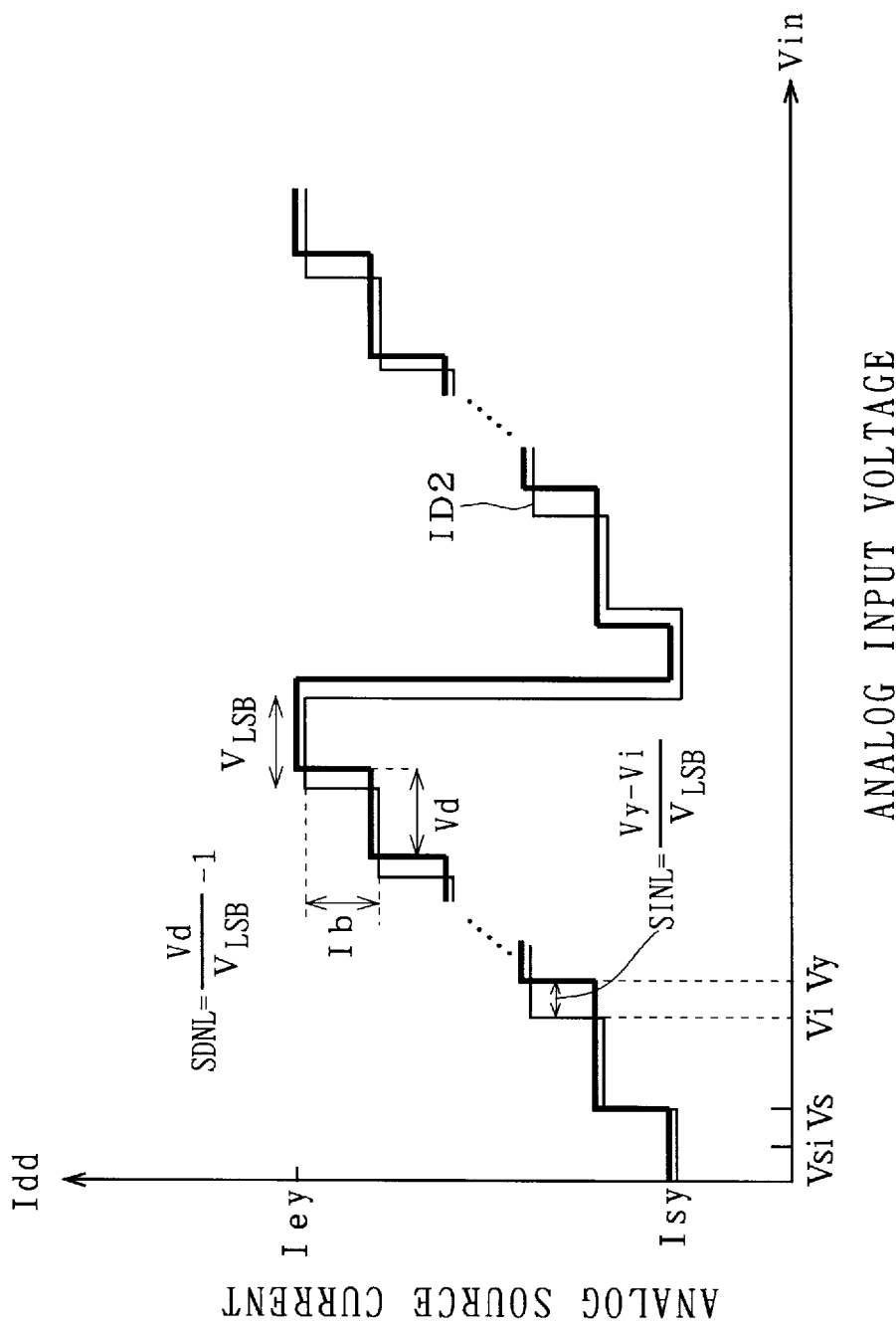
FIGS. 33 and 34 are graphs showing, static linearity.

After the steps SP21 and SP27 are executed, integral nonlinearity SINL and differential nonlinearity SDNL which are static linearity are obtained at a step SP28. FIG. 33 is a graph for illustrating the processing at the step SP28, in which thick and thin solid lines show actual and ideal lines obtained at the steps SP21 and SP27 respectively.

Assuming that Vy represents a value of the analog input voltage Vin corresponding a change point of the actual line and Vi represents a value of the analog input voltage Vin in a change point of the ideal line corresponding to the change point of the actual line (i.e., having the same change of the analog source current), the integral nonlinearity SINL is obtained as follows:

$$SINL = (Vy - Vi)V_{LSB}$$

This operation is executed in all change points.

Assuming that Vd represents the magnitude of a range (hereinafter referred to as "constant range") of the analog input voltage Vin wherein the analog source current Idd is constant in the actual line, the differential nonlinearity SDNL is obtained as follows:

$$SDNL = Vd/V_{LSB} - 1$$

This operation is executed in all constant ranges.

Both of the integral nonlinearity SINL and the differential nonlinearity SDNL preferably indicate that separation of the actual line with respect to the ideal line is small as the absolute values thereof are reduced. Thus, standard values Emin and Emax are set at a step SP29 so that a determination on nondefectiveness is made when Emin≦SINL≦Emax and Emin≦SDNL≦Emax are satisfied in all change points and all constant ranges, while a determination on defectiveness is made if not satisfied. If the standard values are set in the range of quantization errors of the A-D converter cell, for example, Emin and Emax can be set at $-½ V_{LSB}$ and $½ V_{LSB}$ respectively. These determinations and the operation can also be made in the computer 20.

According to the aforementioned method, a static linearity test of an A-D converter cell is enabled by simply providing a small number of, i.e., two external test terminals, whereby chip and package sizes are reduced due to reduction of the number of external test terminals for a semiconductor device, and the fabrication cost is reduced.

Embodiment 6

A static linearity test can be executed also on a 10-bit sub-ADC operating in an interleaved scheme, similarly to the embodiment 5. This test is executed in the structure employed in the embodiment 4. Namely, the A-D converter cell 104 is tested.

Figure 34:
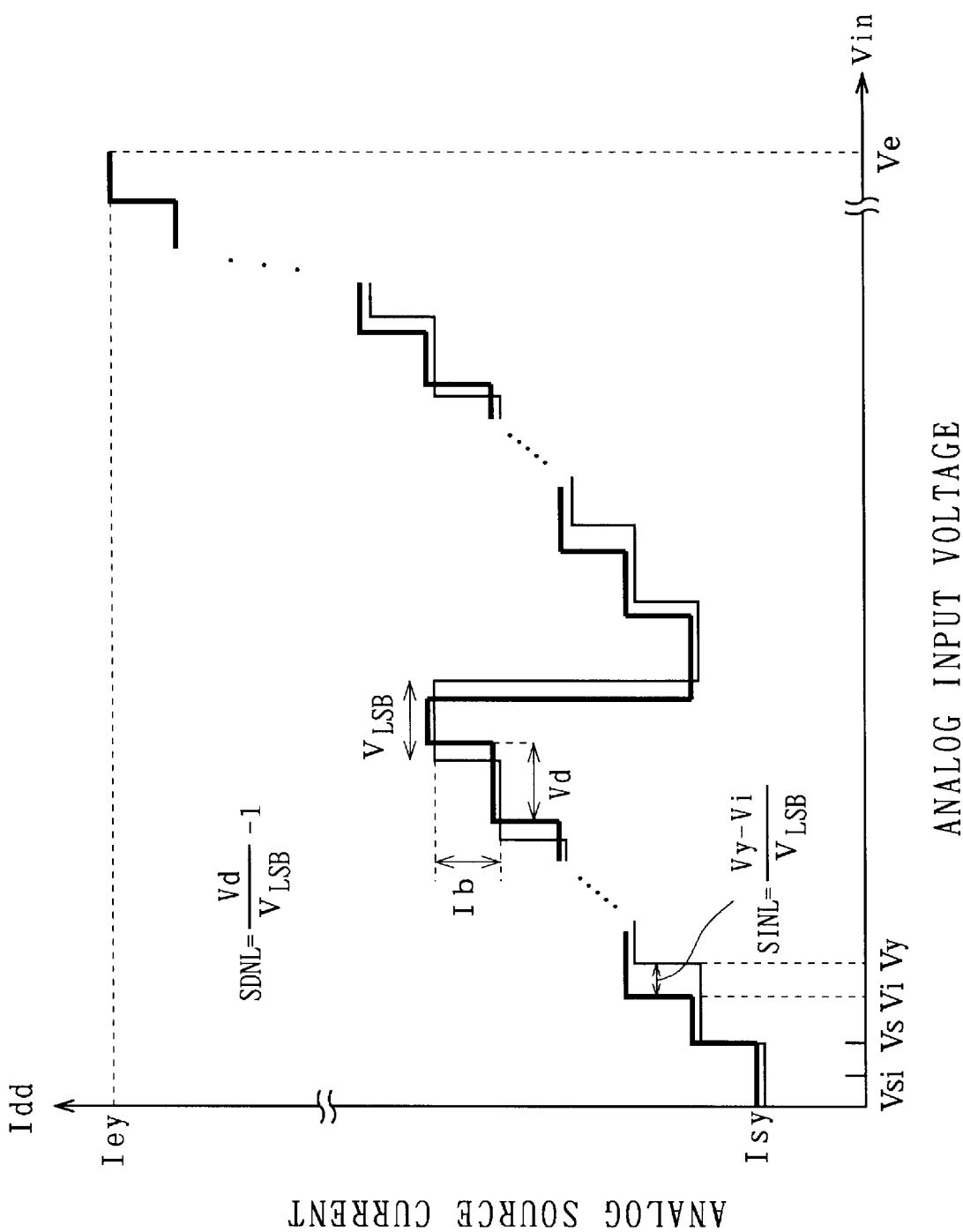

The processing of this test can be executed on the basis of the flow chart shown in FIG. 32. FIG. 34 is a graph for illustrating the processing at the step SP28, in which thick and thin solid lines show actual and ideal lines obtained at the steps SP21 and SP27 respectively.

Dissimilarly to the embodiment 5, however, an increment Ib of an ideal current ID2 in the embodiment 6 is obtained by uniformly dividing currents Iey and Isy into 63. In the A-D converter cell 104, one of the A-D converter subcells 44 and 45 performs lower bit comparison while the other one performs upper bit comparison, whereby the amount of the analog source current reduced following updating of the upper bits is smaller than that of the analog source current Idd increased when the lower bits are compared in correspondence to the same upper bits by the increment Ib. Namely, the analog source current Idd is increased by the increment Ib every time the upper bits are updated. Therefore, $31+2^5=63$ which is larger than that in the embodiment 5 by the number which can be taken by the upper bits is employed as a divisor.

No fault is present in the A-D characteristics in the ideal current ID2, whereby the increment Ib obtained in the aforementioned manner can be obtained also by dividing a changeable value of the analog source current by 31 in a region where the analog source current Idd is monotonously increased (at the time of comparison of the lower bits performed in relation to the same upper bits). It comes to that the value "31" corresponds to that obtained by dividing the changeable value of the analog input voltage Vin by the voltage $V_{LSB}$ in the basic region, similarly to the embodiment 5. Namely, it can be said that the increment Ib is a value obtained by dividing the changeable value (Iey–Isy) of the analog source current Idd in the basic region by the changeable value of the analog input voltage Vin and multiplying the result by the voltage $V_{LSB}$, similarly to embodiment 5.

Similarly to the embodiments 2 and 4, the analog source current Idd reaches a value obtained by adding up the currents supplied to the comparator arrays 25 and 46 of the A-D converter subcells 44 and 45, and it is not necessary to measure the current in synchronization with the comparison of the lower (fine) bits.

According to the aforementioned method, an effect similar to that of the embodiment 5 can be attained also as to an A-D converter operating in an interleaved scheme.

Embodiment 7

A static linearity test can be executed also on a flash 10-bit A-D converter cell, similarly to the embodiment 5.

FIG. 35 is a block diagram showing the structure of a flash 10-bit A-D converter cell 105. This A-D converter cell 105 can be substituted for the A-D converter cell 103 in FIG. 20.

As compared with the A-D converter cell 103, the A-D converter cell 105 generally has such a structure that the first switch matrix 24 is omitted and the converter array 25 is replaced with a converter array 62.

A ladder resistance 23 divides the voltage difference across potentials VRT and VRB and outputs 1023 reference voltages. The converter array 62 comprises comparators fcmpg (g=1 to 1023), and supplies 1023 results obtained by comparing single ones of the reference voltages with an analog input voltage Vin respectively to an ADC logic circuit 26.

The ADC logic circuit 26 supplies these results to a logic circuit 11 and an overflow terminal 57 as output codes B1 to B10 and an overflow OFW respectively.

Figure 36:
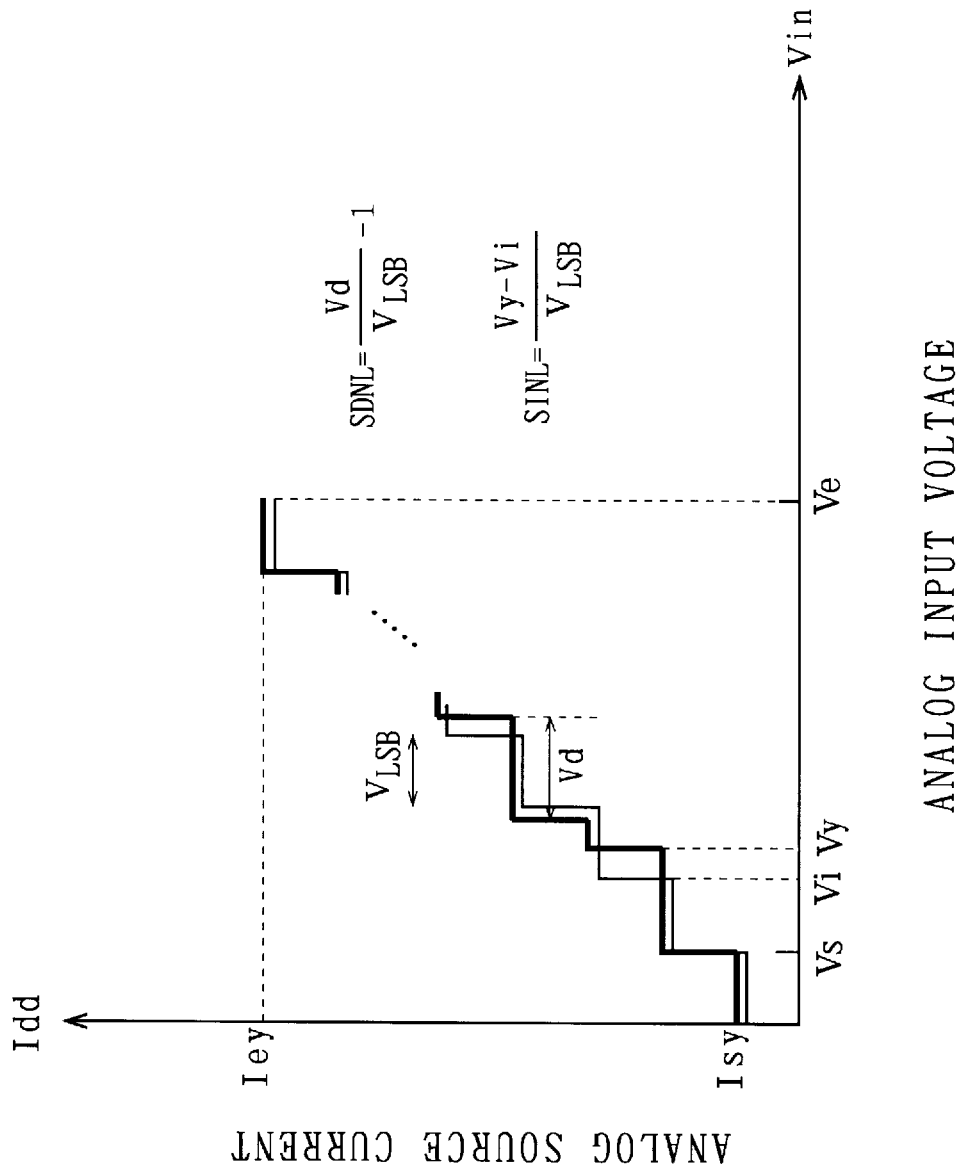
FIG. 36 is a graph showing static linearity.
Figure 37:
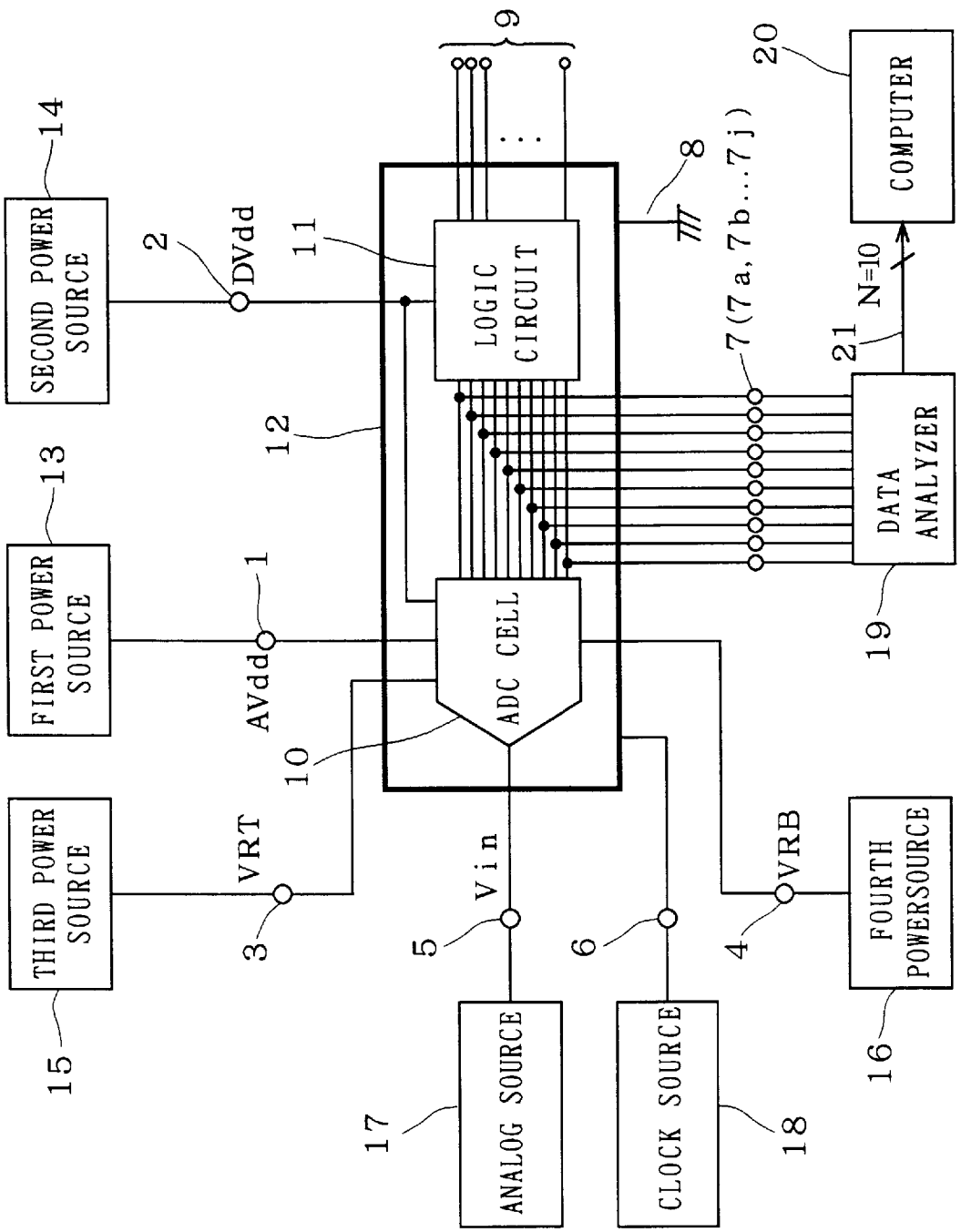
FIG. 37 is a block diagram illustrating the prior art.
Figure 38:
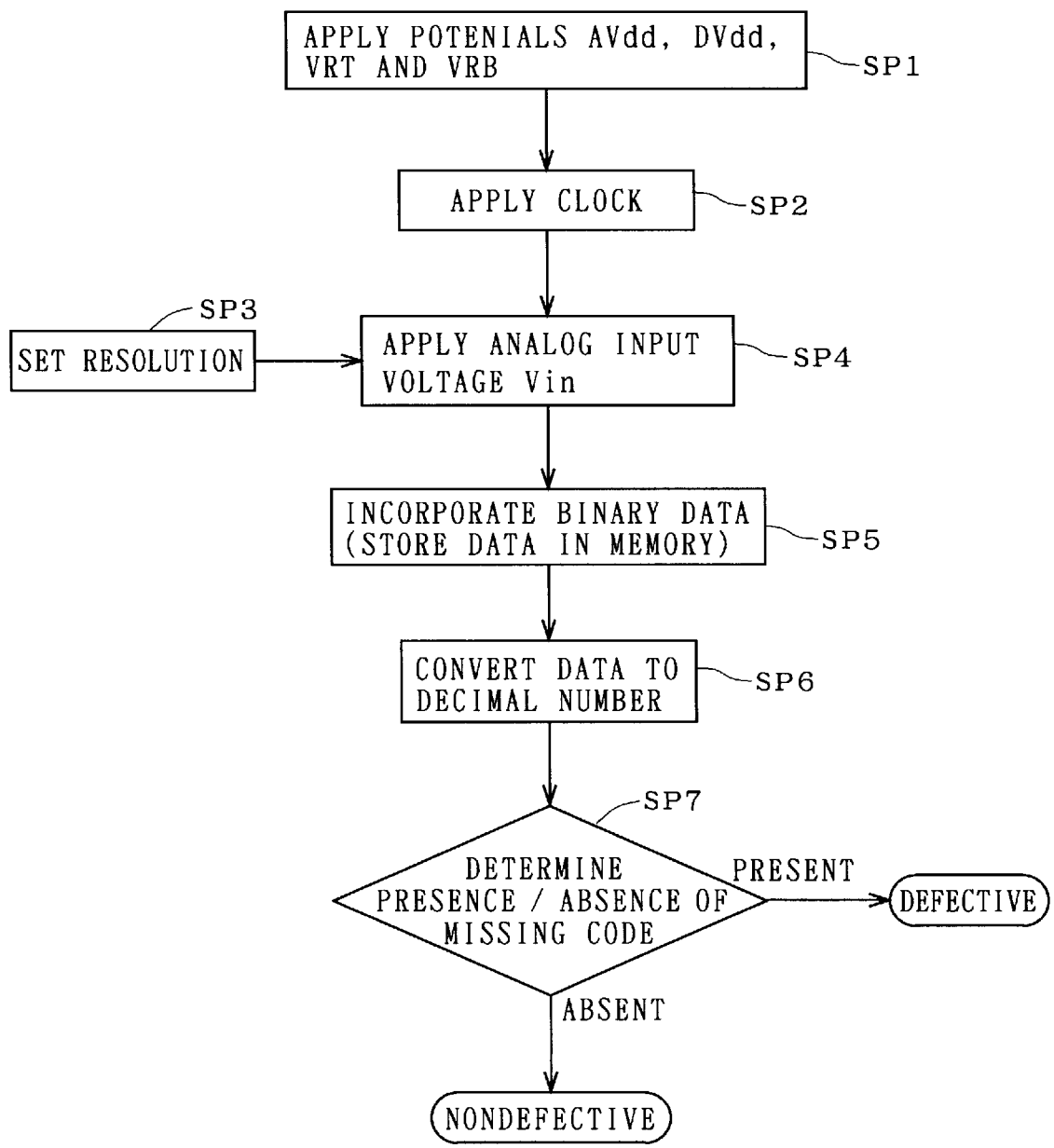
FIG. 38 is a flow chart showing a conventional functional test.
Figure 40:
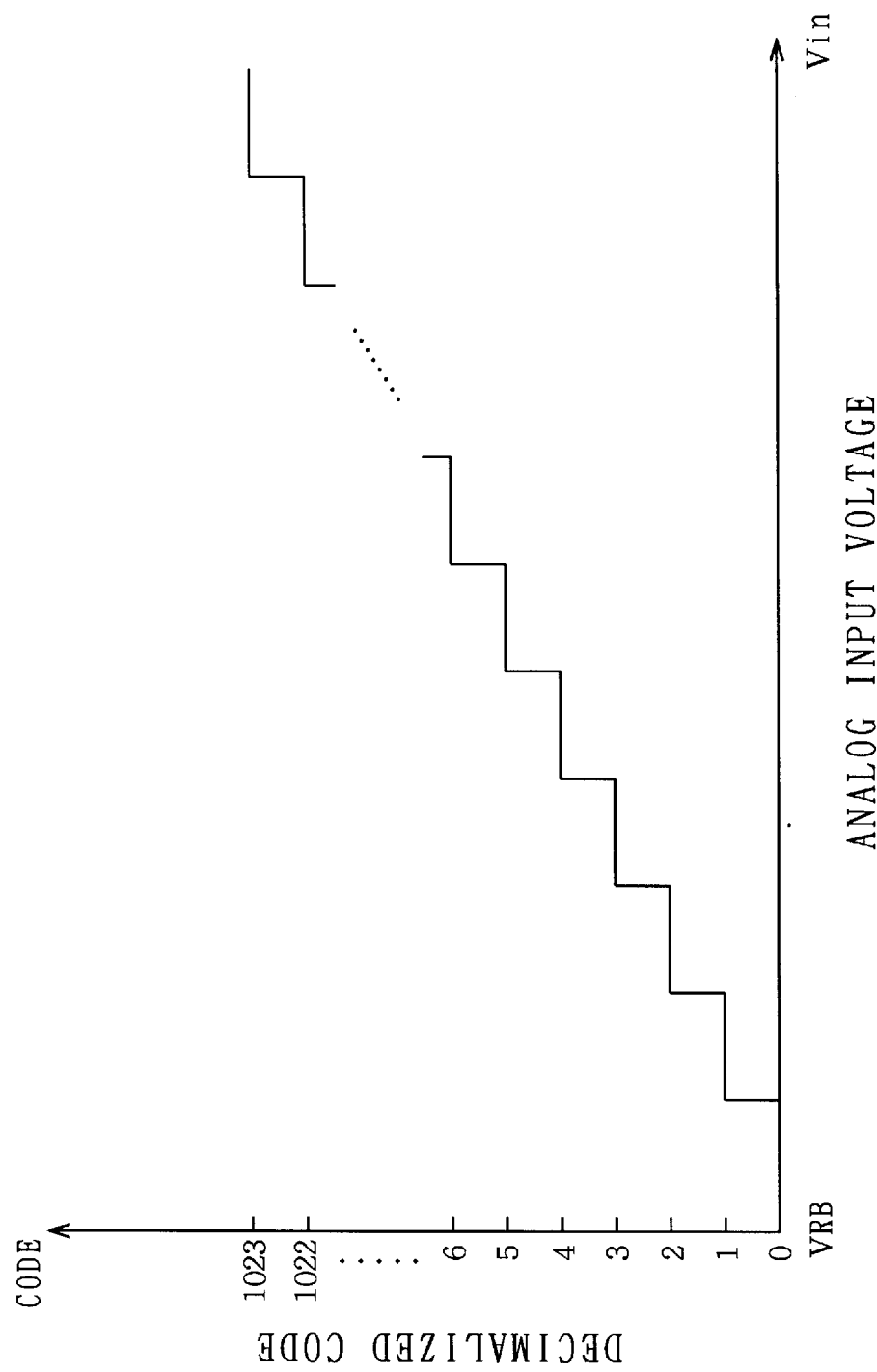
FIG. 40 is a graph showing the relation between a correct analog input voltage Vin and decimalized codes.
Figure 42:
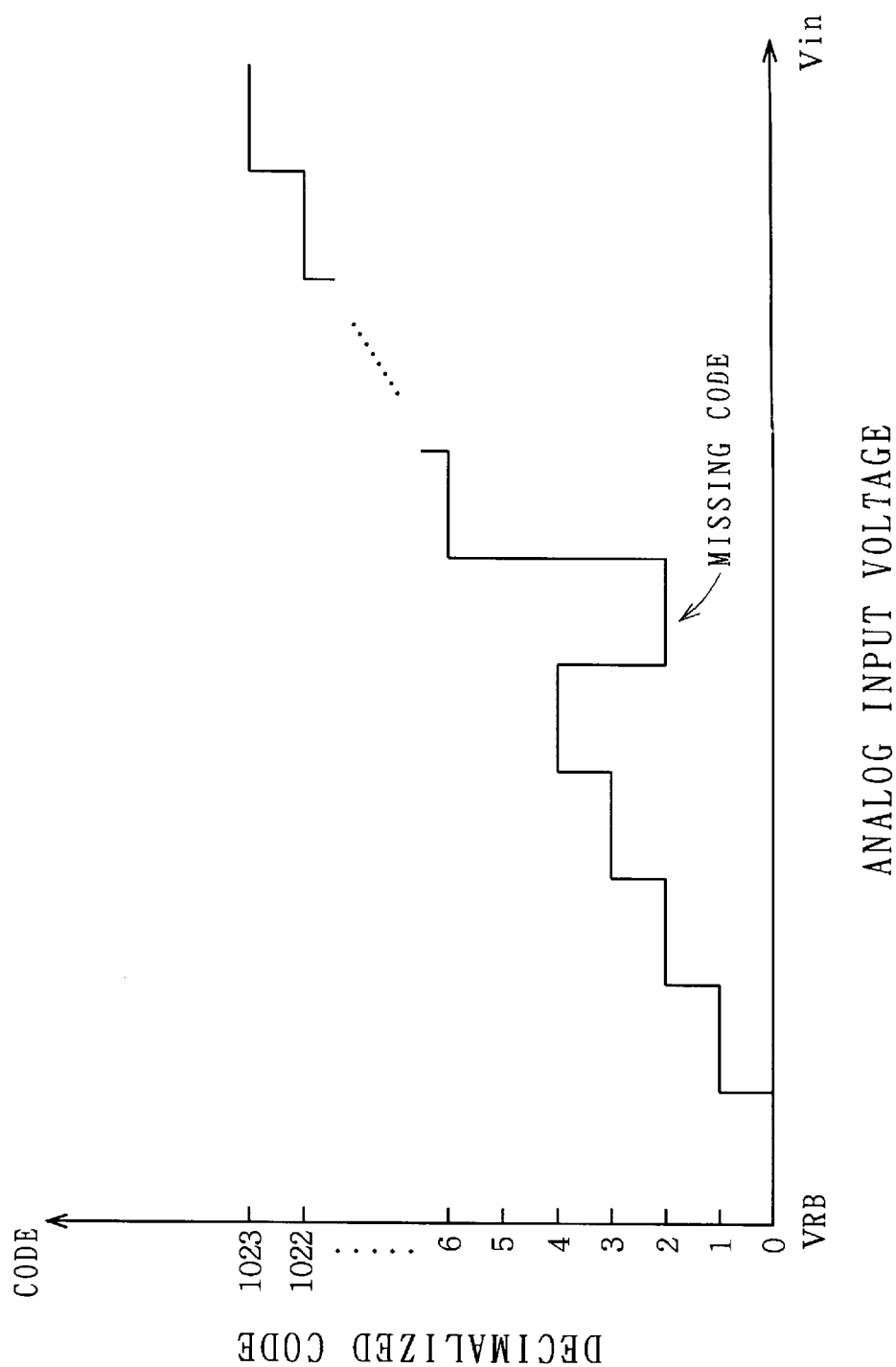

The static linearity test of the A-D converter cell 105 can also be executed on the basis of the flow chart shown in FIG. 32. FIG. 36 is a graph for illustrating the processing at the step SP28, in which thick and thin solid lines show actual and ideal lines obtained at the steps SP21 and SP27 respectively.

Dissimilarly to the embodiment 5, however, an increment Ib of an ideal current ID2 in the embodiment 7 is obtained by uniformly dividing currents Iey and Isy into 1023. The A-D converter cell 105 is of a flash type, whereby the analog source current Idd is monotonously increased and 1023 ($=2^{10}-1$) smaller than the number which can be taken by the output codes B1 to B10 by 1 is employed as a divisor.

A basic region extends along the overall ranges of voltages Vs to Ve in the embodiment 7, whereby it comes to that the value "1023" corresponds to that obtained by dividing the changeable value of the analog input voltage Vin in the basic region by the voltage $V_{LSB}$. Namely, it can be said that the increment Ib is a value obtained by dividing the changeable value (Iey–Isy) of the analog source current Idd in the basic region by the changeable value of the analog input voltage Vin and multiplying the result by the voltage $V_{LSB}$, similarly to the embodiments 5 and 6.

According to the aforementioned method, an effect similar to that of the embodiment 5 can be attained also as to a flash A-D converter.

While the invention has been shown and described in detail, the foregoing description is in all aspects illustrative and not restrictive. It is therefore understood that numerous modifications and variations can be devised without departing from the scope of the invention.

What is claimed is:

1. A method of testing a subranging A-D converter, said subranging A-D converter having a plurality of upper reference voltages, a plurality of lower reference voltage groups each consisting of a plurality of lower reference voltages, and a first comparator array including a plurality of comparators, deciding an upper bit of a digital output on the basis of comparison between said plurality of upper reference voltages and an analog input in said plurality of comparators, selecting one of said plurality of lower reference voltage groups on the basis of said upper bit while deciding a lower bit by comparing said plurality of lower reference voltages belonging to said one of said plurality of lower reference voltage groups with said analog input; and A-D converting of said analog input to a digital output consisting of said upper and lower bits with predetermined resolution;

said method comprising steps of:

(a) supplying an analog signal being changed at an amount of change being smaller than said resolution;

(b) measuring the relation between said analog signal and a current flowing at least to said first comparator array at the time of comparing said analog input with said plurality of lower reference voltages for obtaining a current waveform;

(c) obtaining the number of points taking extreme values in said current waveform; and (d) determining nondefectiveness/defectiveness of said subranging A-D converter on the basis of whether or not said number is a prescribed number.

2. The method of testing a subranging A-D converter in accordance with claim 1, wherein said subranging A-D converter further has a second comparator array including a plurality of comparators, wherein said first and second comparator arrays operate in interleave manner a relation between said analog signal and the sum of currents flowing to said first and second comparator arrays at a time of comparing said analog input with said plurality of lower reference voltages is measured in said step of measuring for obtaining said current waveform.

3. The method of testing a subranging A-D converter in accordance with claim 2, further comprising steps of:
  (e) obtaining maximum values excluding that corresponding to minimum said analog signal among said extreme values and minimum values being adjacently paired with said maximum values,
  (f) obtaining a first current difference being a difference between said maximum and minimum values every said pair and obtaining maximum said first current difference by comparing said first current differences with each other between said pairs,
  (g) dividing said maximum first current difference by a value being smaller than said lower bit-power of 2 by 1 for obtaining a second current difference, and
  (h) determining nondefectiveness/defectiveness of said subranging A-D converter on basis of whether or not first and second conditions are satisfied, wherein
    said first condition is that an absolute value of a value obtained by subtracting said second current difference from a value obtained by subtracting a value of first said maximum value corresponding to first value of said analog signal from a value of second said maximum value which is adjacent to said first said maximum value corresponding to second value of said analog signal is within a range of said second current difference, said second value being larger than said first value, and
    said second condition is that an absolute value of a value obtained by subtracting said second current difference from a value obtained by subtracting a value of first said minimum value corresponding to third value of said analog signal from a value of second said minimum value which is adjacent to said first said minimum value corresponding to fourth value of said analog signal is within said range of said second current difference, said fourth value being larger than said third value.

4. The method of testing a subranging A-D converter in accordance with claim 3, wherein
  said analog is changed at least over a range where said A-D converter can perform said A-D conversion in said step of supplying said analog signal,
  maximum and minimum values are employed as said extreme values in said step of obtaining the number of points; and
  a number of said plurality of comparators and a number being smaller than that of said plurality of comparators by 1 are employed as said prescribed numbers for said maximum and minimum values respectively in said step of determining nondefectiveness/defectiveness of said subranging A-D converter.

5. The method of testing a subranging A-D converter in accordance with claim 1, wherein
  said analog signal is changed at least over a range where said A-D converter can perform said A-D conversion in said step of supplying said analog signal,
  maximum values are employed as said extreme values in said step of obtaining the number of points; and
  a number of said plurality of comparators is employed as said prescribed number in said step of determining nondefectiveness/defectiveness of said subranging A-D converter.

6. The method of testing a subranging A-D converter in accordance with claim 1, wherein
  said analog signal is changed at least over a range where said subranging A-D converter can perform said A-D conversion in said step of supplying said analog signal,
  minimum values are employed as said extreme values in said step of obtaining the number of points; and
  a number being smaller than the number of said plurality of comparators by 1 is employed as said prescribed number in said step of determining nondefectiveness/defectiveness of said subranging A-D converter.

7. The method of testing a subranging A-D converter in accordance with claim 1, further comprising steps of:
  (e) obtaining maximum values excluding that corresponding to minimum said analog signal among said extreme values and minimum values being adjacently paired with said maximum values,
  (f) obtaining a first current difference being a difference between said maximum and minimum values every said pair and obtaining maximum said first current difference by comparing said first current differences with each other between said pairs,
  (g) dividing said maximum first current difference by a value being smaller than said lower bit-power of 2 by 1 for obtaining a second current difference, and
  (h) determining nondefectiveness/defectiveness of said subranging A-D converter on a basis of whether or not absolute values of differences between all said maximum values and all said minimum values are within a range of said second current difference.

8. A method of testing a subranging A-D converter, said subranging A-D converter
  having a plurality of upper reference voltages, a plurality of reference voltage groups each consisting of a plurality of lower reference voltages, and a first comparator array including a plurality of comparators,
  deciding an upper bit consisting of W bits (W being positive integer) on a basis of comparison between said plurality of upper reference voltages and an analog input in said plurality of comparators,
  selecting one of said plurality of lower reference voltage groups on a basis of said upper bit while deciding a lower bit consisting of W bits by comparing said plurality of lower reference voltages belonging to said one of said plurality of lower reference voltage groups with said analog input; and
  A-D converting said analog input to a 2W-bit digital output consisting of said upper and lower bits, said method comprising steps of:
    (a) obtaining linear ideal A-D conversion characteristics being obtained in case of assuming that said A-D converter includes no quantization error and first resolution being a voltage of said analog input corresponding to the minimum unit of change of said digital output;
    (b) separating a first initial value corresponding to the minimum value of said voltage of said analog input defining said ideal A-D conversion characteristics and a first final voltage corresponding to the maximum value thereof every second resolution being $(2^W+1)$ times said first resolution for supplying $2^W$ analog signals including said first initial voltage and said final voltage as said analog input;
    (c) measuring said analog input and $2^W$ source currents flowing at least to said first comparator array at a time of comparing said analog input with said plurality of lower reference voltages; and (d) obtaining a current waveform corresponding to said ideal A-D conversion characteristics from said first initial value and said source current corresponding thereto and said first final voltage and said source current corresponding thereto for determining nondefectiveness/defectiveness of said A-D converter on a basis of whether or not all said source currents are within a prescribed range with respect to said current waveform.

9. The method of testing a subranging A-D converter in accordance with claim 8, wherein
said step of obtaining linear ideal A-D conversion characteristics includes steps of:
(a-1) obtaining a second initial voltage being a value of said analog input corresponding to a boundary as to whether a value of said digital output is minimum value or a value being larger than the same by one unit,
(a-2) obtaining a second final voltage being said value of said analog input corresponding to a boundary as to whether said digital output is in a full scale or results in an overflow,
(a-3) dividing a value obtained by subtracting said second initial voltage from said second final voltage by $(2^W-1)$ for obtaining said first resolution; and
(a-4) obtaining said first initial voltage by subtracting said first resolution from said second initial voltage and obtaining said first final voltage by subtracting said first resolution from said second final voltage.

10. The method of testing a subranging A-D converter in accordance with claim 9, wherein
said step of obtaining said second initial voltage is adapted to successively increase said value of said analog input from that bringing said value of said digital output into said minimum value for forming said second initial voltage by said value of said analog input changing said value of said digital output value for first time.

11. The method of testing a subranging A-D converter in accordance with claim 9, wherein
said step of obtaining said second final voltage is adapted to successively reduce said value of said analog input from that bringing said digital output into an overflow state for forming said second final voltage by said value of said analog input bringing said digital output into a full scale for the first time.

12. The method of testing a subranging A-D converter in accordance with claim 9, wherein
said subranging A-D converter further includes a second comparator array including a plurality of comparators, wherein
said first and second comparator arrays operate in interleave manner,
said step of measuring said analog input and source currents is adapted to measure a relation between said analog output and the sum of currents flowing to said first and second comparator arrays at a time of comparing said analog input with said plurality of lower reference voltages thereby obtaining said source current.

13. A method of testing an A-D converter comprising a comparator array including a plurality of comparators for comparing a plurality of reference voltages with an analog input and outputting a digital output consisting of 2W bits (W being positive integer) on a basis of said comparison in said plurality of comparators thereby conducting A-D conversion of said analog input to said digital output, said method comprising steps of:

(a) a measuring a relation between said analog input and a source current actually flowing to said comparator array at a time of comparing said analog input with said reference voltages, for obtaining an actual current waveform;

(b) obtaining an initial voltage being a value of said analog input corresponding to a boundary as to whether a value of said digital output is minimum value or a value being larger than the same by 1;

(c) obtaining a final voltage being said value of said analog input corresponding to a boundary as to whether said digital output is in a full scale or results in an overflow;

(d) dividing a value obtained by subtracting said initial voltage from said final voltage by $(2^{2W}-1)$ for obtaining resolution;

(e) obtaining first value as a current increment by dividing a changeable value of said source current by a changeable value of said analog input in a basic region and multiplying said first value by said resolution when said A-D converter ideally performs said A-D conversion, said basic region being in a range of said initial voltage to said final voltage, and said source current being monotonously increased following increase of said value of said analog input in said basic region;

(f) obtaining an ideal current waveform indicating said source current being increased by said increment every time said value of said analog input is increased by said resolution when said A-D converter ideally performs said A-D conversion in said basic region; and (g) comparing said actual current waveform with said ideal current waveform for determining nondefectiveness/defectiveness of said A-D converter on basis of whether or not the difference therebetween is within a prescribed range.

14. The method of testing an A-D converter in accordance with claim 13, wherein
said plurality of reference voltages have a plurality of upper reference voltages and a plurality of lower reference voltage groups each consisting of a plurality of lower reference voltages,
an upper bit consisting of W bits is decided on a basis of comparison between said plurality of upper reference voltages and said analog input in said plurality of comparators,
one of said plurality of lower reference voltage groups is selected on a basis of said upper bit, and said plurality of lower reference voltages belonging to said one of said plurality of lower reference voltage groups are compared with said analog input for deciding a lower bit consisting of W bits,
said A-D converter is a subranging A-D converter for A-D converting said analog input to a 2W-bit digital output consisting of said upper and lower bits, and
said source current is a current flowing to said comparator array at a time of comparing said analog input with said plurality of lower reference voltages.

15. The method of testing an A-D converter in accordance with claim 14, wherein
said subranging A-D converter further includes a second comparator array including a plurality of comparators, and said source current is a sum of currents flowing to said comparator array and said second comparator array at a time of comparing said analog input with said plurality of lower reference voltages.

16. The method of testing an A-D converter in accordance with claim 13, wherein said step of comparing said actual current waveform includes steps of:

(g-1) obtaining the difference between a portion where said actual current waveform rises and a portion, corresponding thereto, where said ideal current waveform rises, (g-2) dividing a result obtained in said step (g-1) by said resolution for obtaining integral nonlinearity, and (g-3) determining nondefectiveness/defectiveness of said A-D converter on basis of whether or not said integral nonlinearity is within said prescribed range.

17. The method of testing an A-D converter in accordance with claim 13, wherein said step of comparing said actual current waveform includes steps of:

(g-1) obtaining an interval between two adjacently rising portions in said actual source waveform, (g-2) subtracting 1 from a value obtaining by dividing a result obtained in said step (g1) by said resolution for obtaining differential nonlinearity, and (g-3) determining nondefectiveness/defectiveness of said A-D converter on a basis of whether or not said differential nonlinearity is within said prescribed range.

18. The method of testing an A-D converter in accordance with claim 13, wherein said A-D converter is of a flash type, and said basic region extends over said initial voltage and said final voltage.

19. An apparatus for testing an A-D converter comprising:

(a) a subranging A-D converter having a comparator array consisting of a plurality of comparators for comparing an analog input with a plurality of upper reference voltages and further with a plurality of lower reference voltages for A-D converting said analog input to a digital output with predetermined resolution;

(b) an analog signal source for supplying an analog signal being stepwise changed by an amount of change being smaller than said resolution;

(c) a power source for supplying said comparator array with a voltage;

(d) a current measure for measuring a current flowing from said power source at a time of comparing said analog input with said plurality of lower reference voltages; and (e) analyzing means for analyzing a relation between said analog signal and said current.

20. An apparatus for testing an A-D converter comprising:

(a) an A-D converter having a comparator array consisting of a plurality of comparators for comparing an analog input with a plurality of reference voltages for A-D converting said analog input to a digital output;

(b) a power source for supplying said comparator array with a voltage;

(c) a current measurer for measuring a current flowing from said power source at a time of comparing said analog input with said plurality of lower reference voltages;

(d) detection means detecting whether or not said A-D converter is in an overflow state and whether or not said digital output is at minimum value; and (e) operating means for obtaining an ideal waveform of said source current on a basis of the result in said detection means to compare said ideal waveform with a waveform of said source current obtained by said current measurer.

* * * * *

UNITED STATES PATENT AND TRADEMARK OFFICE
CERTIFICATE OF CORRECTION

PATENT NO. : 5,870,042

DATED : February 9, 1999

INVENTOR(S) : Hiroshi Noda

It is certified that error appears in the above-identified patent and that said Letters Patent is hereby corrected as shown below:

Column 30, line 4, delete "a"(first occurrence).

Signed and Sealed this

Twenty-third Day of November, 1999

Attest:

Q. TODD DICKINSON

*Attesting Officer*     *Acting Commissioner of Patents and Trademarks*